US012684936B2

(12) United States Patent
Lee et al.

(10) Patent No.: US 12,684,936 B2
(45) Date of Patent: Jul. 14, 2026

(54) LIGHT-EMITTING DEVICE AND ELECTRONIC APPARATUS INCLUDING THE SAME

(71) Applicant: Samsung Display Co., Ltd., Yongin-si (KR)

(72) Inventors: Jongwon Lee, Yongin-si (KR); Seungcheol Kim, Yongin-si (KR); Changmin Lee, Yongin-si (KR); Hyunshik Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 769 days.

(21) Appl. No.: 18/102,169

(22) Filed: Jan. 27, 2023

(65) Prior Publication Data

US 2023/0320120 A1 Oct. 5, 2023

(30) Foreign Application Priority Data

Mar. 31, 2022 (KR) ........................ 10-2022-0040459

(51) Int. Cl.

| | |
|---|---|
| ***H10K 50/13*** | (2023.01) |
| ***H10K 50/15*** | (2023.01) |
| ***H10K 50/19*** | (2023.01) |
| ***H10K 59/12*** | (2023.01) |
| ***H10K 101/00*** | (2023.01) |
| ***H10K 102/00*** | (2023.01) |

(52) U.S. Cl.
CPC ........... *H10K 50/131* (2023.02); *H10K 50/19* (2023.02); *H10K 50/15* (2023.02); *H10K 59/12* (2023.02); *H10K 2101/90* (2023.02); *H10K 2102/351* (2023.02)

(58) Field of Classification Search
CPC ............................ H10K 50/131; H10K 50/19
See application file for complete search history.

(56) References Cited

U.S. PATENT DOCUMENTS

| | | | |
|---|---|---|---|
| 6,903,378 | B2 | 6/2005 | Cok |
| 9,276,221 | B2 | 3/2016 | Nowatari et al. |

(Continued)

FOREIGN PATENT DOCUMENTS

| | | |
|---|---|---|
| CN | 1809936 | 7/2006 |
| JP | 2018-107032 | 7/2018 |

(Continued)

*Primary Examiner* — Sean M DeGuire
(74) *Attorney, Agent, or Firm* — CANTOR COLBURN LLP

(57) ABSTRACT

Embodiments provide a light-emitting device and an electronic apparatus including the same. The light-emitting device includes a first electrode, a second electrode facing the first electrode, m light-emitting units stacked between the first electrode and the second electrode, and m−1 charge generation layers between adjacent ones of the light-emitting. Each light-emitting unit includes an emission layer; the m light-emitting units include a first light-emitting unit, a second light-emitting unit, a third light-emitting unit, a fourth light-emitting unit, and a fifth light-emitting unit; the m−1 charge generation layers include a first charge generation layer, a second charge generation layer, a third charge generation layer, and a fourth charge generation layer; the first light-emitting unit and the second light-emitting unit each emit green light; and the third light-emitting unit, the fourth light-emitting unit, and the fifth light-emitting unit each emit blue light.

19 Claims, 6 Drawing Sheets

(56) References Cited

U.S. PATENT DOCUMENTS

| | | | |
|---|---|---|---|
| 10,418,593 | B2 | 9/2019 | Kim et al. |
| 11,024,822 | B2 | 6/2021 | Tanaka |
| 2021/0273192 | A1 | 9/2021 | Kim et al. |
| 2021/0359214 | A1 | 11/2021 | Kang et al. |
| 2022/0059793 | A1 | 2/2022 | Kang et al. |

FOREIGN PATENT DOCUMENTS

| | | | |
|---|---|---|---|
| KR | 10-2019-0003151 | | 1/2019 |
| KR | 10-2050219 | | 11/2019 |
| KR | 10-2021-0103631 | | 8/2021 |
| KR | 1020210141793 | A | 11/2021 |
| KR | 1020220023865 | A | 3/2022 |

LIGHT-EMITTING DEVICE AND ELECTRONIC APPARATUS INCLUDING THE SAME

CROSS-REFERENCE TO RELATED APPLICATION(S)

This application claims priority to and benefits of Korean Patent Application No. 10-2022-0040459 under 35 U.S.C. § 119, filed on Mar. 31, 2022, in the Korean Intellectual Property Office, the entire contents of which are incorporated herein by reference.

BACKGROUND

1. Technical Field

Embodiments relate to a light-emitting device and an electronic apparatus including the same.

2. Description of the Related Art

From among light-emitting devices, self-emissive devices have wide viewing angles, high contrast ratios, short response times, and excellent characteristics in terms of luminance, driving voltage, and response speed.

In a light-emitting device, a first electrode is arranged on a substrate, and a hole transport region, an emission layer, an electron transport region, and a second electrode are sequentially arranged on the first electrode. Holes provided from the first electrode move toward the emission layer through the hole transport region, and electrons provided from the second electrode move toward the emission layer through the electron transport region. Carriers, such as holes and electrons, recombine in the emission layer to produce excitons. These excitons transition from an excited state to a ground state, thereby generating light.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments include a light-emitting device having a low driving voltage, high efficiency, and a long lifespan.

Additional aspects will be set forth in part in the description which follows and, in part, will be apparent from the description, or may be learned by practice of the presented embodiments of the disclosure.

According to embodiments, a light-emitting device may include a first electrode, a second electrode facing the first electrode, m light-emitting units stacked between the first electrode and the second electrode, and m−1 charge generation layers between adjacent ones of the m light-emitting units, wherein m may be an integer of 5 or more, each light-emitting unit may include an emission layer, the m light-emitting units may include a first light-emitting unit, a second light-emitting unit, a third light-emitting unit, a fourth light-emitting unit, and a fifth light-emitting unit, the m−1 charge generation layers may include a first charge generation layer, a second charge generation layer, a third charge generation layer, and a fourth charge generation layer, the first light-emitting unit and the second light-emitting unit may each emit green light, and the third light-emitting unit, the fourth light-emitting unit, and the fifth light-emitting unit may each emit blue light.

According to an embodiment, m may be 5.

According to an embodiment, the first light-emitting unit and the second light-emitting unit may not be adjacent to each other.

According to an embodiment, the emission layers of the first light-emitting unit and the second light-emitting unit may each emit light having a maximum emission wavelength in a range of about 500 nm to about 600 nm.

According to an embodiment, the emission layers of the third light-emitting unit, the fourth light-emitting unit, and the fifth light-emitting unit may each emit light having a maximum emission wavelength in a range of about 400 nm to about 500 nm.

According to an embodiment, the first light-emitting unit may be a light-emitting unit that is most toward the first electrode; or the second light-emitting unit may be a light-emitting unit that is most toward the second electrode.

According to an embodiment, the first light-emitting unit or the second light-emitting unit may be between the third light-emitting unit and the fifth light-emitting unit.

According to an embodiment, the first charge generation layer may be between the third light-emitting unit and the fourth light-emitting unit, the second charge generation layer may be between the fourth light-emitting unit and the first light-emitting unit, the third charge generation layer may be between the first light-emitting unit and the fifth light-emitting unit, and the fourth charge generation layer may be between the fifth light-emitting unit and the second light-emitting unit.

According to an embodiment, the first charge generation layer may be between the first light-emitting unit and the third light-emitting unit, the second charge generation layer may be between the third light-emitting unit and the fourth light-emitting unit, the third charge generation layer may be between the fourth light-emitting unit and the second light-emitting unit, and the fourth charge generation layer may be between the second light-emitting unit and the fifth light-emitting unit.

According to an embodiment, the first charge generation layer may be between the first light-emitting unit and the third light-emitting unit, the second charge generation layer may be between the third light-emitting unit and the second light-emitting unit, the third charge generation layer may be between the second light-emitting unit and the fourth light-emitting unit, and the fourth charge generation layer may be between the fourth light-emitting unit and the fifth light-emitting unit.

According to an embodiment, the light-emitting device may satisfy Formula 1, which is explained below.

According to an embodiment, the light-emitting device may satisfy Formula 2-1, which is explained below.

According to an embodiment, the light-emitting device may satisfy Formula 2-2, which is explained below.

According to an embodiment, at least one of the m−1 charge generation layers may include an n-type charge generation layer and a p-type charge generation layer.

According to an embodiment, at least one emission layer may include a first host and a second host, and the first host and the second host may be different from each other.

According to an embodiment, at least one emission layer may include a first emission layer and a second emission layer.

According to an embodiment, the light emitting device may further include a capping layer arranged outside the second electrode.

According to embodiments, an electronic apparatus may include the light-emitting device.

According to an embodiment, the electronic apparatus may further include a thin-film transistor, wherein the thin-film transistor may include a source electrode and a drain electrode, and the first electrode of the light-emitting device may be electrically connected to at least one of the source electrode and the drain electrode.

According to an embodiment, the electronic apparatus may further include a color filter, a color conversion layer, a quantum dot conversion layer, a touch screen layer, a polarizing layer, or any combination thereof.

It is to be understood that the embodiments above are described in a generic and explanatory sense only and not for the purpose of limitation, and the disclosure is not limited to the embodiments described above.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
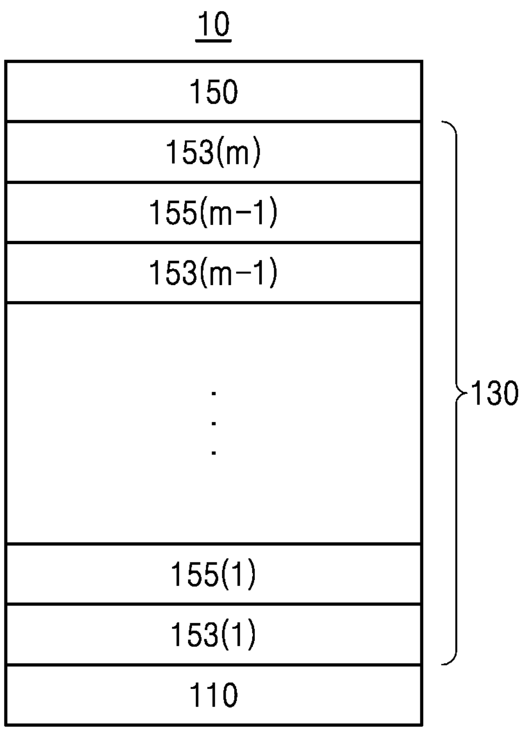
FIGS. 1 to 4 are each a schematic cross-sectional view of a light-emitting device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the description, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the description, when an element is "directly on," "directly connected to," or "directly coupled to" another element, there are no intervening elements present. For example, "directly on" may mean that two layers or two elements are disposed without an additional element such as an adhesion element therebetween.

It will be understood that the terms "connected to" or "coupled to" may include a physical or electrical connection or coupling.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

In the specification and the claims, the term "at least one of" is intended to include the meaning of "at least one selected from the group of" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, ±10%, or ±5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

The term “interlayer” as used herein may be a single layer and/or all of the layers arranged between a first electrode and a second electrode in a light-emitting device.

The term “maximum emission wavelength” of a light-emitting unit as used herein may be a wavelength at the point where a maximum intensity peak appears in a low-temperature photoluminescence (PL) spectrum of the light-emitting unit.

As used herein, the term “$D_1$” may be a distance between an interface between the first electrode and a light-emitting unit that is most toward the first electrode, and an interface between the second electrode and a light-emitting unit that is most toward the second electrode. For example, $D_1$ corresponds to a thickness of an interlayer 130 in FIG. 1.

A light-emitting device of the disclosure may include: a first electrode;

a second electrode facing the first electrode;

m light-emitting units stacked between the first electrode and the second electrode; and m−1 charge generation layers between adjacent ones of the m light-emitting units, wherein m may be an integer of 5 or more, each light-emitting unit may include an emission layer, the m light-emitting units may include a first light-emitting unit, a second light-emitting unit, a third light-emitting unit, a fourth light-emitting unit, and a fifth light-emitting unit, the m−1 charge generation layers may include a first charge generation layer, a second charge generation layer, a third charge generation layer, and a fourth charge generation layer, the first light-emitting unit and the second light-emitting unit may each emit green light, and the third light-emitting unit, the fourth light-emitting unit, and the fifth light-emitting unit may each emit blue light.

The light-emitting device according to an embodiment of the disclosure may have a structure including first to fifth light-emitting units including two light-emitting units that emit green light and three light-emitting units that emit blue light. Due to the inclusion of the five light-emitting units, the light-emitting device may emit blue light while further including phosphorescent green light that has high luminance and high efficiency characteristics compared to fluorescent blue light, thereby realizing a high-efficiency light-emitting device.

In an embodiment, m may be 5.

For example, the light-emitting device of the disclosure may include: five light-emitting units stacked between the first electrode and the second electrode and each including an emission layer; and four charge generation layers between two adjacent light-emitting units from among the five light-emitting units.

In an embodiment, the first light-emitting unit and the second light-emitting unit may not be adjacent to each other.

For example, the first light-emitting unit and the second light-emitting unit that emit green light may not be adjacent to each other. The wording “not adjacent to” means that the light-emitting units may be arranged not to be neighboring each other, and indicates the presence of another light-emitting unit between the first light-emitting unit and the second light-emitting unit.

In an embodiment, the emission layers of the first light-emitting unit and the second light-emitting unit may each emit light having a maximum emission wavelength in a range of about 500 nm to about 600 nm.

In an embodiment, the emission layers of the third light-emitting unit, the fourth light-emitting unit, and the fifth light-emitting unit may each emit light having a maximum emission wavelength in a range of about 400 nm to about 500 nm.

In an embodiment, the first light-emitting unit may be a light-emitting unit that is most toward the first electrode.

For example, the first light-emitting unit may be a light-emitting unit that is closest to the first electrode. For example, another light-emitting unit may not be present between the first light-emitting unit and the first electrode.

In an embodiment, the second light-emitting unit may be a light-emitting unit that is most toward the second electrode.

For example, the second light-emitting unit may be a light-emitting unit that is closest to the second electrode. For example, another light-emitting unit may not be present between the second light-emitting unit and the second electrode.

In an embodiment, the first light-emitting unit may be a light-emitting unit that is most toward the first electrode; or the second light-emitting unit may be a light-emitting unit that is most toward the second electrode.

In an embodiment, the first light-emitting unit may be in contact with the first electrode; or the second light-emitting unit may be in contact with the second electrode.

In an embodiment, the first light-emitting unit may be between the third light-emitting unit and the fifth light-emitting unit; or the second light-emitting unit may be between the third light-emitting unit and the fifth light-emitting unit.

In case that the first light-emitting unit is between the third light-emitting unit and the fifth light-emitting unit, only the first light-emitting unit may be present between the third light-emitting unit and the fifth light-emitting unit; or a light-emitting unit other than the first light-emitting unit may also be present.

In an embodiment, the first charge generation layer may be between the third light-emitting unit and the fourth light-emitting unit, the second charge generation layer may be between the fourth light-emitting unit and the first light-emitting unit, the third charge generation layer may be between the first light-emitting unit and the fifth light-emitting unit, and the fourth charge generation layer may be between the fifth light-emitting unit and the second light-emitting unit.

For example, the light-emitting units and the charge generation layers may be in the order of “the third light-emitting unit—the first charge generation layer13 the fourth light-emitting unit13 the second charge generation layer13 the first light-emitting unit13 the third charge generation layer13 the fifth light-emitting unit13 the fourth charge generation layer13 the second light-emitting unit” from the first electrode.

In embodiments, the first charge generation layer may be between the first light-emitting unit and the third light-emitting unit, the second charge generation layer may be between the third light-emitting unit and the fourth light-emitting unit, the third charge generation layer may be between the fourth light-emitting unit and the second light-emitting unit, and the fourth charge generation layer may be between the second light-emitting unit and the fifth light-emitting unit.

For example, the light-emitting units and the charge generation layers may be in the order of "the first light-emitting unit13 the first charge generation layer13 the third light-emitting unit13 the second charge generation layer13 the fourth light-emitting unit13 the third charge generation layer13 the second light-emitting unit13 the fourth charge generation layer13 the fifth light-emitting unit" from the first electrode.

In embodiments, the first charge generation layer may be between the first light-emitting unit and the third light-emitting unit, the second charge generation layer may be between the third light-emitting unit and the second light-emitting unit, the third charge generation layer may be between the second light-emitting unit and the fourth light-emitting unit, and the fourth charge generation layer may be between the fourth light-emitting unit and the fifth light-emitting unit.

For example, the light-emitting units and the charge generation layers may be in the order of "the first light-emitting unit13 the first charge generation layer13 the third light-emitting unit13 the second charge generation layer13 the second light-emitting unit13 the third charge generation layer13 the fourth light-emitting unit13 the fourth charge generation layer13 the fifth light-emitting unit" from the first electrode.

In an embodiment, the light-emitting device of the disclosure may satisfy Formula 1:

$$3800\ \text{Å} \leq D_1 \leq 4500\ \text{Å} \qquad \text{[Formula 1]}$$

In Formula 1, $D_1$ represents a distance between an interface between the first electrode and a light-emitting unit that is most toward the first electrode and an interface between the second electrode and a light-emitting unit that is most toward the second electrode.

In case that the light-emitting device of the disclosure satisfies Formula 1, the light-emitting device may have improved efficiency or lifespan.

In an embodiment, the light-emitting device of the disclosure may satisfy Formula 2-1:

$$3 \leq D_1/(2^*\lambda_1) \leq 4 \qquad \text{[Formula 2-1]}$$

In Formula 2-1, $D_1$ is the same as described in Formula 1, and $\lambda_1$ represents a maximum emission wavelength of the first light-emitting unit.

In case that the light-emitting device of the disclosure satisfies Formula 2-1, the light-emitting device may include two green light-emitting units, thereby having improved efficiency or lifespan.

In an embodiment, the light-emitting device of the disclosure may satisfy Formula 2-2:

$$4 \leq D_1/(2^*\lambda_3) \qquad \text{[Formula 2-2]}$$

In Formula 2-2, $D_1$ is the same as described in Formula 1, and $\lambda_3$ represents a maximum emission wavelength of the third light-emitting unit.

In case that the light-emitting device of the disclosure satisfies Formula 2-2, the light-emitting device may include three blue light-emitting units, thereby having improved efficiency or lifespan.

In an embodiment, the first electrode may be an anode, the second electrode may be a cathode, the m light-emitting units may include an interlayer including an emission layer, the interlayer may further include a hole transport region arranged between the emission layer and the first electrode, the interlayer may further include an electron transport region arranged between the emission layer and the second electrode, the hole transport region may include a hole transport layer, an emission auxiliary layer, an electron blocking layer, or any combination thereof, and the electron transport region may include a buffer layer, a hole blocking layer, an electron control layer, an electron transport layer, an electron injection layer, or any combination thereof.

In an embodiment, at least one of the m−1 charge generation layers may include an n-type charge generation layer and a p-type charge generation layer.

In an embodiment, at least one emission layer may include a first host and a second host, and the first host and the second host may be different from each other.

In an embodiment, at least one emission layer may include a first emission layer and a second emission layer.

In an embodiment, the light-emitting device may further include a capping layer arranged outside the second electrode.

In an embodiment, at least one of the first light-emitting unit and the second light-emitting unit may include an organometallic compound.

In an embodiment, at least one of the third light-emitting unit, the fourth light-emitting unit, and the fifth light-emitting unit may include a boron compound.

Another aspect of the disclosure provides an electronic apparatus including the light-emitting device as described above. The electronic apparatus may further include a thin-film transistor. For example, the electronic apparatus may further include a thin-film transistor including a source electrode and a drain electrode, and the first electrode of the light-emitting device may be electrically connected to the source electrode or the drain electrode. In embodiments, the electronic apparatus may further include a color filter, a color conversion layer, a quantum dot color conversion layer, a touch screen layer, a polarizing layer, or any combination thereof.

More details for the electronic apparatus may be the same as described herein.

[Description of FIGS. 1 to 4]

FIG. 1 shows a schematic cross-sectional view of an embodiment of a light-emitting device 10 of the disclosure.

The light-emitting device 10 of FIG. 1 has a structure in which a first electrode 110, an interlayer 130, and a second electrode 150 may be stacked in this stated order.

The interlayer 130 includes: m light-emitting units 153(1) to **153(*m*); and m−1 charge generation layers 155(1) to 155(*m*−1)** arranged between two adjacent light-emitting units from among the m light-emitting units.

Figure 2:
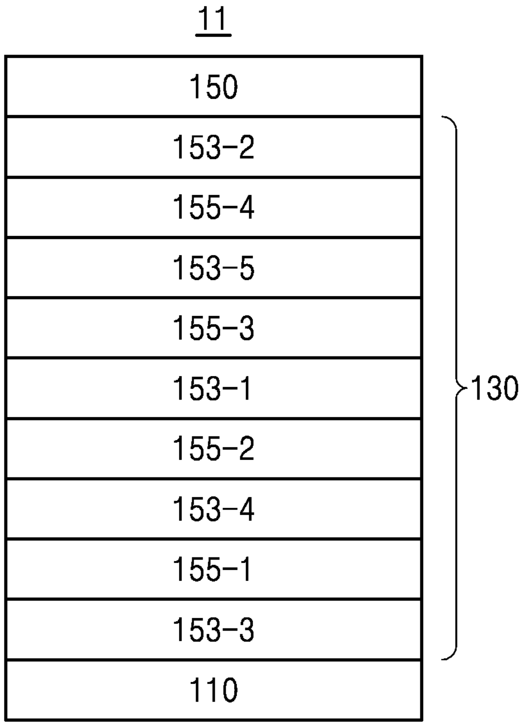
Figure 3:
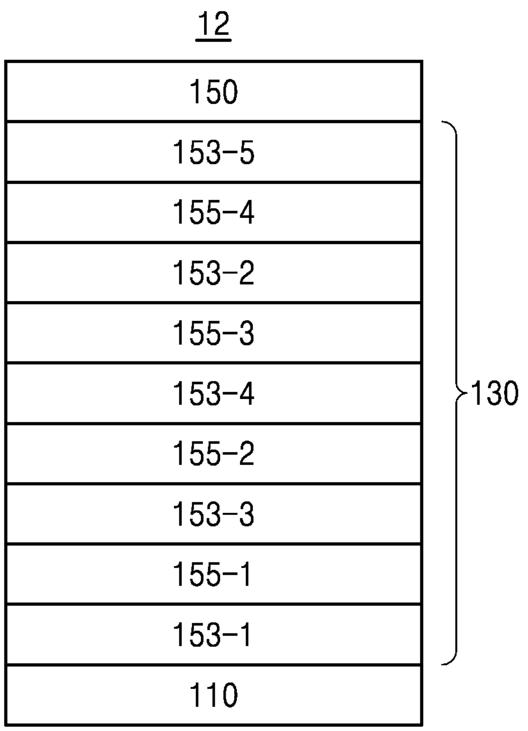
Figure 4:
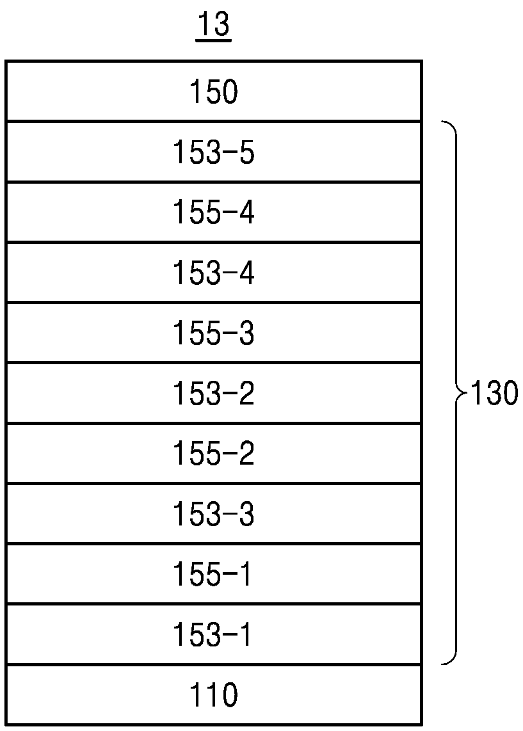

FIGS. 2 to 4 show embodiments of the light-emitting device 10 of FIG. 1, and in particular, show cross-sectional views of light-emitting devices 11 to 13 wherein m is 5.

The light-emitting device 11 of FIG. 2 has a structure in which the first electrode 110, a third light-emitting unit

153-3, a first charge generation layer 155-1, a fourth light-emitting unit 153-4, a second charge generation layer 155-2, a first light-emitting unit 153-1, a third charge generation layer 155-3, a fifth light-emitting unit 153-5, a fourth charge generation layer 155-4, a second light-emitting unit 153-2, and the second electrode 150 may be stacked in this stated order.

The light-emitting device 12 of FIG. 3 has a structure in which the first electrode 110, the first light-emitting unit 153-1, the first charge generation layer 155-1, the third light-emitting unit 153-3, the second charge generation layer 155-2, the fourth light-emitting unit 153-4, the third charge generation layer 155-3, the second light-emitting unit 153-2, the fourth charge generation layer 155-4, the fifth light-emitting unit 153-5, and the second electrode 150 may be stacked in this stated order.

The light-emitting device 13 of FIG. 4 has a structure in which the first electrode 110, the first light-emitting unit 153-1, the first charge generation layer 155-1, the third light-emitting unit 153-3, the second charge generation layer 155-2, the second light-emitting unit 153-2, the third charge generation layer 155-3, the fourth light-emitting unit 153-4, the fourth charge generation layer 155-4, the fifth light-emitting unit 153-5, and the second electrode 150 may be stacked in this stated order.

Hereinafter, the structure of each of the light-emitting devices 10 to 13 according to embodiments and a method of manufacturing the same will be described in connection with FIGS. 1 to 4.

[First Electrode 110]

In FIG. 1, a substrate may be additionally disposed under the first electrode 110 or on the second electrode 150. As the substrate, a glass substrate or a plastic substrate may be used. In embodiments, the substrate may be a flexible substrate, and may include plastics with excellent heat resistance and durability, such as polyimide, polyethylene terephthalate (PET), polycarbonate, polyethylene naphthalate, polyarylate (PAR), polyetherimide, or any combination thereof.

The first electrode 110 may be formed by, for example, depositing or sputtering a material for forming the first electrode 110 on the substrate. In case that the first electrode 110 is an anode, the material for forming the first electrode 110 may be a high-work function material that facilitates injection of holes.

The first electrode 110 may be a reflective electrode, a semi-transmissive electrode, or a transmissive electrode. In case that the first electrode 110 is a transmissive electrode, the material for forming the first electrode 110 may be indium tin oxide (ITO), indium zinc oxide (IZO), tin oxide ($SnO_2$), zinc oxide (ZnO), or any combination thereof. In embodiments, in case that the first electrode 110 is a semi-transmissive electrode or a reflective electrode, the material for forming the first electrode 110 may be magnesium (Mg), silver (Ag), aluminum (Al), aluminum-lithium (Al—Li), calcium (Ca), magnesium-indium (Mg—In), magnesium-silver (Mg—Ag), or any combination thereof.

The first electrode 110 may have a structure consisting of a single layer or a structure including multiple layers. For example, the first electrode 110 may have a three-layered structure of ITO/Ag/ITO.

[Interlayer 130]

The interlayer 130 may be disposed on the first electrode 110. The interlayer 130 may include a light-emitting unit including an emission layer.

The interlayer 130 may further include a hole transport region arranged between the first electrode 110 and the emission layer and an electron transport region arranged between the emission layer and the second electrode 150.

The interlayer 130 may further include, in addition to various organic materials, a metal-containing compound, such as an organometallic compound, an inorganic material, such as a quantum dot, and the like.

In embodiments, the interlayer 130 may include two or more light-emitting units stacked between the first electrode 110 and the second electrode 150, and at least one charge generation layer between the two or more light-emitting units. In case that the interlayer 130 includes the light-emitting units and the charge generation layer as described above, the light-emitting device 10 may be a tandem light-emitting device.

[Hole Transport Region in Interlayer 130]

The hole transport region may have a structure consisting of a single layer consisting of a single material, a structure consisting of a layer consisting of different materials, or a structure including multiple layers including different materials.

The hole transport region may include a hole injection layer, a hole transport layer, an emission auxiliary layer, an electron blocking layer, or any combination thereof.

For example, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein the layers of each structure may be stacked from the first electrode 110 its respective stated order, but the structure of the hole transport region is not limited thereto.

The hole transport region may include a compound represented by Formula 201, a compound represented by Formula 202, or any combination thereof:

[Formula 201]

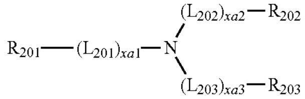

[Formula 202]

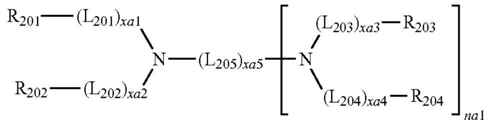

In Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)—*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$ to form a $C_8$-$C_{60}$ polycyclic group (for example, a carbazole group, etc.) unsubstituted or substituted with at least one $R_{10a}$ (for example, see Compound HT16, etc.), $R_{203}$ and $R_{204}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$ to form a $C_8$-$C_{60}$ polycyclic group unsubstituted or substituted with at least one $R_{10a}$, and na1 may be an integer from 1 to 4.

For example, each of Formulae 201 and 202 may include at least one of groups represented by Formulae CY201 to CY217:

CY201

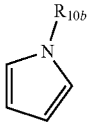

CY202

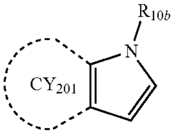

CY203

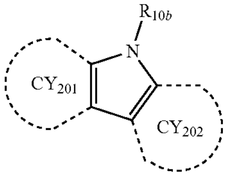

CY204

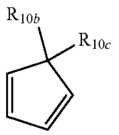

CY205

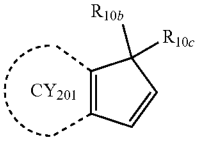

CY206

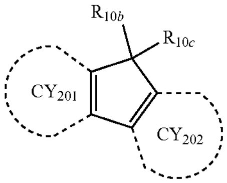

-continued

CY207

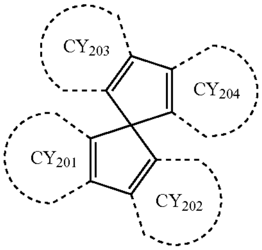

CY208

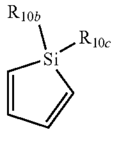

CY209

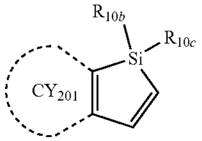

CY210

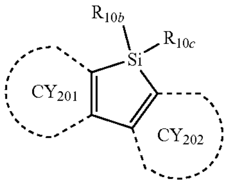

CY211

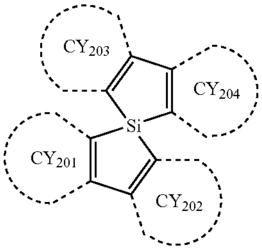

CY212

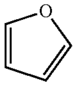

CY213

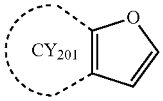

CY214

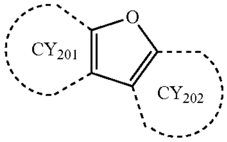

CY215

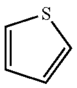

CY216

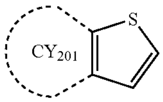

-continued

CY217

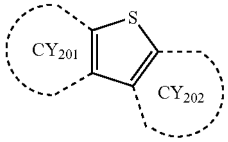

In Formulae CY201 to CY217, $R_{10b}$ and $R_{10c}$ may each independently be the same as described in connection with $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$ as described herein.

In an embodiment, ring $CY_{201}$ to ring $CY_{204}$ in Formulae CY201 to CY217 may each independently be a benzene group, a naphthalene group, a phenanthrene group, or an anthracene group.

In embodiments, each of Formulae 201 and 202 may include at least one of groups represented by Formulae CY201 to CY203.

In embodiments, Formula 201 may include at least one of groups represented by Formulae CY201 to CY203 and at least one of groups represented by Formulae CY204 to CY217.

In embodiments, in Formula 201, xa1 may be 1, $R_{201}$ may be a group represented by one of Formulae CY201 to CY203, xa2 may be 0, and $R_{202}$ may be a group represented by one of Formulae CY204 to CY207.

In embodiments, each of Formulae 201 and 202 may not include a group represented by one of Formulae CY201 to CY203.

In embodiments, each of Formulae 201 and 202 may not include a group represented by one of Formulae CY201 to CY203, and may include at least one of groups represented by Formulae CY204 to CY217.

In embodiments, each of Formulae 201 and 202 may not include a group represented by one of Formulae CY201 to CY217.

For example, the hole transport region may include one of Compounds HT1 to HT46, m-MTDATA, TDATA, 2-TNATA, NPB(NPD), β-NPB, TPD, Spiro-TPD, Spiro-NPB, methylated NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or any combination thereof:

HT1

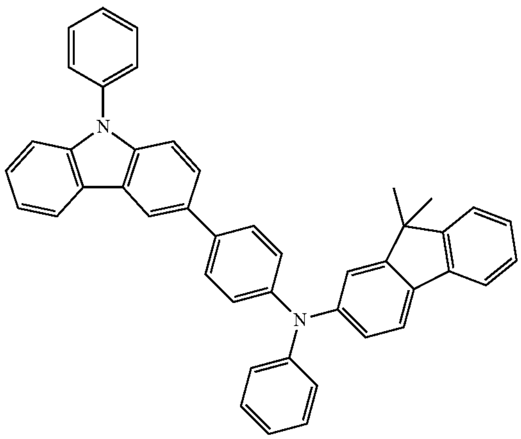

HT2

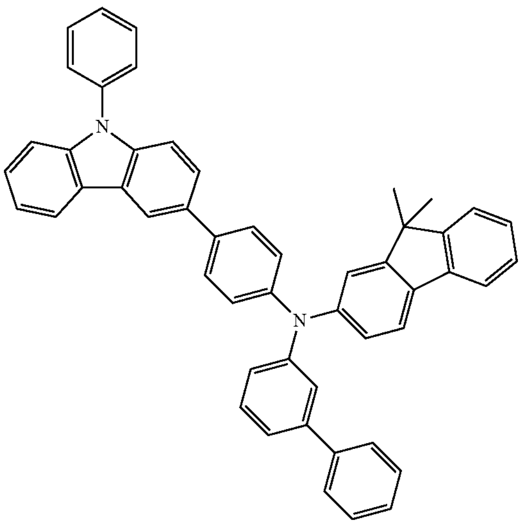

-continued
HT3
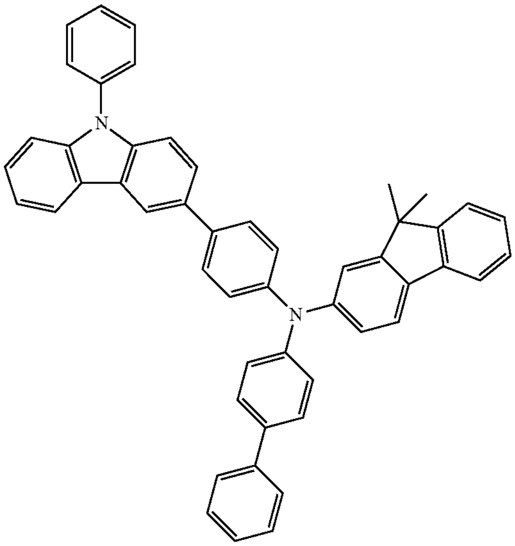
HT4
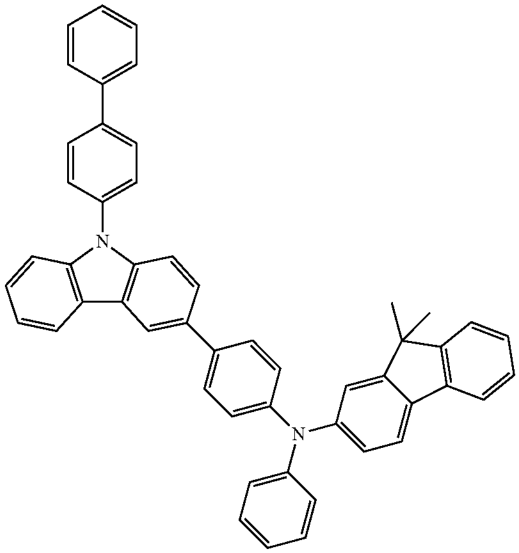
HT5
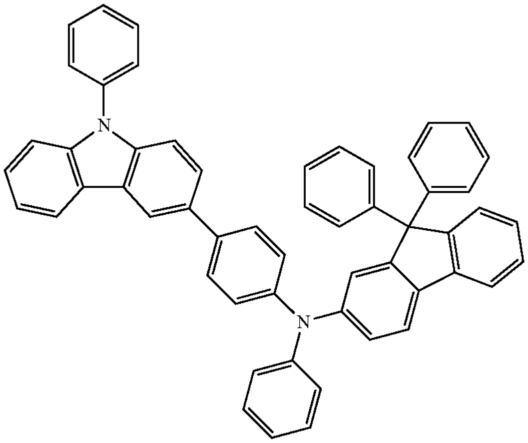
HT6
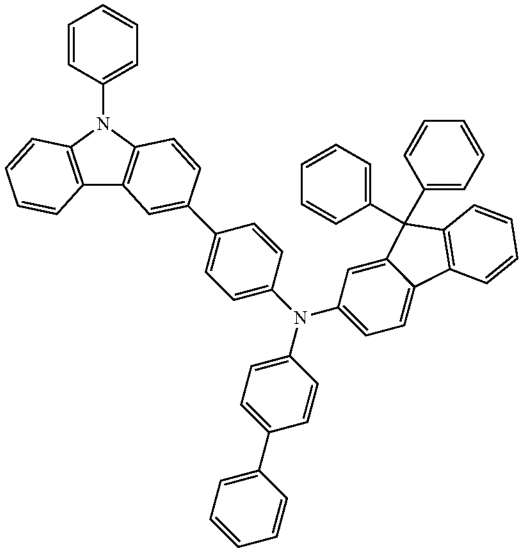

-continued
HT7
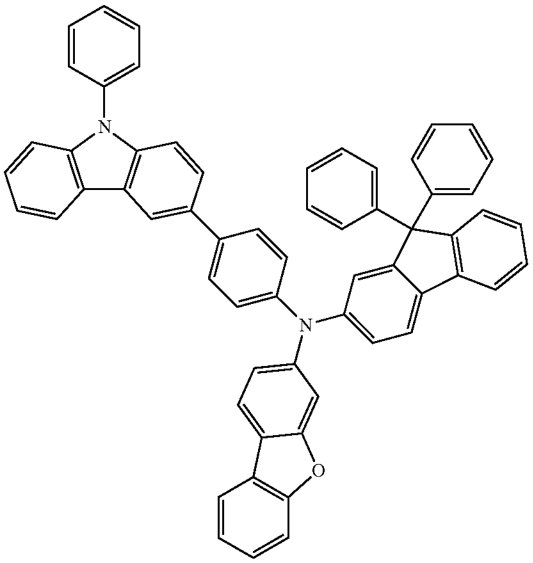
HT8
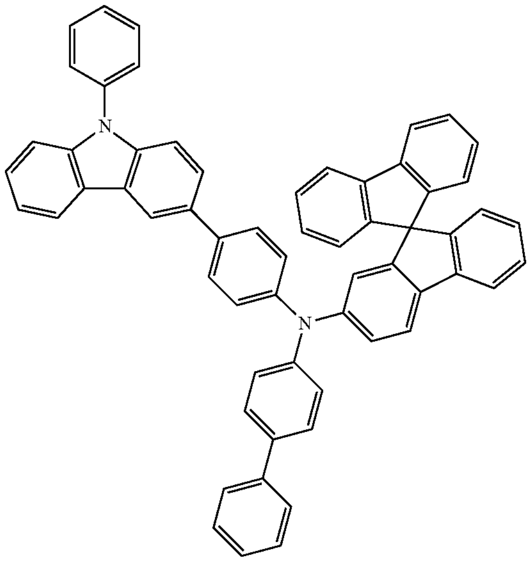
HT9
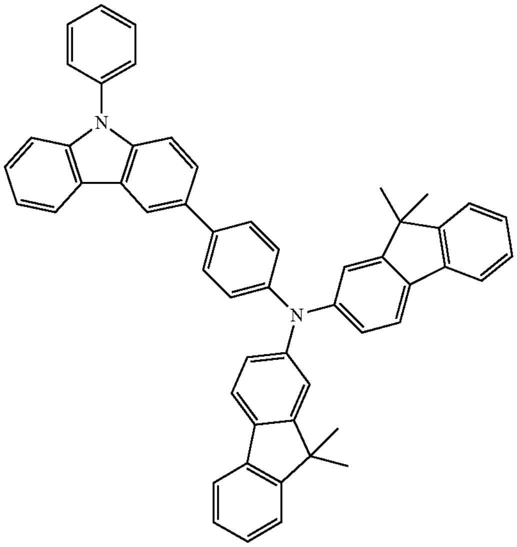
HT10
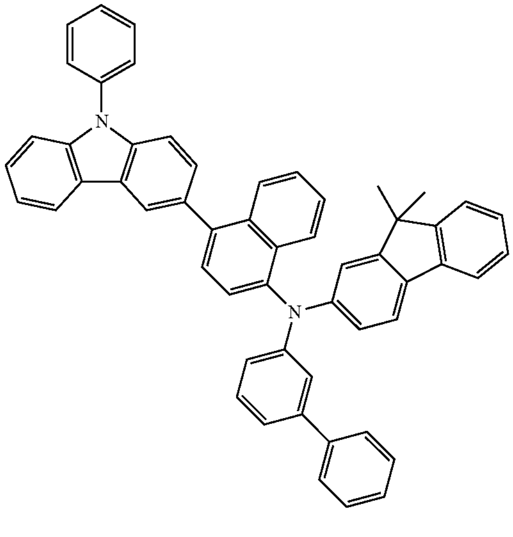
HT11
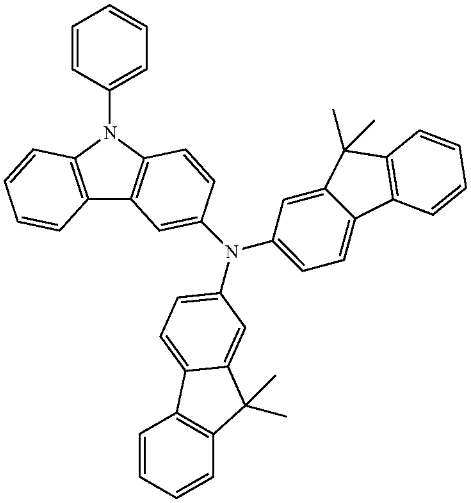
HT12
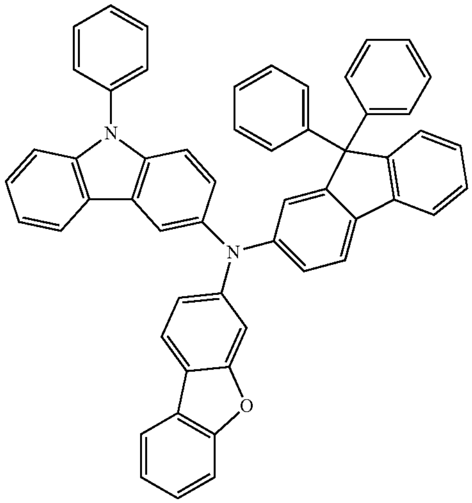

-continued
HT13
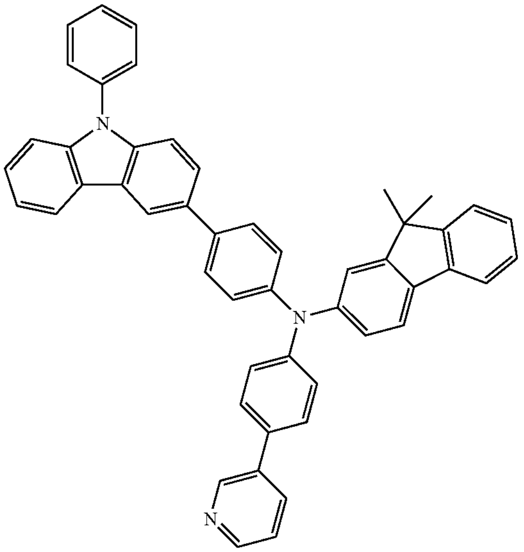
HT14
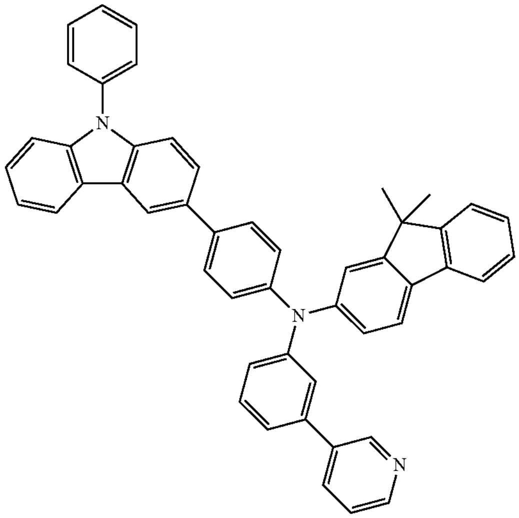
HT15
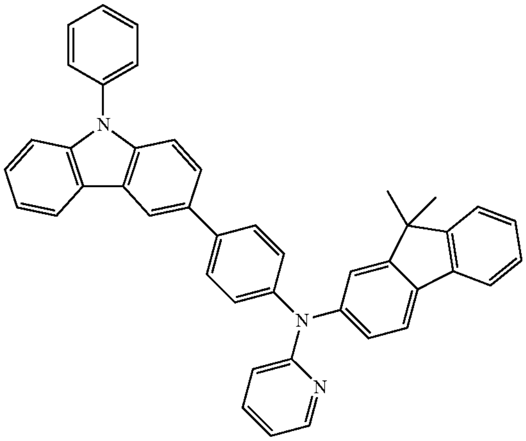
HT16
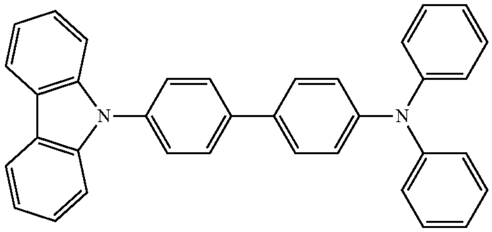
HT17
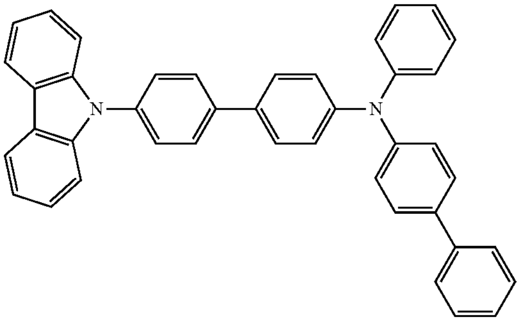
HT18
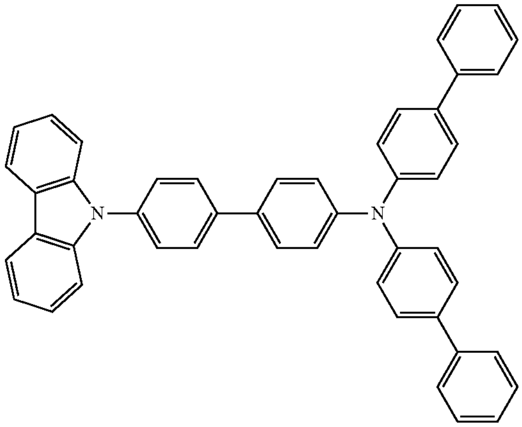

-continued
HT19
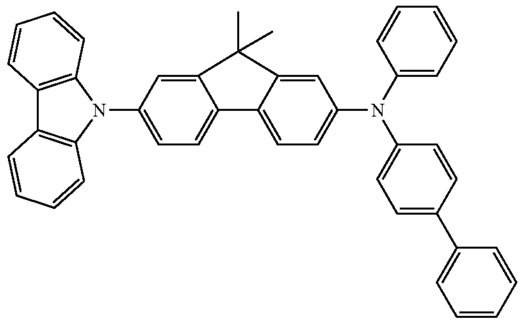
HT20
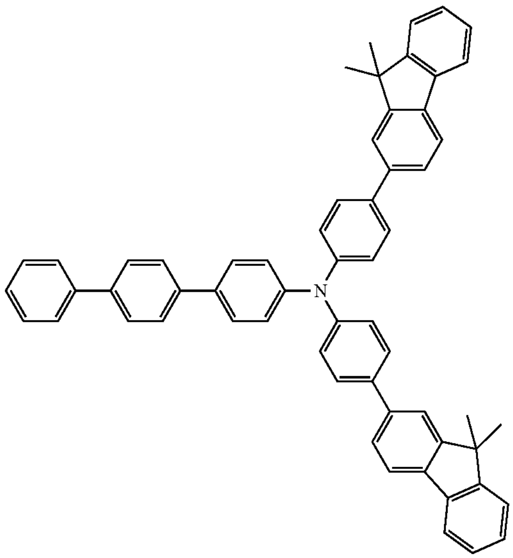
HT21
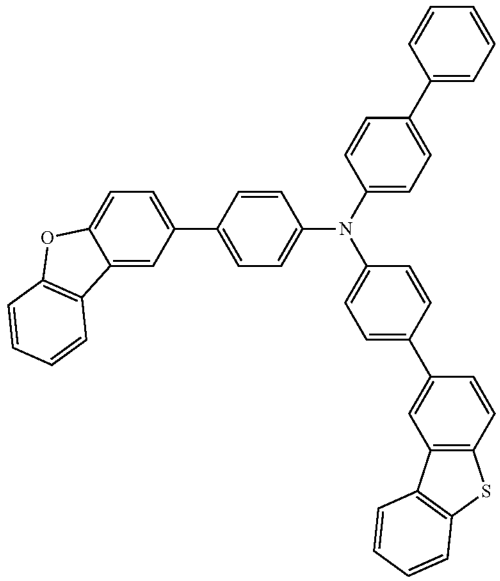
HT22
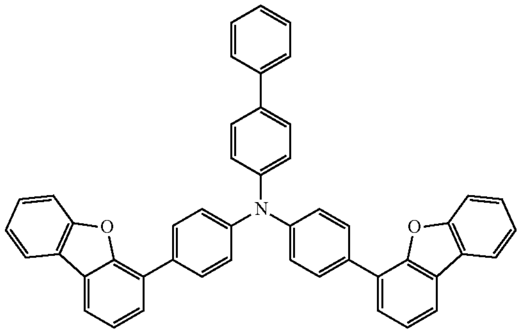
HT23
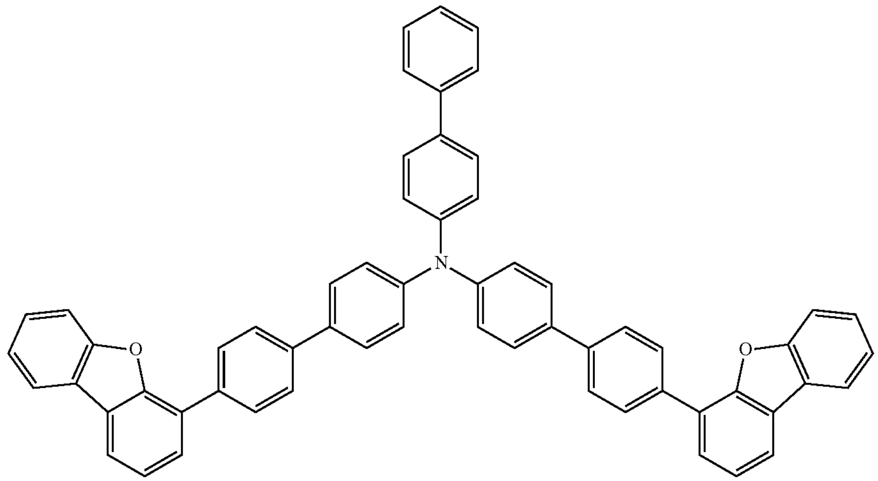

-continued
HT24
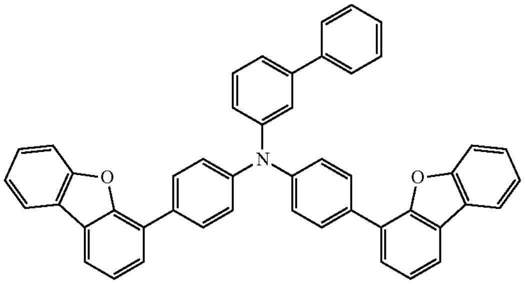
HT25
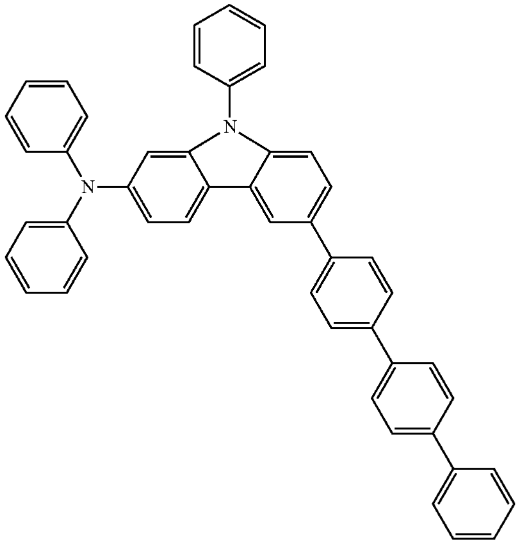
HT26
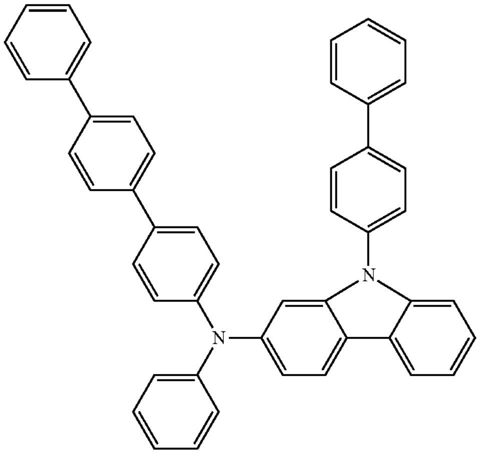
HT27
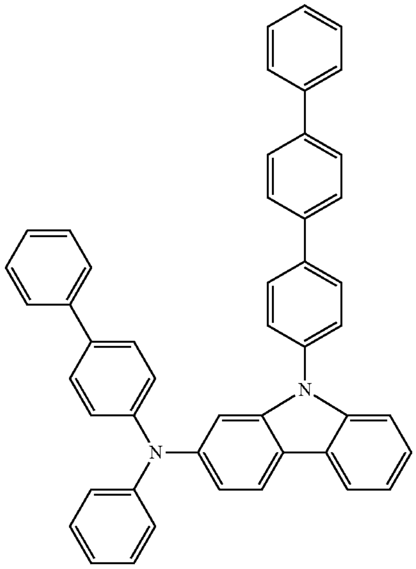
HT28
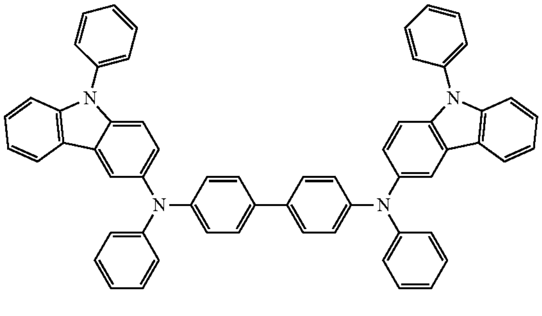
HT29
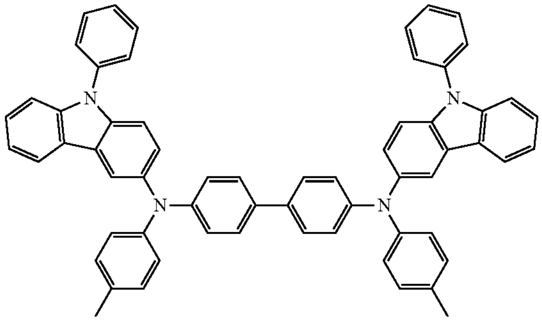

-continued
HT30
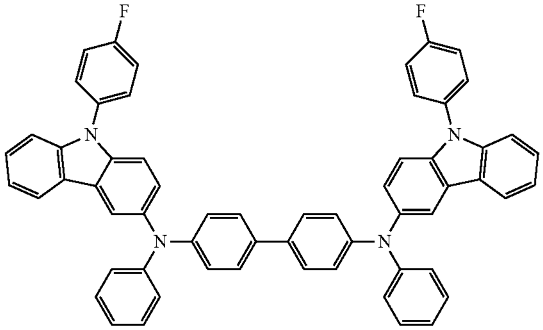
HT31
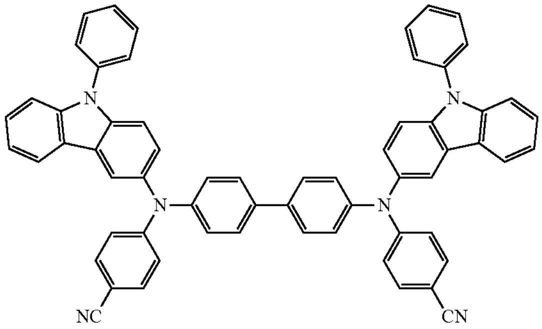
HT32
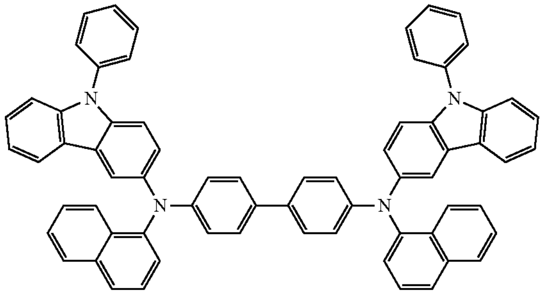
HT33
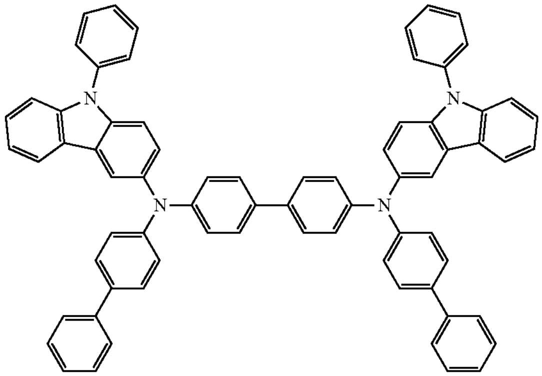
HT34
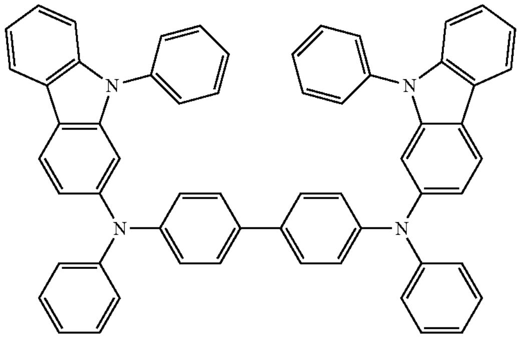
HT35
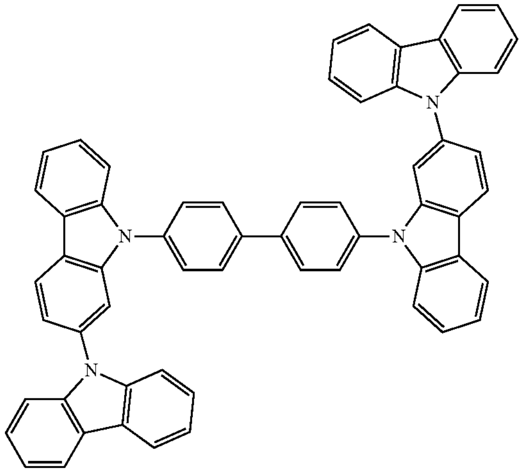

-continued
HT36
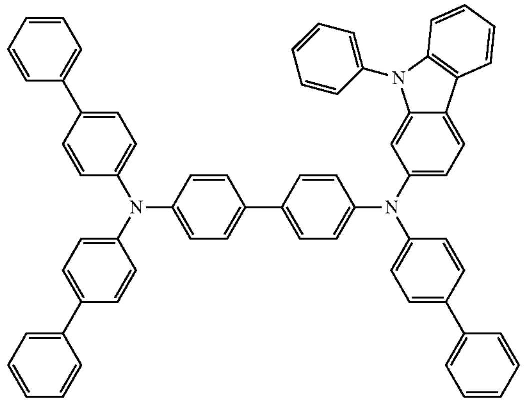
HT37
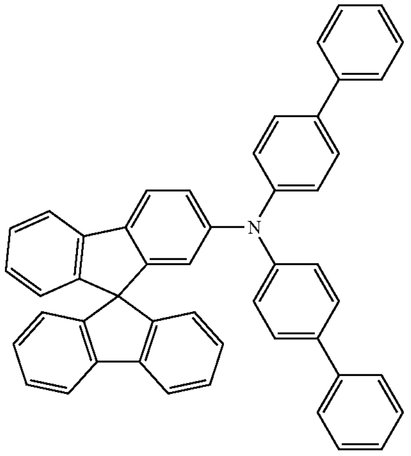
HT38
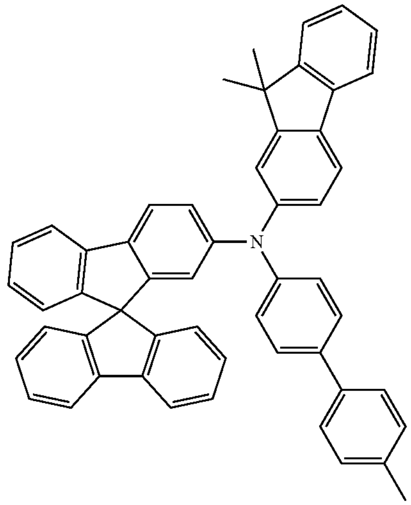
HT39
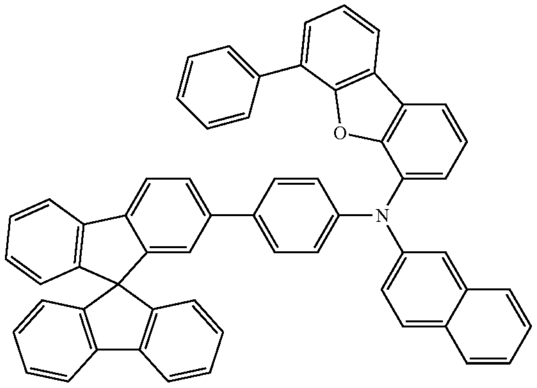
HT40
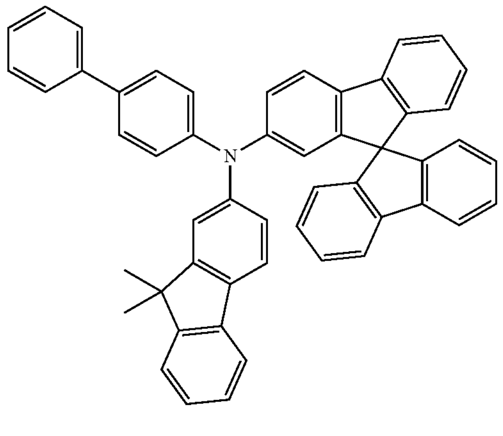
HT41
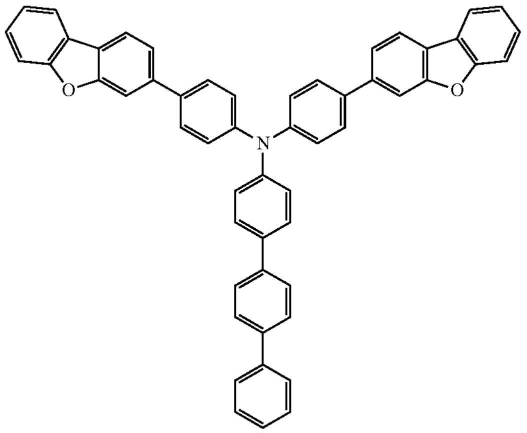

-continued
HT42
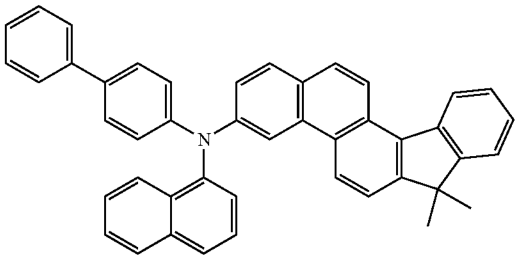
HT43
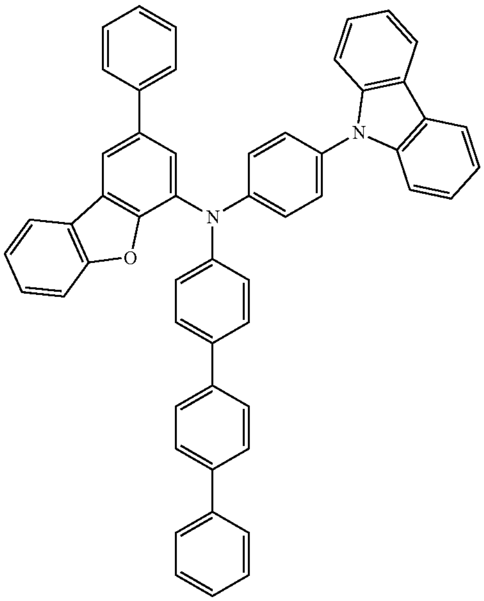
HT44
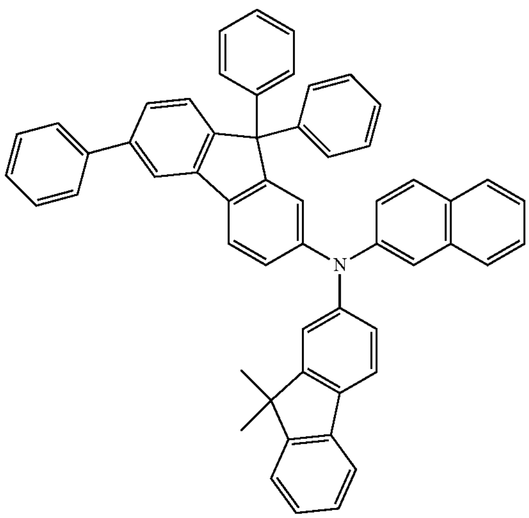
HT45
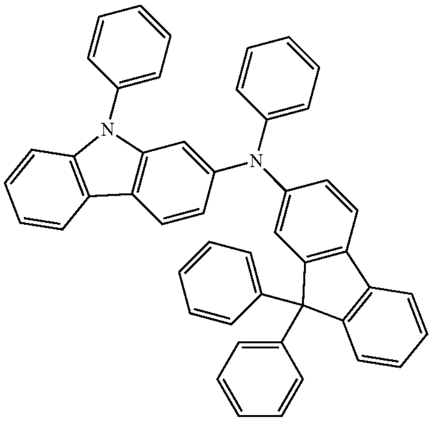
HT46
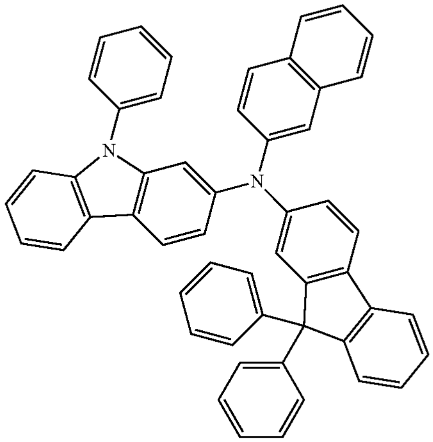

-continued
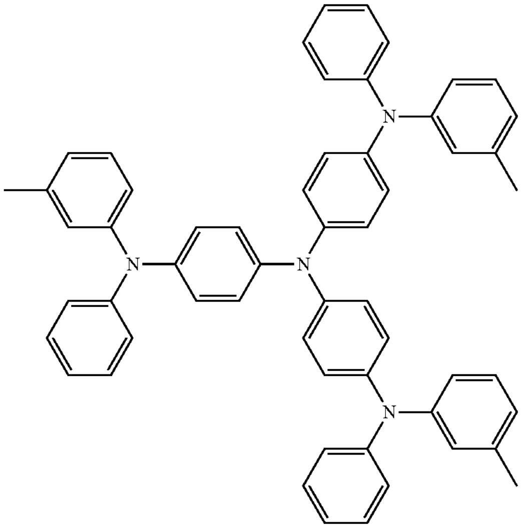
m-MTDATA
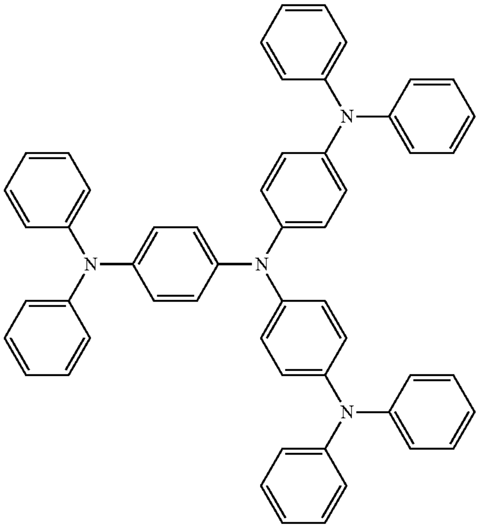
TDATA
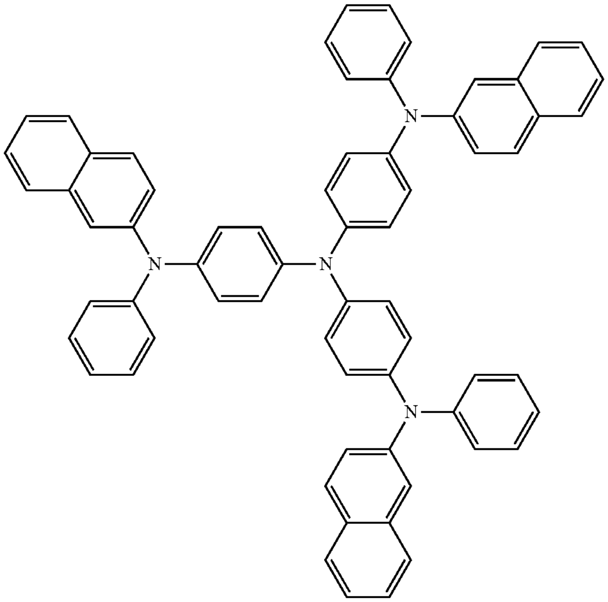
2-TNATA
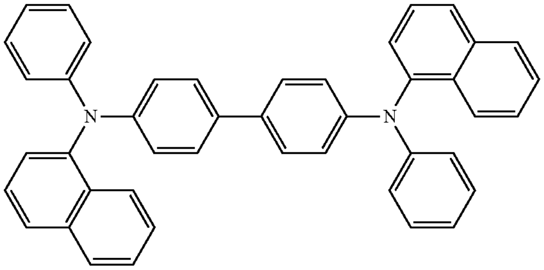
NPB -continued
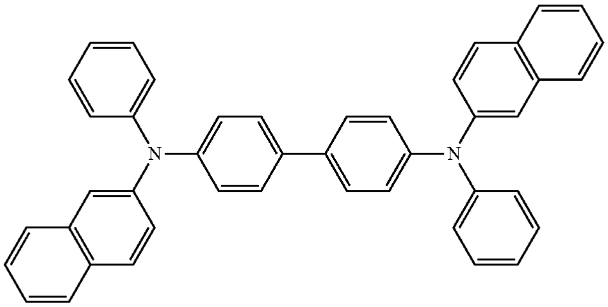
β-NPB
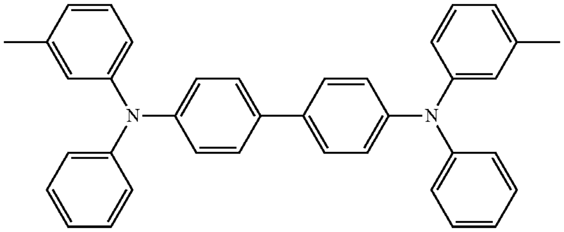
TPD
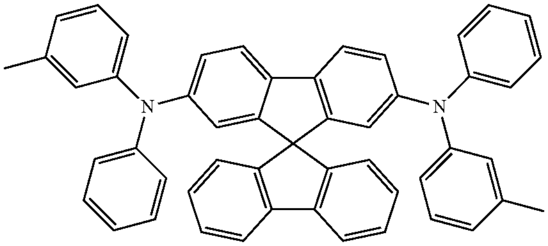
Spiro-TPD
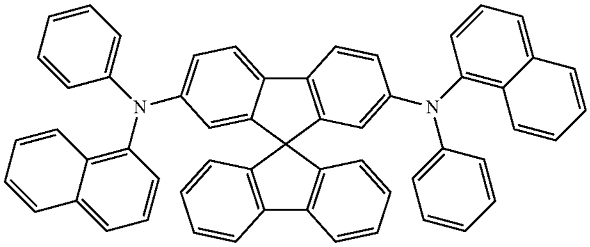
Spiro-NPB
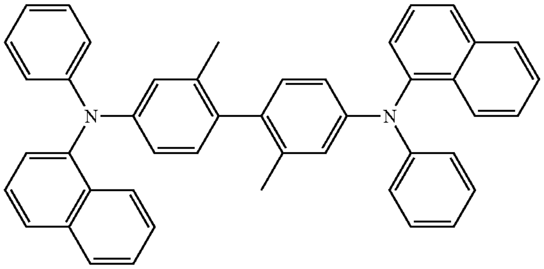
methylated-NPB
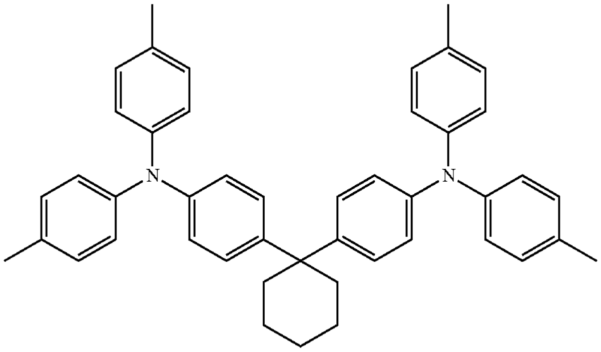
TAPC
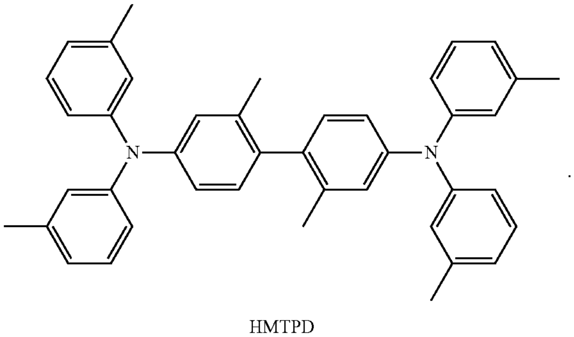
HMTPD A thickness of the hole transport region may be in a range of about 50 Å to about 10,000 Å. For example, the thickness of the hole transport region may be in a range of about 100 Å to about 4,000 Å. In case that the hole transport region includes a hole injection layer, a hole transport layer, or any combination thereof, a thickness of the hole injection layer may be in a range of about 100 Å to about 9,000 Å, and a thickness of the hole transport layer may be in a range of about 50 Å to about 2,000 Å. For example, the thickness of the hole injection layer may be in a range of about 100 Å to about 1,000 Å. For example, the thickness of the hole transport layer may be in a range of about 100 Å to about 1,500 Å. In case that the thicknesses of the hole transport region, the hole injection layer, and the hole transport layer are within the ranges described above, satisfactory hole transporting characteristics may be obtained without a substantial increase in driving voltage.

The emission auxiliary layer may increase light-emission efficiency by compensating for an optical resonance distance according to a wavelength of light emitted by the emission layer, and the electron blocking layer may block the leakage of electrons from the emission layer to the hole transport region. Materials that may be included in the hole transport region may be included in the emission auxiliary layer and the electron blocking layer.

[p-Dopant]

The hole transport region may further include, in addition to the materials as described above, a charge-generation material for improving conductive properties. The charge-generation material may be uniformly or non-uniformly dispersed in the hole transport region (for example, in the form of a single layer consisting of a charge-generation material).

The charge-generation material may be, for example, a p-dopant.

For example, a lowest unoccupied molecular orbital (LUMO) energy level of the p-dopant may be −3.5 eV or less.

In an embodiment, the p-dopant may include a quinone derivative, a cyano group-containing compound, a compound containing element EL1 and element EL2, or any combination thereof.

Examples of the quinone derivative may include TCNQ and F4-TCNQ.

Examples of the cyano group-containing compound may include HAT-CN and a compound represented by Formula 221:

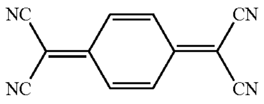

TCNQ

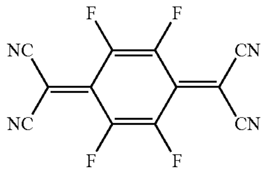

F4-TCNQ

-continued

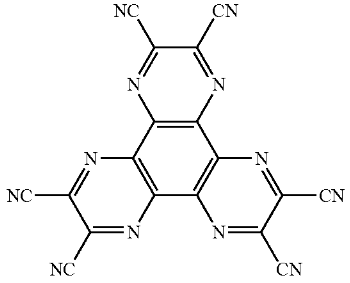

HAT-CN

[Formula 221]

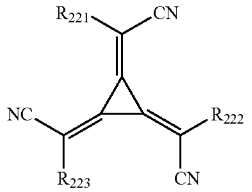

In Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with: a cyano group; —F; —Cl; —Br; —I; a $C_1$-$C_{20}$ alkyl group substituted with a cyano group, —F, —Cl, —Br, —I, or any combination thereof; or any combination thereof.

In the compound containing element EL1 and element EL2, element EU may be a metal, a metalloid, or a combination thereof, and element EL2 may be a non-metal, a metalloid, or a combination thereof.

Examples of the metal may include: an alkali metal (for example, lithium (Li), sodium (Na), potassium (K), rubidium (Rb), cesium (Cs), etc.); an alkaline earth metal (for example, beryllium (Be), magnesium (Mg), calcium (Ca), strontium (Sr), barium (Ba), etc.); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); a post-transition metal (for example, zinc (Zn), indium (In), tin (Sn), etc.); and a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), etc.).

Examples of the metalloid may include silicon (Si), antimony (Sb), and tellurium (Te).

Examples of the non-metal may include oxygen (O) and halogen (for example, F, Cl, Br, I, etc.).

For example, the compound containing element EL1 and element EL2 may include a metal oxide, a metal halide (for example, metal fluoride, metal chloride, metal bromide, metal iodide, etc.), a metalloid halide (for example, a metalloid fluoride, a metalloid chloride, a metalloid bromide, a metalloid iodide, etc.), a metal telluride, or any combination thereof.

Examples of the metal oxide may include tungsten oxide (for example, $WO$, $W_2O_3$, $WO_2$, $WO_3$, $W_2O_5$, etc.), vanadium oxide (for example, $VO$, $V_2O_3$, $VO_2$, $V_2O_5$, etc.), molybdenum oxide ($MoO$, $Mo_2O_3$, $MoO_2$, $MoO_3$, $Mo_2O_5$, etc.), and rhenium oxide (for example, $ReO_3$, etc.).

Examples of the metal halide may include an alkali metal halide, an alkaline earth metal halide, a transition metal halide, a post-transition metal halide, and a lanthanide metal halide.

Examples of the alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, and CsI.

Examples of the alkaline earth metal halide may include $BeF_2$, $MgF_2$, $CaF_2$, $SrF_2$, $BaF_2$, $BeCl_2$, $MgCl_2$, $CaCl_2$, $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and $BaI_2$.

Examples of the transition metal halide may include a titanium halide (for example, $TiF_4$, $TiCl_4$, $TiBr_4$, $TiI_4$, etc.), a zirconium halide (for example, $ZrF_4$, $ZrCl_4$, $ZrBr_4$, $ZrI_4$, etc.), a hafnium halide (for example, $HfF_4$, $HfCl_4$, $HfBr_4$, $HfI_4$, etc.), a vanadium halide (for example, $VF_3$, $VCl_3$, $VBr_3$, $VI_3$, etc.), a niobium halide (for example, $NbF_3$, $NbCl_3$, $NbBr_3$, $NbI_3$, etc.), a tantalum halide (for example, $TaF_3$, $TaCl_3$, $TaBr_3$, $TaI_3$, etc.), a chromium halide (for example, $CrF_3$, $CrCl_3$, $CrBr_3$, $CrI_3$, etc.), a molybdenum halide (for example, $MoF_3$, $MoCl_3$, $MoBr_3$, $MoI_3$, etc.), a tungsten halide (for example, $WF_3$, $WCl_3$, $WBr_3$, $WI_3$, etc.), a manganese halide (for example, $MnF_2$, $MnCl_2$, $MnBr_2$, $MnI_2$, etc.), a technetium halide (for example, $TcF_2$, $TcCl_2$, $TcBr_2$, $TcI_2$, etc.), a rhenium halide (for example, $ReF_2$, $ReCl_2$, $ReBr_2$, $ReI_2$, etc.), an iron halide (for example, $FeF_2$, $FeCl_2$, $FeBr_2$, $FeI_2$, etc.), a ruthenium halide (for example, $RuF_2$, $RuCl_2$, $RuBr_2$, $RuI_2$, etc.), an osmium halide (for example, $OsF_2$, $OsCl_2$, $OsBr_2$, $OsI_2$, etc.), a cobalt halide (for example, $CoF_2$, $CoCl_2$, $CoBr_2$, $CoI_2$, etc.), a rhodium halide (for example, $RhF_2$, $RhCl_2$, $RhBr_2$, $RhI_2$, etc.), an iridium halide (for example, $IrF_2$, $IrCl_2$, $IrBr_2$, $IrI_2$, etc.), a nickel halide (for example, $NiF_2$, $NiCl_2$, $NiBr_2$, $NiI_2$, etc.), a palladium halide (for example, $PdF_2$, $PdCl_2$, $PdBr_2$, $PdI_2$, etc.), a platinum halide (for example, $PtF_2$, $PtCl_2$, $PtBr_2$, $PtI_2$, etc.), a copper halide (for example, CuF, CuCl, CuBr, CuI, etc.), a silver halide (for example, AgF, AgCl, AgBr, AgI, etc.), and a gold halide (for example, AuF, AuCl, AuBr, AuI, etc.).

Examples of the post-transition metal halide may include a zinc halide (for example, $ZnF_2$, $ZnCl_2$, $ZnBr_2$, $ZnI_2$, etc.), an indium halide (for example, $InI_3$, etc.), and a tin halide (for example, $SnI_2$, etc.).

Examples of the lanthanide metal halide may include YbF, $YbF_2$, $YbF_3$, $SmF_3$, YbCl, $YbCl_2$, $YbCl_3$, $SmCl_3$, YbBr, $YbBr_2$, $YbBr_3$, $SmBr_3$, YbI, $YbI_2$, $YbI_3$, and $SmI_3$.

Examples of the metalloid halide may include antimony halide (for example, $SbCl_5$, etc.).

Examples of the metal telluride may include an alkali metal telluride (for example, $Li_2Te$, $Na_2Te$, $K_2Te$, $Rb_2Te$, $Cs_2Te$, etc.), an alkaline earth metal telluride (for example, BeTe, MgTe, CaTe, SrTe, BaTe, etc.), a transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, etc.), a post-transition metal telluride (for example, ZnTe, etc.), and a lanthanide metal telluride (for example, LaTe, CeTe, PrTe, NdTe, PmTe, EuTe, GdTe, TbTe, DyTe, HoTe, ErTe, TmTe, YbTe, LuTe, etc.).

In an embodiment, the p-dopant described above may be included a charge generation layer of the disclosure. For example, the p-dopant may be included in the p-type charge generation layer.

[Emission Layer in Interlayer 130]

In case that the light-emitting device 10 is a full-color light-emitting device, the emission layer may be patterned into a red emission layer, a green emission layer, and/or a blue emission layer, according to a subpixel. In embodiments, the emission layer may have a stacked structure of two or more layers of a red emission layer, a green emission layer, and a blue emission layer, in which the two or more layers contact each other or are separated from each other to emit white light. In embodiments, the emission layer may have a structure in which two or more materials of a red light-emitting material, a green light-emitting material, and a blue light-emitting material are mixed with each other in a single layer, and thus emit white light.

The emission layer may include a host and a dopant. The dopant may include a phosphorescent dopant, a fluorescent dopant, or any combination thereof.

An amount of the dopant in the emission layer may be in a range of about 0.01 part by weight to about 15 parts by weight based on 100 parts by weight of the host.

In embodiments, the emission layer may include a quantum dot.

In embodiments, the emission layer may include a delayed fluorescence material. The delayed fluorescence material may serve as a host or as a dopant in the emission layer.

A thickness of the emission layer may be in a range of about 100 Å to about 1,000 Å. For example, the thickness of the emission layer may be in a range of about 200 Å to about 600 Å. In case that the thickness of the emission layer is within the range described above, excellent light-emission characteristics may be obtained without a substantial increase in driving voltage.

[Host]

In embodiments, the host may include a compound represented by Formula 301:

$$[Ar_{301}]_{xb11}-[(L_{301})_{xb1}-R_{301}]_{xb21} \quad \text{[Formula 301]}$$

In Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{301}$)($Q_{302}$)($Q_{303}$), —N($Q_{301}$)($Q_{302}$), —B($Q_{301}$)($Q_{302}$), —C(═O)($Q_{301}$), —S(═O)$_2$($Q_{301}$), or —P(═O)($Q_{301}$)($Q_{302}$), xb21 may be an integer from 1 to 5, and $Q_{301}$ to $Q_{303}$ may each independently the same as described in connection with $Q_1$.

In an embodiment, in Formula 301, in case that xb11 is 2 or more, two or more of $Ar_{301}$(s) may be linked to each other via a single bond.

In embodiments, the host may include a compound represented by Formula 301-1, a compound represented by Formula 301-2, or any combination thereof:

[Formula 301-1]

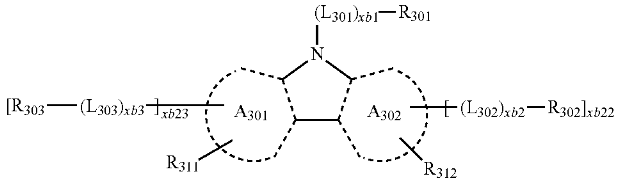

[Formula 301-2]

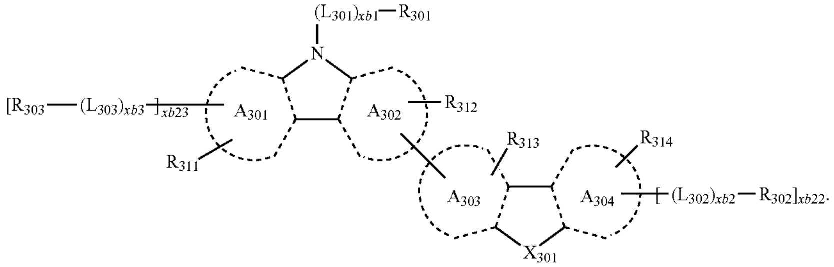

In Formulae 301-1 and 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N—[$(L_{304})_{xb4}$-$R_{304}$], C($R_{304}$)($R_{305}$), or Si($R_{304}$)($R_{305}$), xb22 and xb23 may each independently be 0, 1, or 2, $L_{301}$, xb1, and $R_{301}$ may respectively be the same as those described herein, $L_{302}$ to $L_{304}$ may each independently be the same as described in connection with $L_{301}$, xb2 to xb4 may each independently be the same as described in connection with xb1, and $R_{302}$ to $R_{305}$ and $R_{311}$ to $R_{314}$ may each independently be the same as described in connection with $R_{301}$.

In embodiments, the host may include an alkali earth metal complex, a post-transition metal complex, or any combination thereof. For example, the host may include a Be complex (for example, Compound H55), an Mg complex, a Zn complex, or any combination thereof.

In embodiments, the host may include one of Compounds H1 to H126, 9,10-di(2-naphthyl)anthracene (ADN), 2-m ethyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), or any combination thereof:

H1

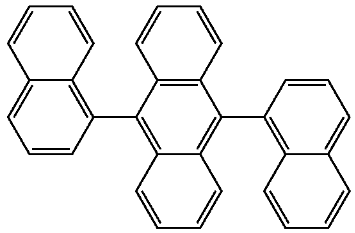

H2

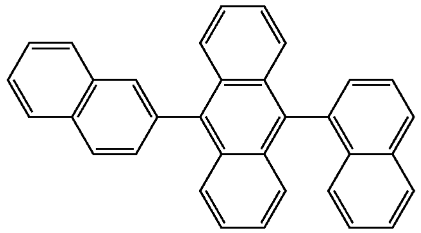

H3

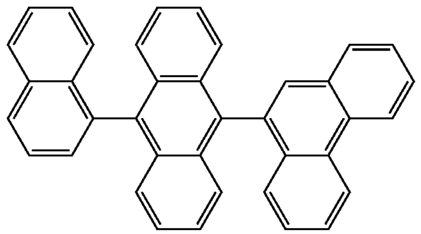

-continued
H4
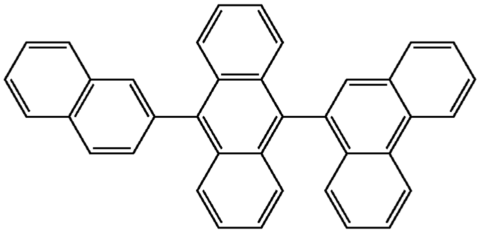
H5
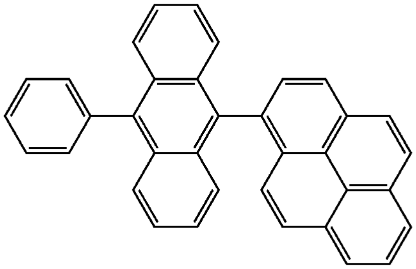
H6
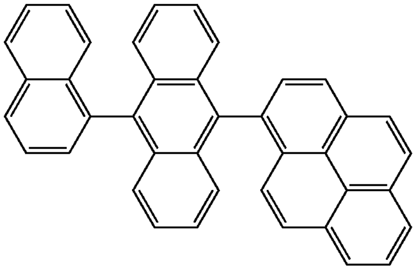
H7
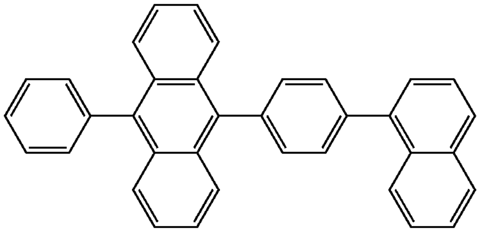
H8
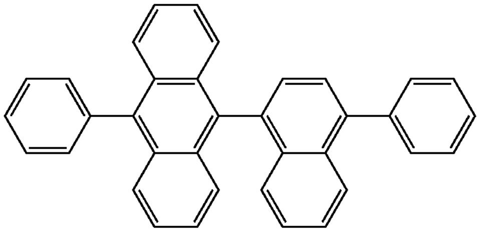
H9
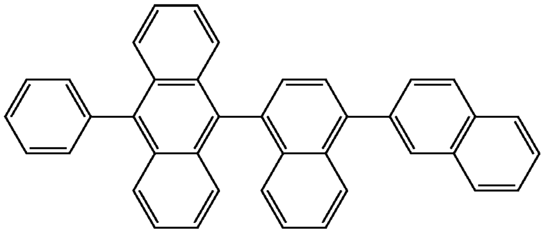
-continued
H10
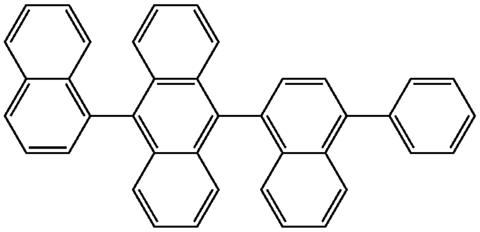
H11
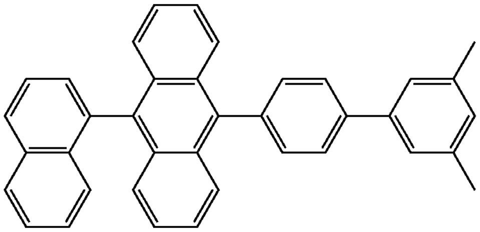
H12
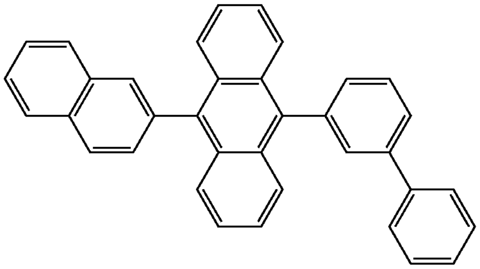
H13
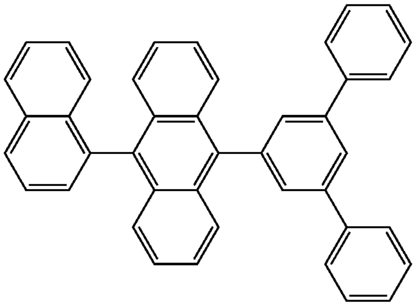
H14
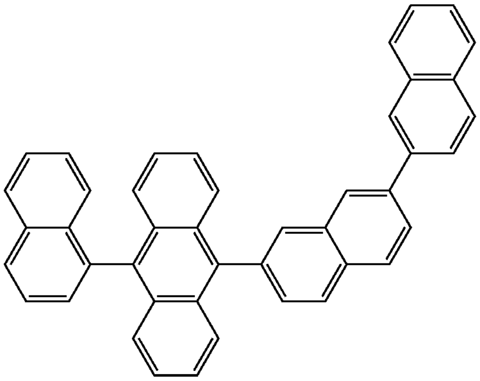

-continued
H15
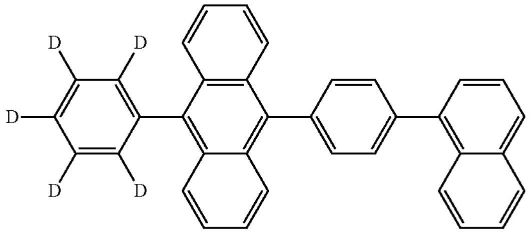
H16
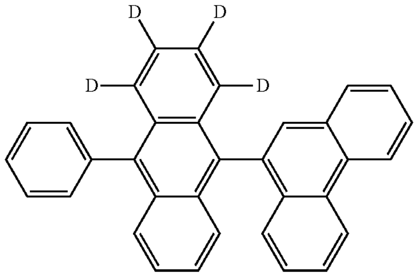
H17
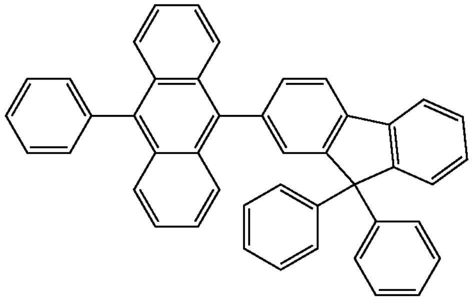
H18
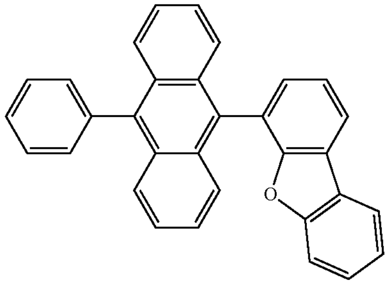
H19
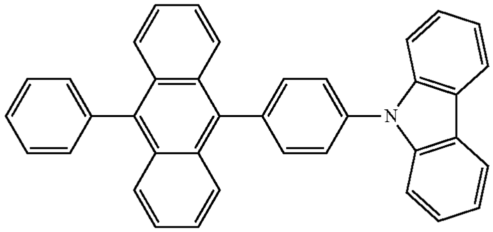
-continued
H20
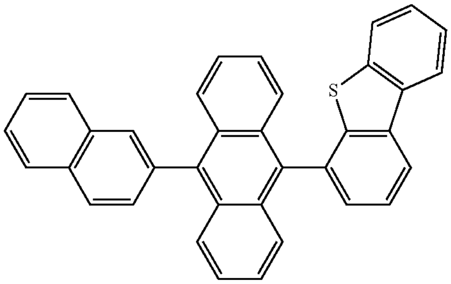
H21
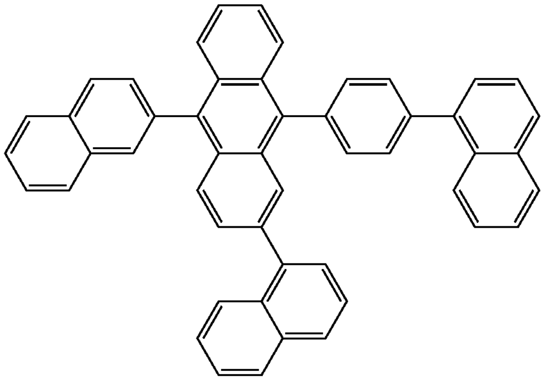
H22
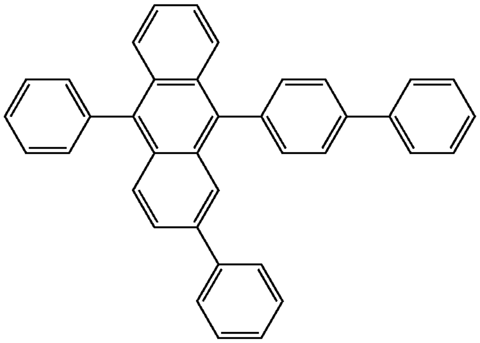
H23
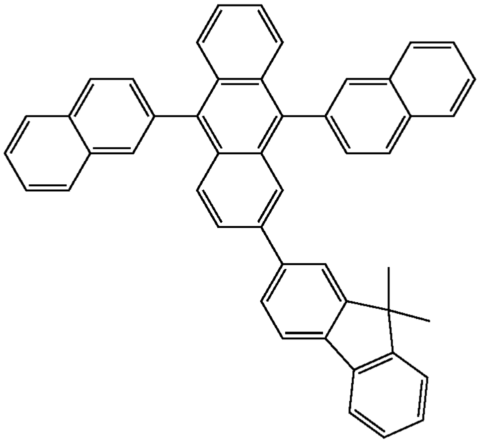

-continued
H24
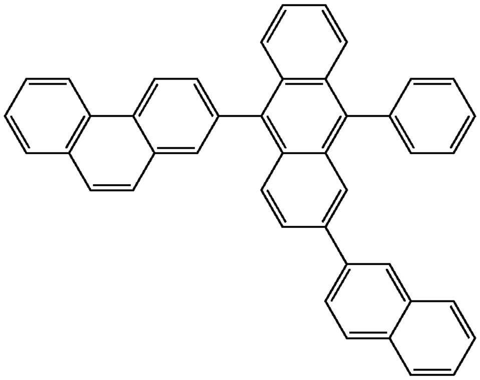
H25
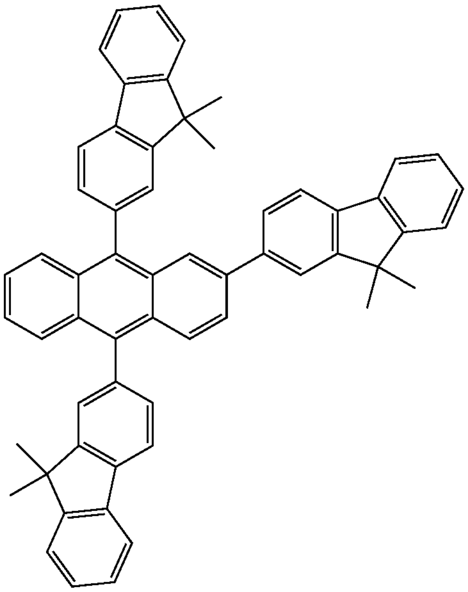
H26
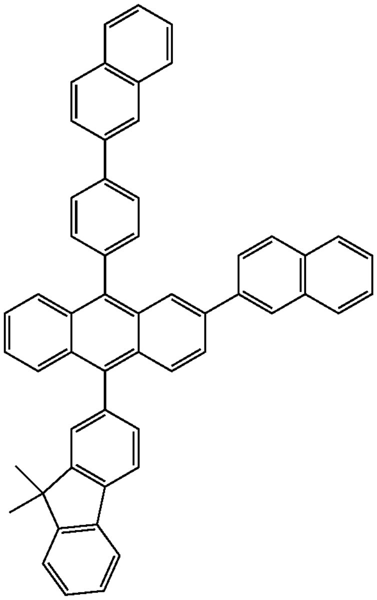
-continued
H27
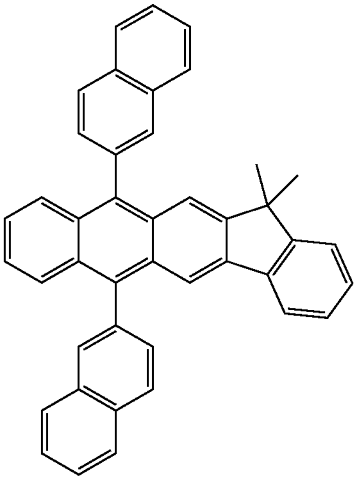
H28
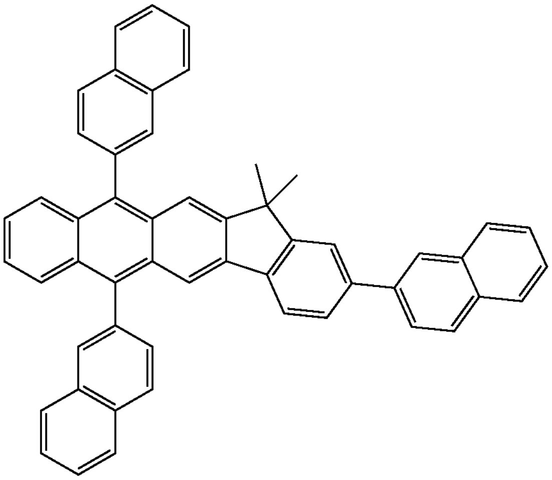
H29
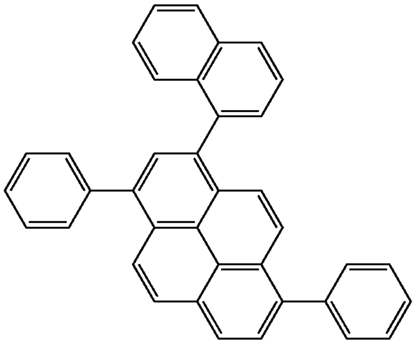

-continued
H30
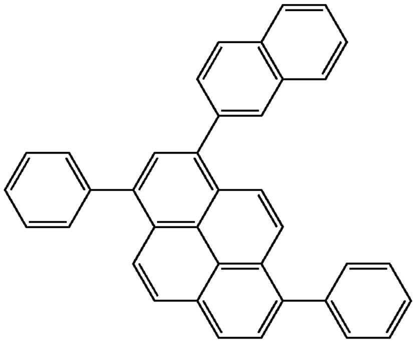
H31
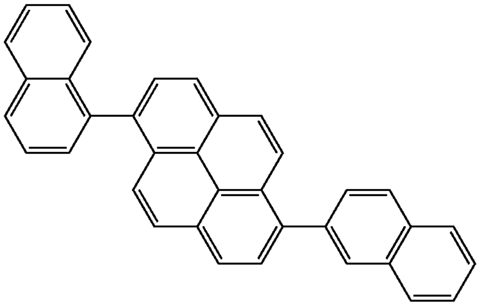
H32
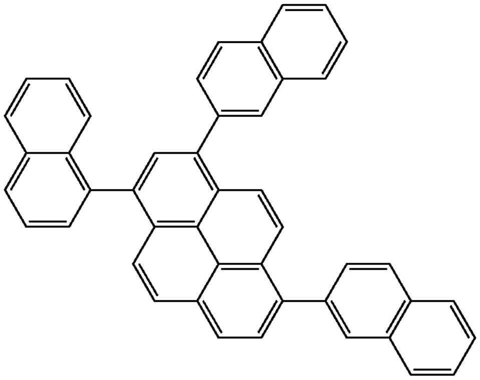
H33
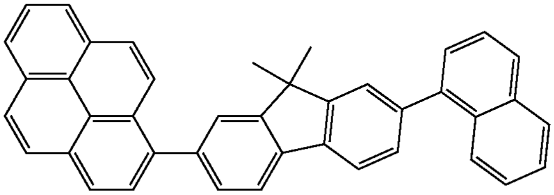
H34
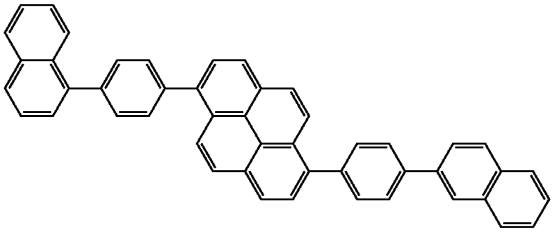
-continued
H35
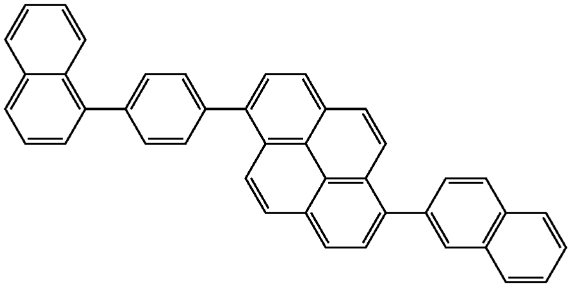
H36
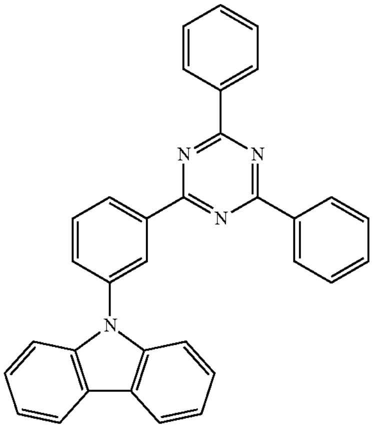
H37
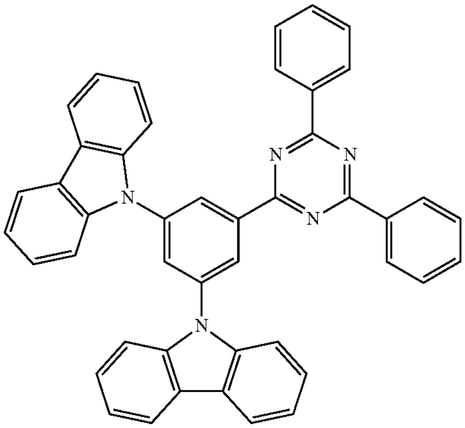
H38
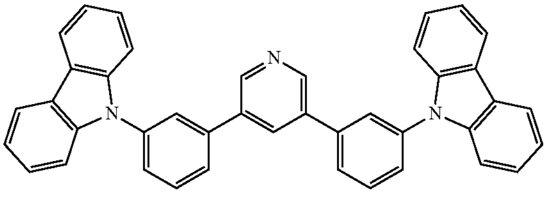

-continued
H39
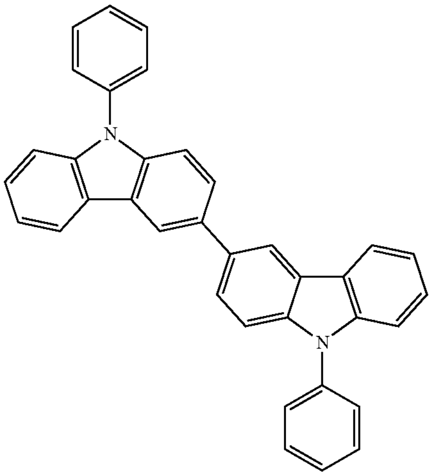
H40
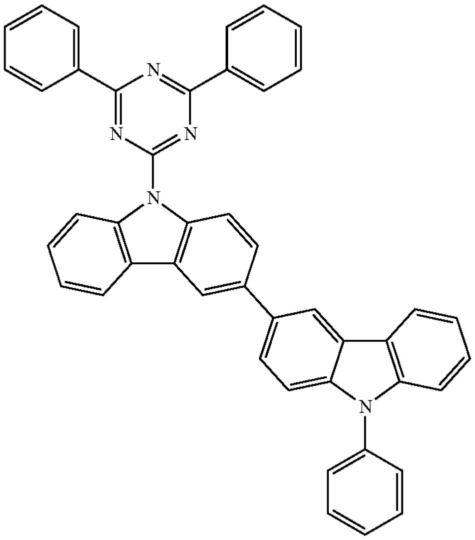
H41
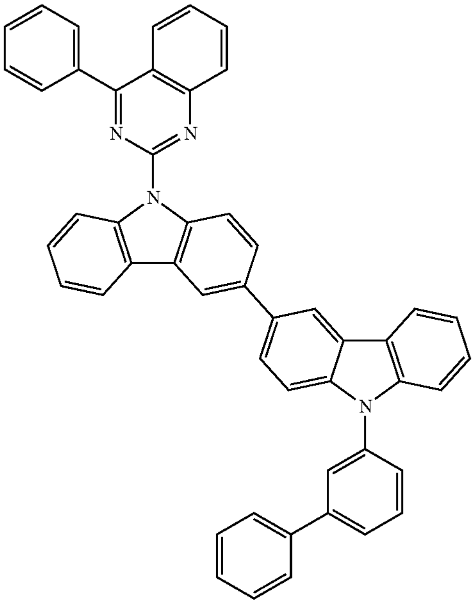
-continued
H42
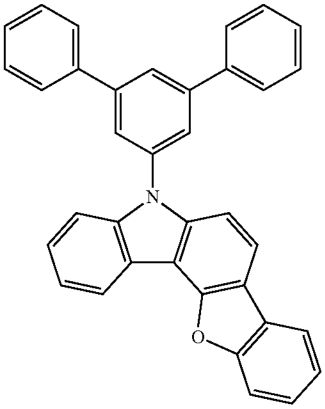
H43
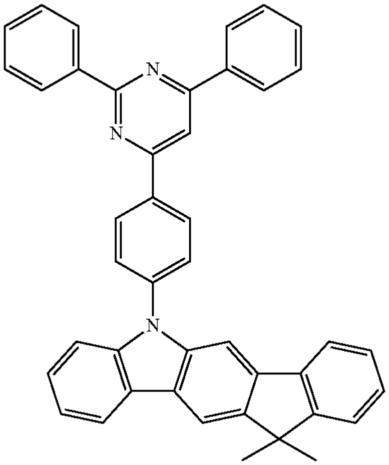
H44
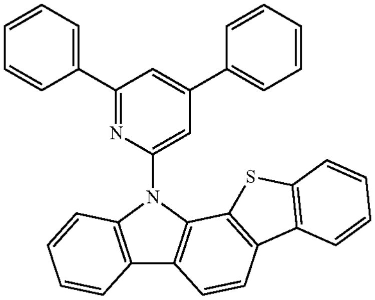
H45
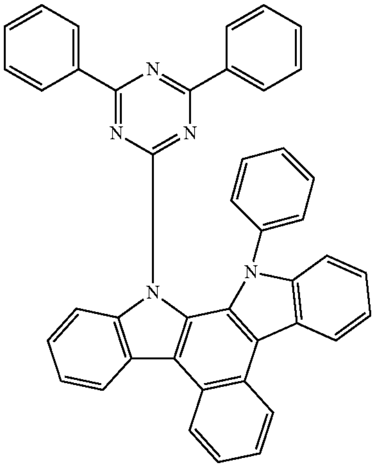

-continued
H46
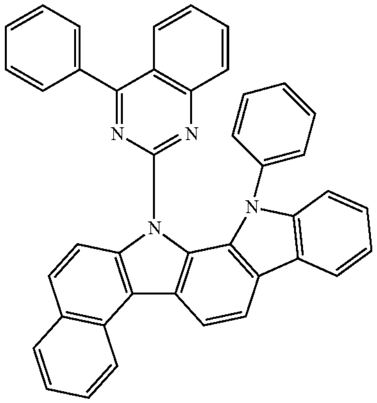
H47
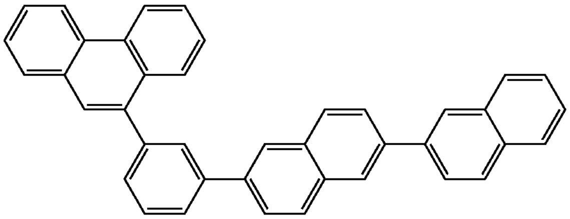
H48
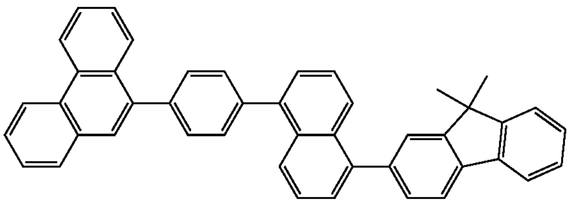
H49
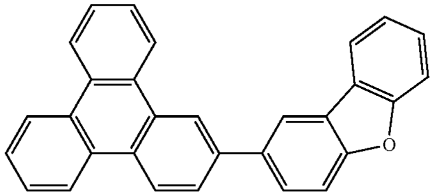
H50
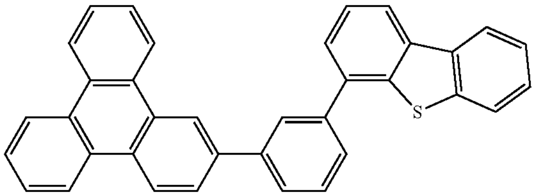
H51
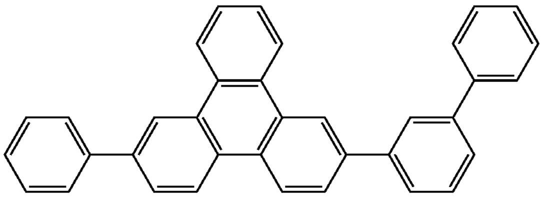
-continued
H52
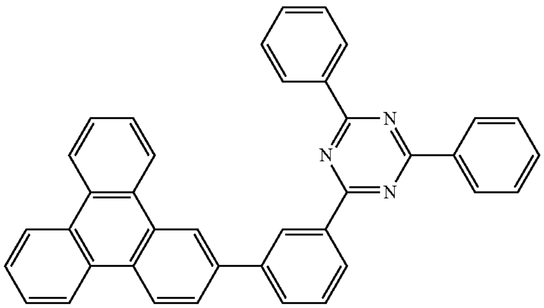
H53
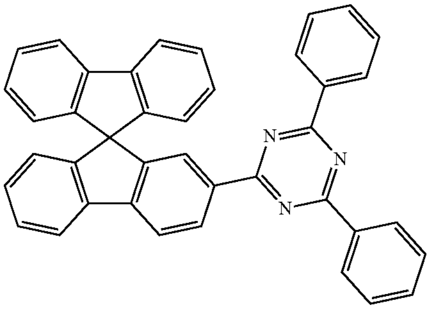
H54
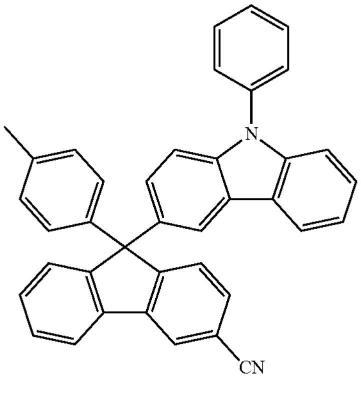
H55
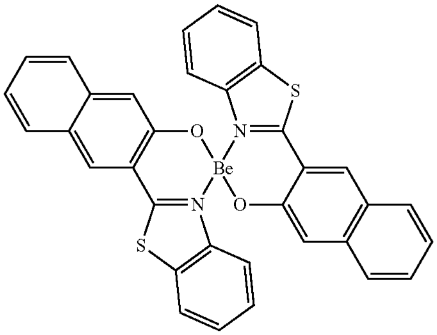

-continued
H56
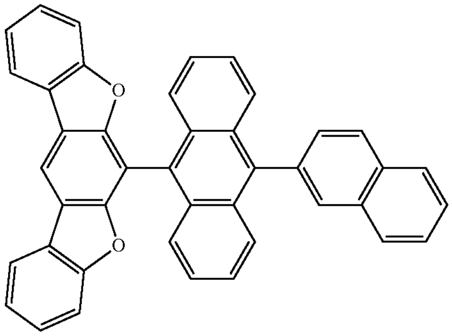
H57
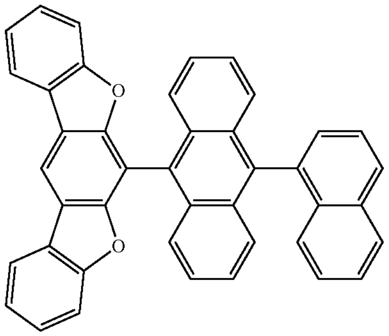
H58
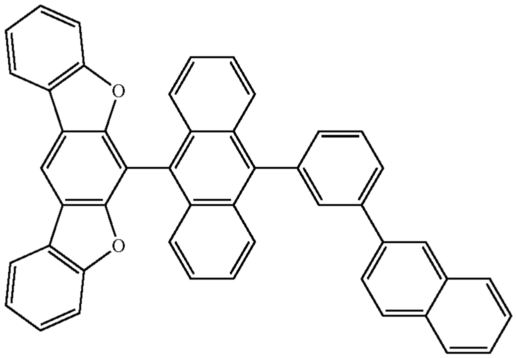
H59
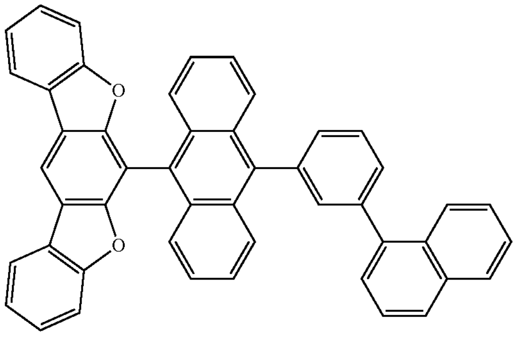
-continued
H60
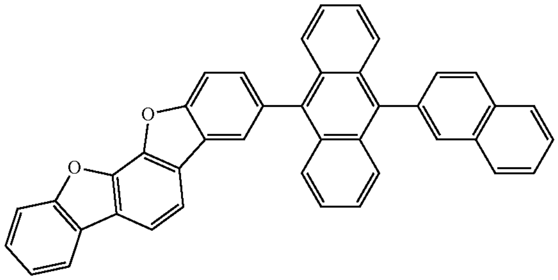
H61
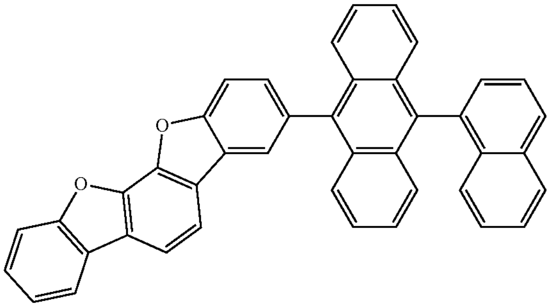
H62
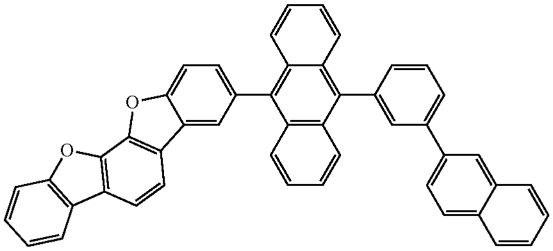
H63
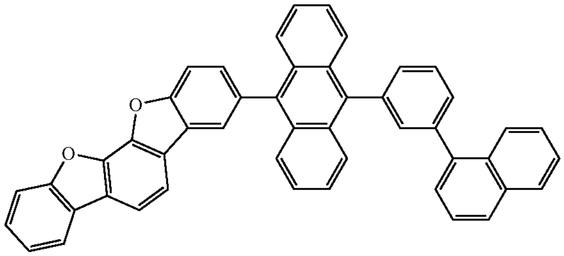
H64
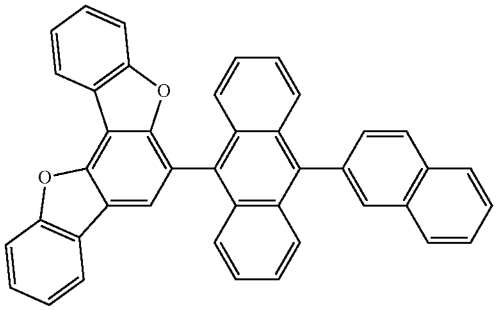

-continued
H65
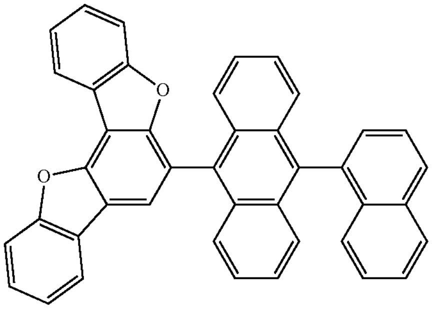
H66
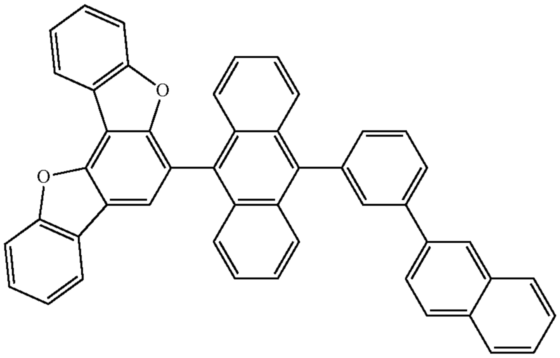
H67
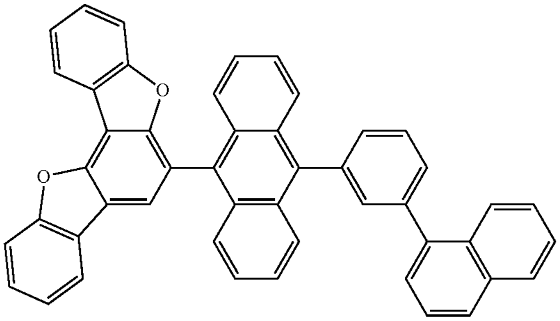
H68
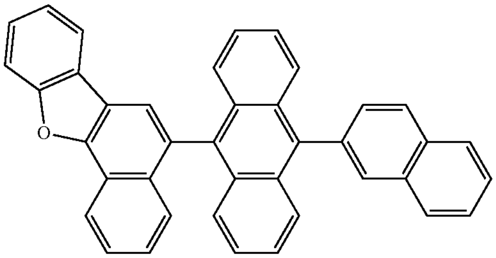
H69
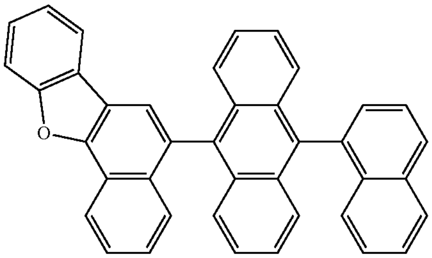
-continued
H70
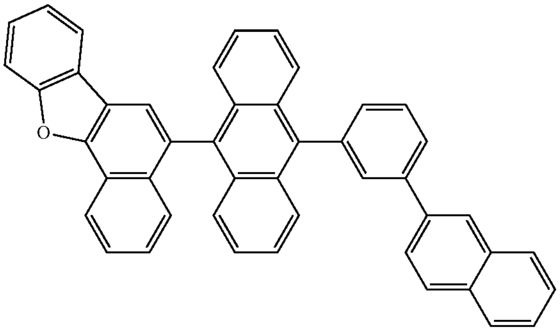
H71
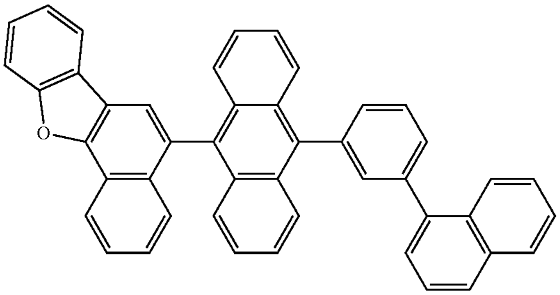
H72
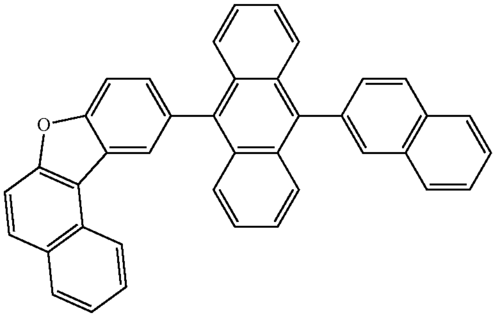
H73
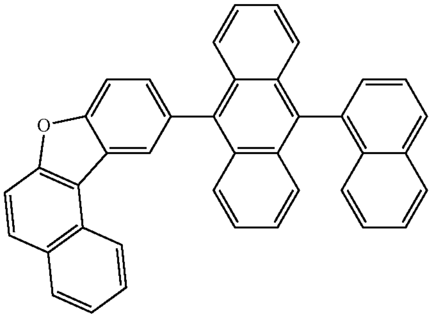

-continued
H74
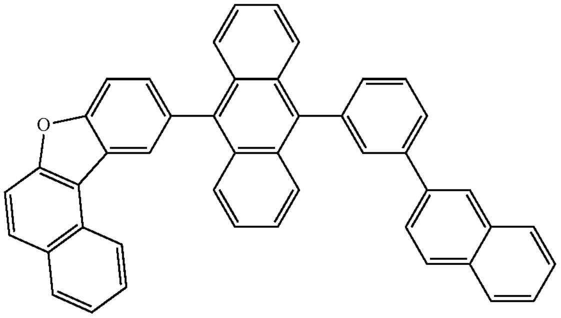
H75
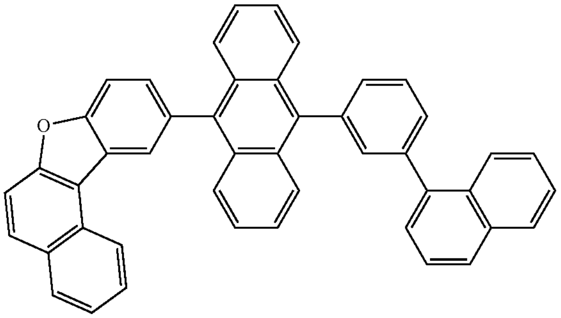
H76
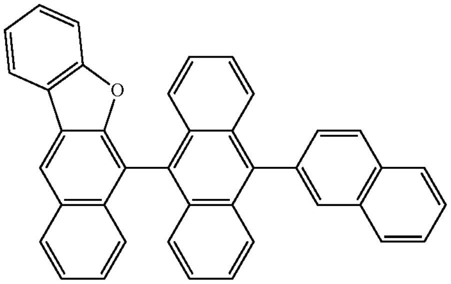
H77
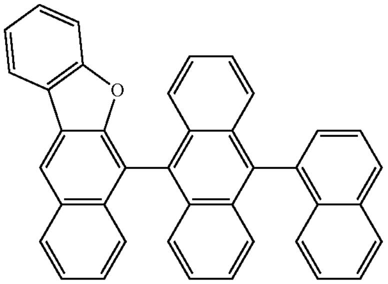
H78
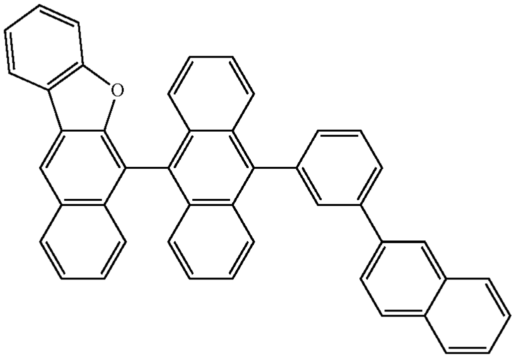
-continued
H79
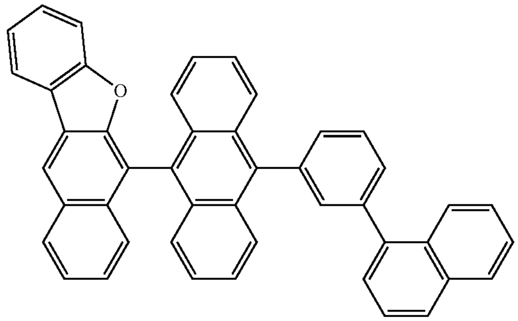
H80
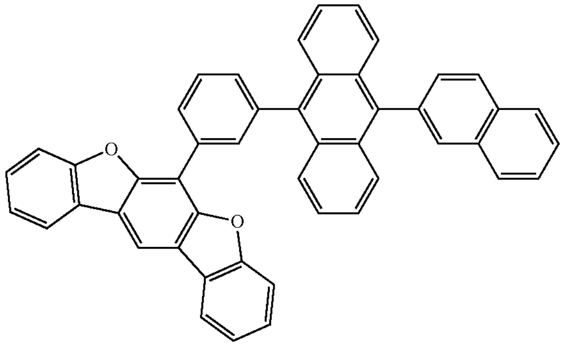
H81
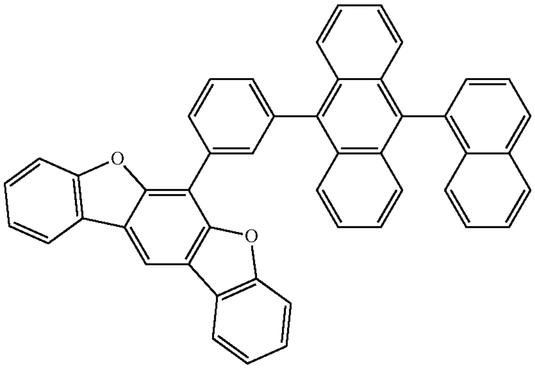
H82
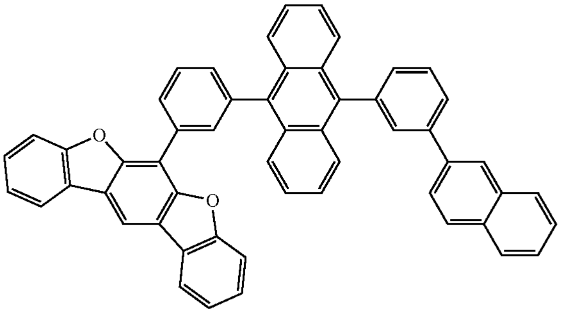

-continued
H83
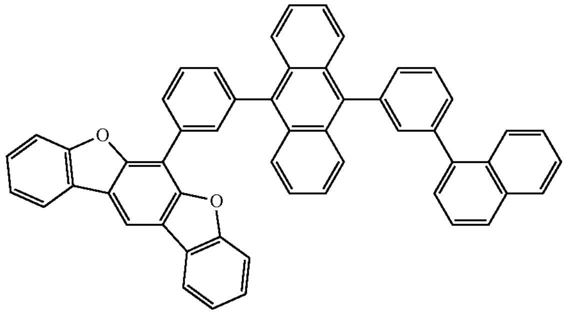
H84
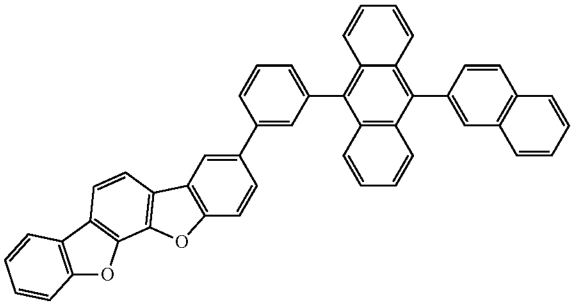
H85
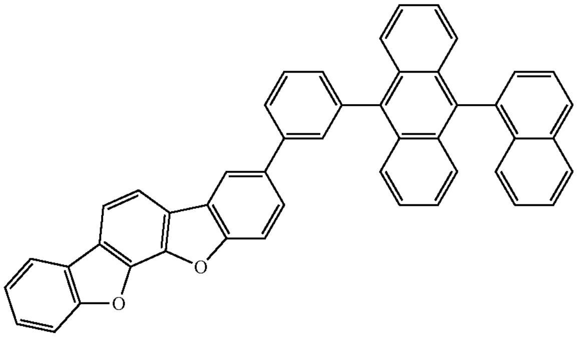
H86
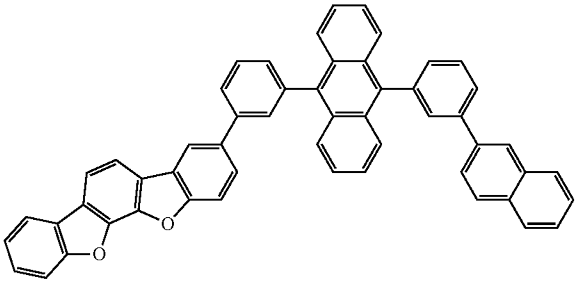
H87
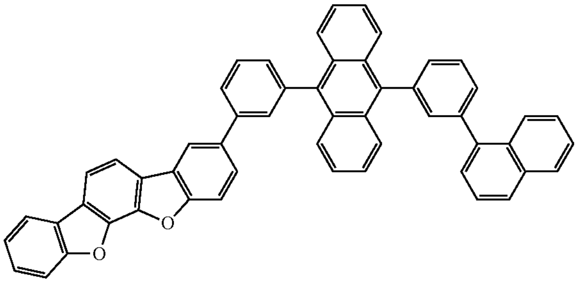
-continued
H88
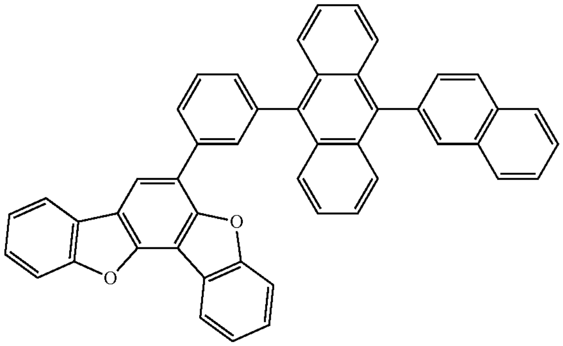
H89
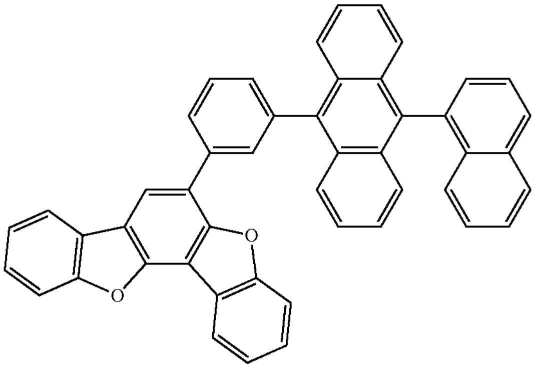
H90
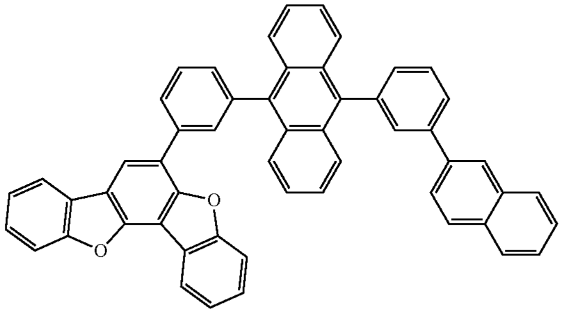
H91
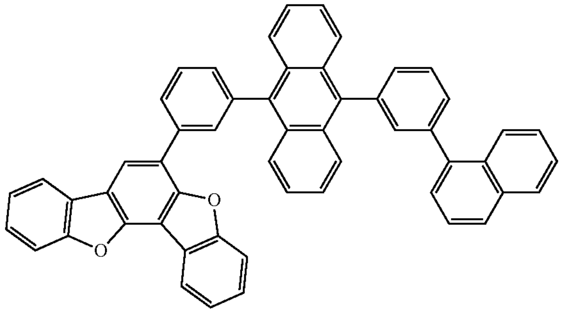

-continued
H92
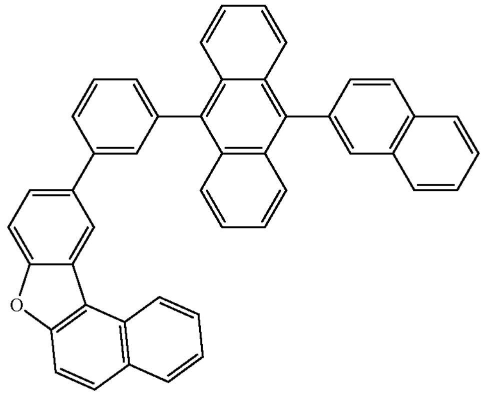
H93
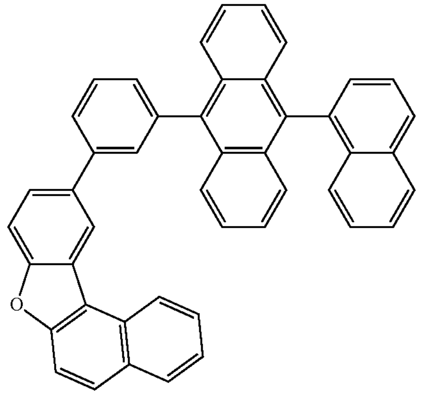
H94
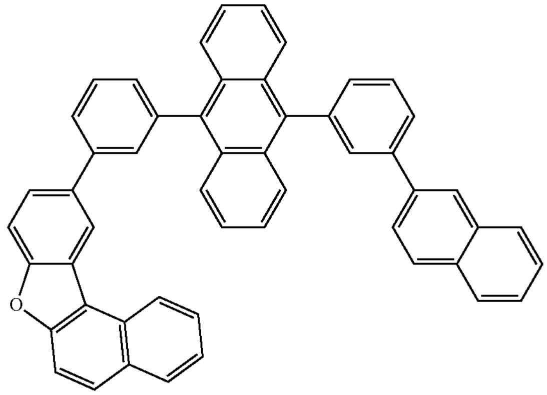
H95
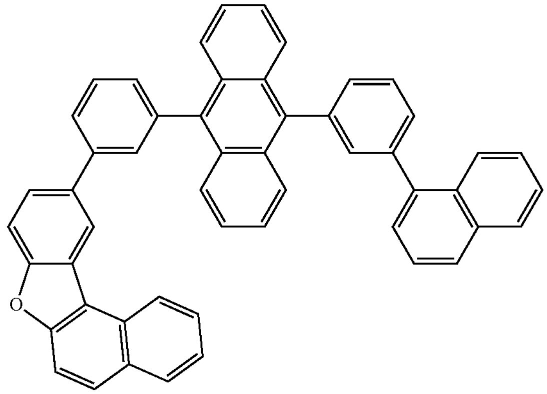
-continued
H96
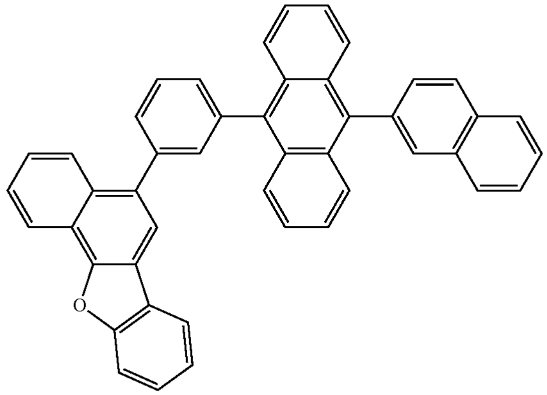
H97
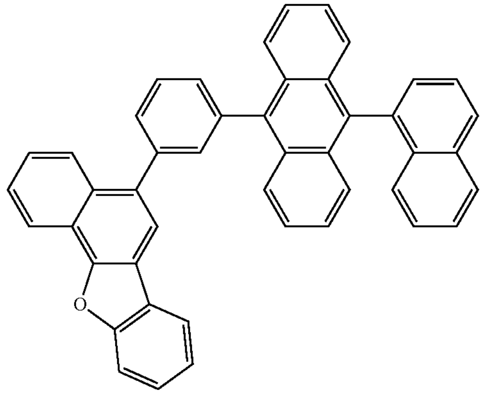
H98
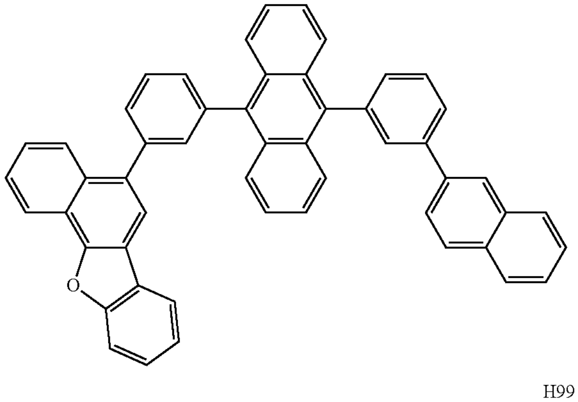
H99
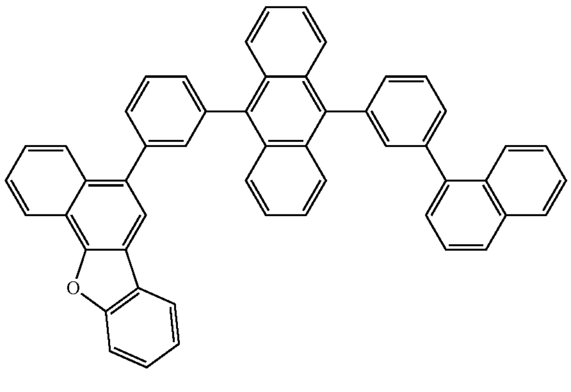

-continued
H100
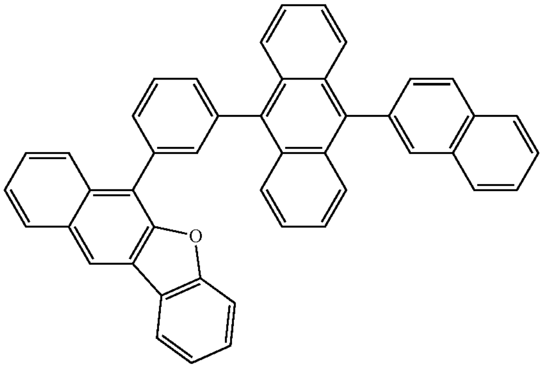
H101
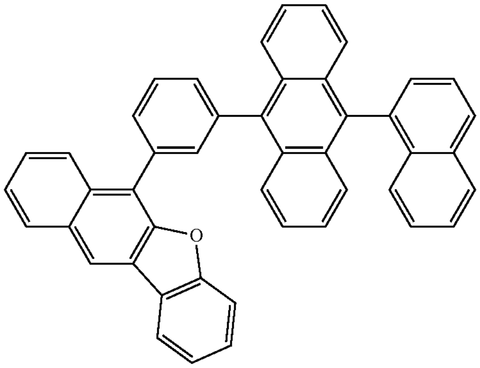
H102
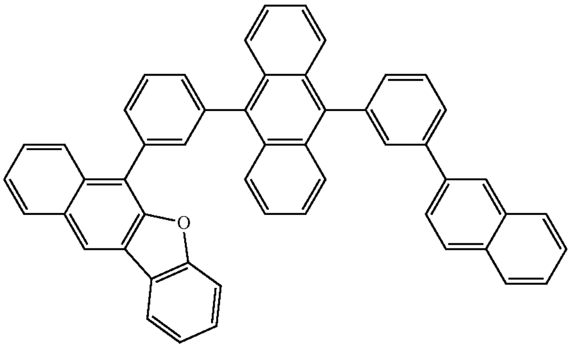
H103
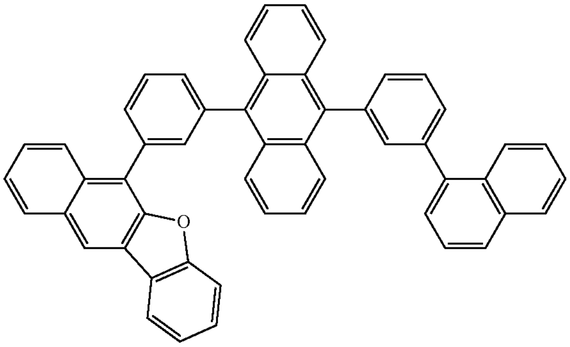
-continued
H104
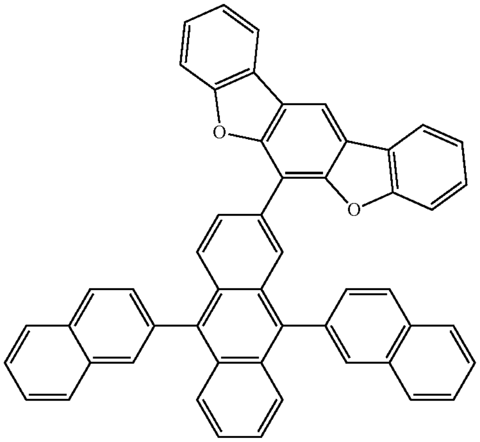
H105
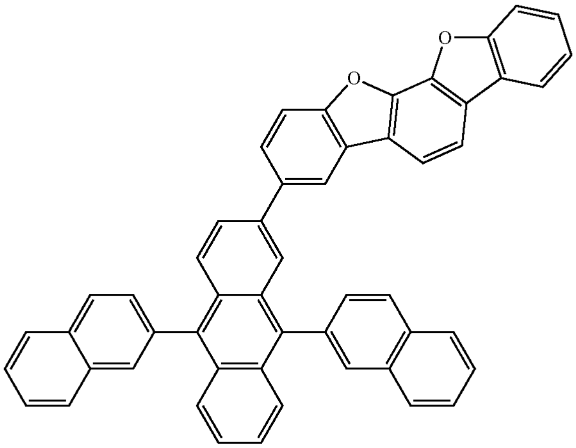
H106
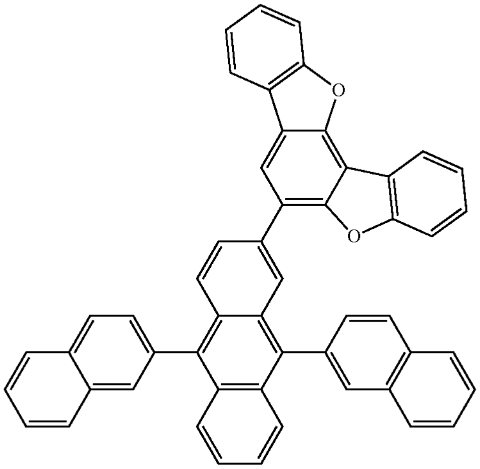

-continued
H107
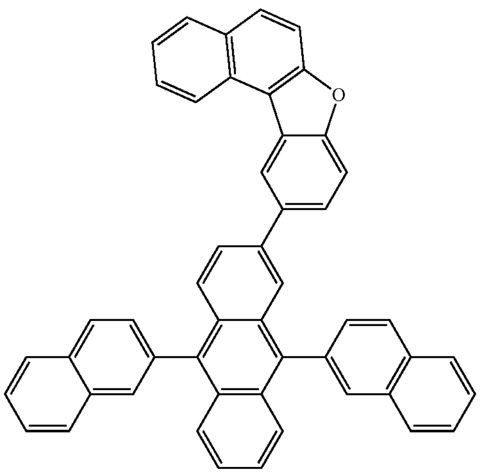
H108
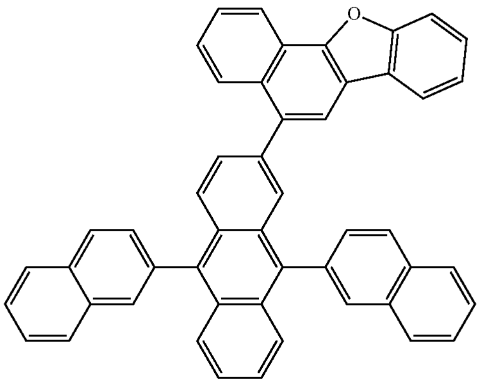
H109
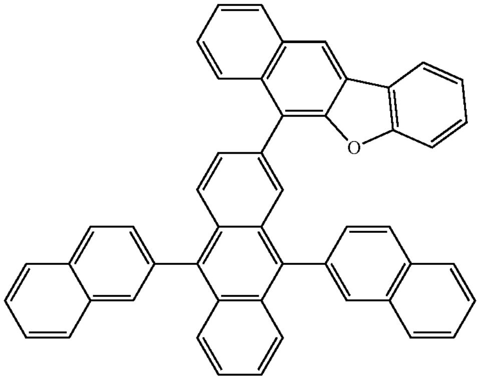
H110
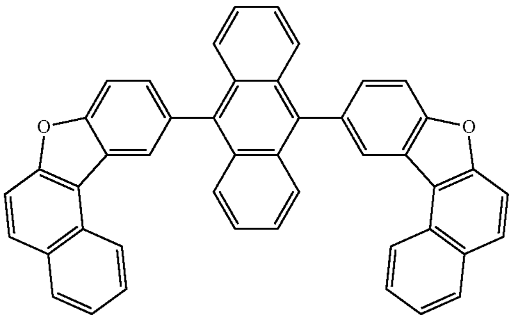
-continued
H111
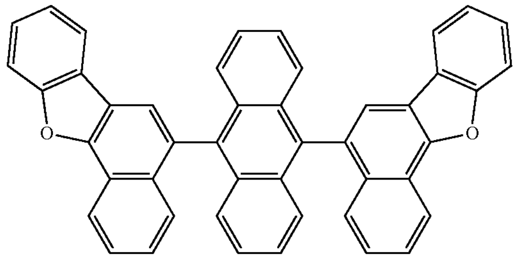
H112
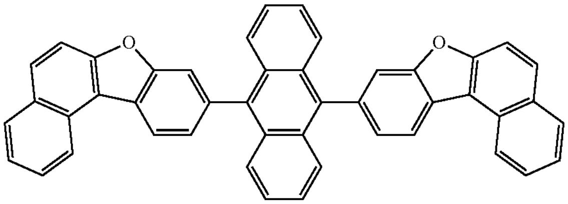
H113
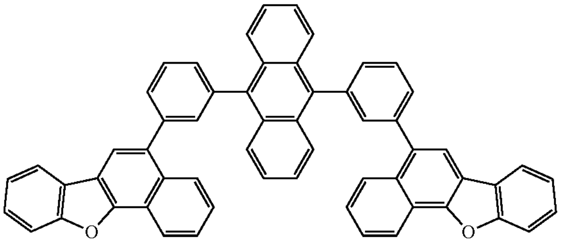
H114
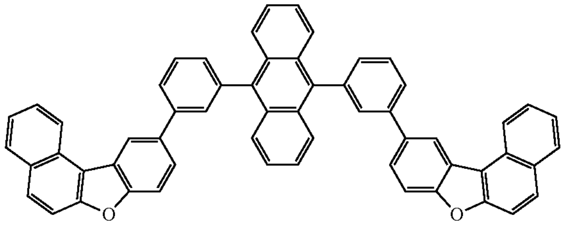
H115
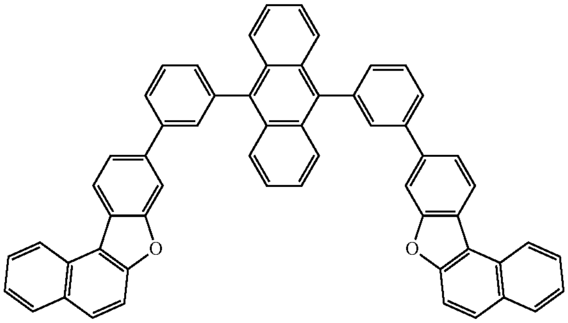

-continued
H116
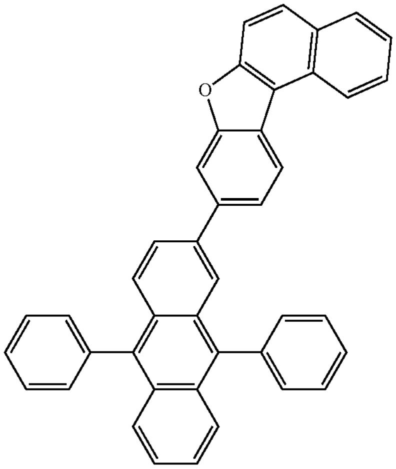
H117
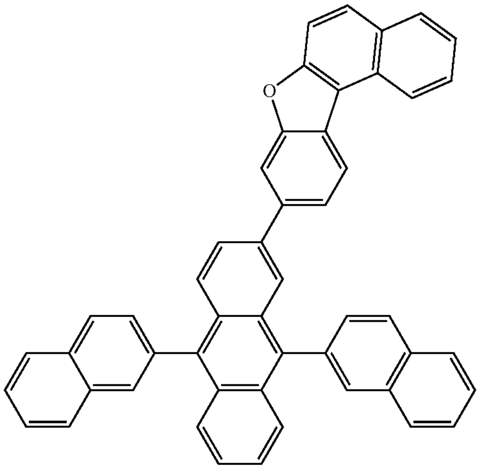
H118
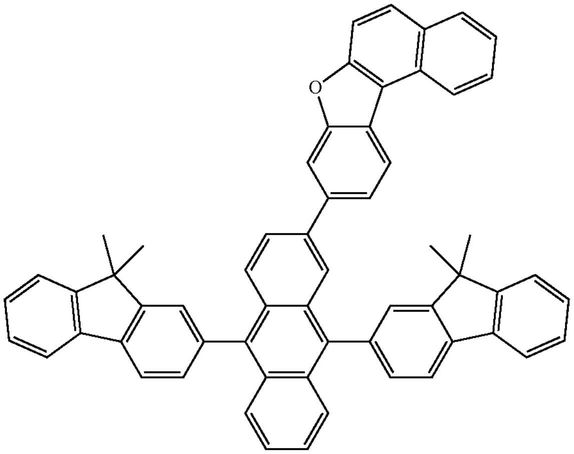
-continued
H119
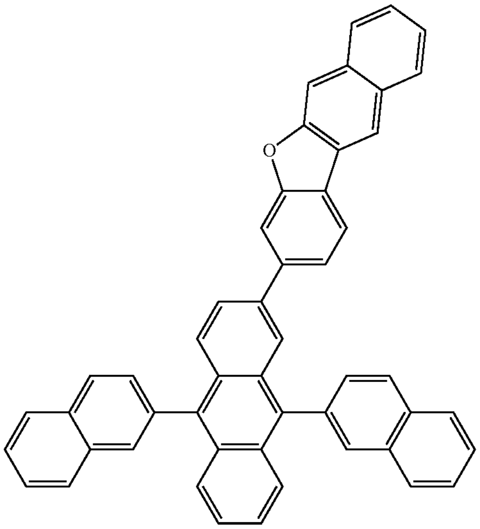
H120
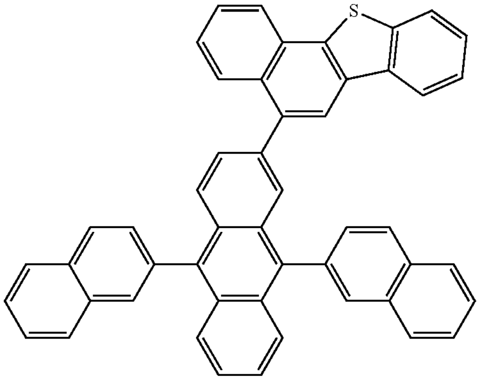
H121
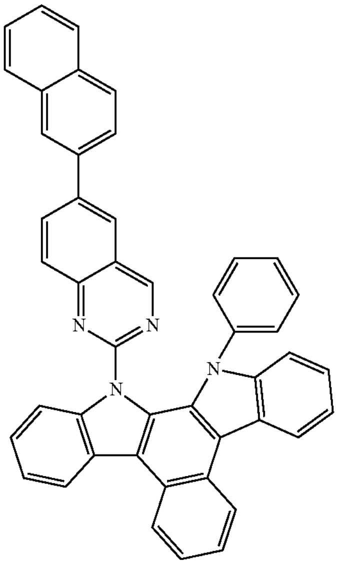

-continued

H122

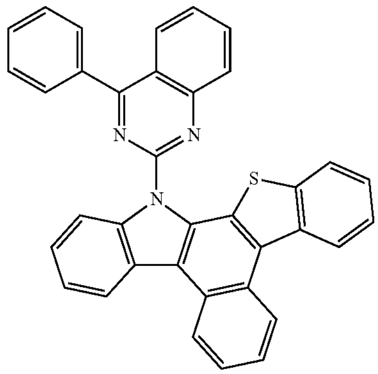

H123

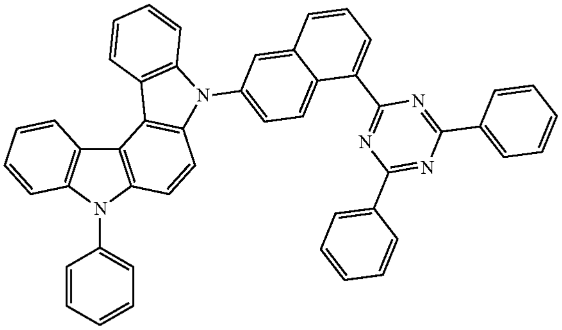

H124

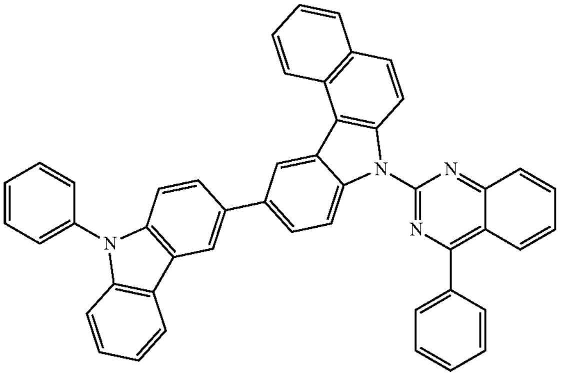

H125

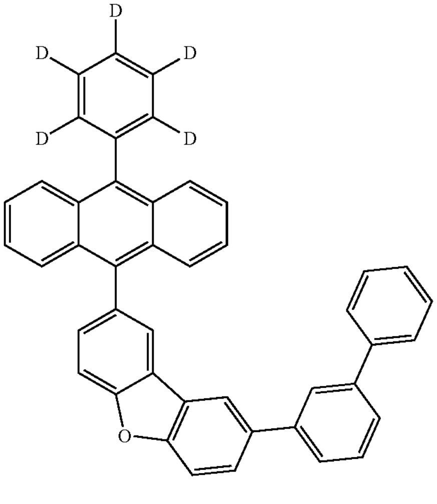

-continued

H126

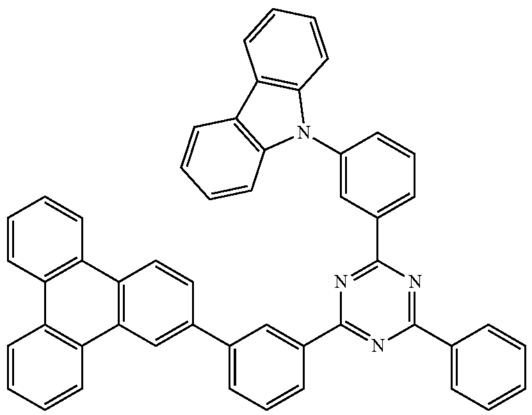

.

[Phosphorescent Dopant]

The phosphorescent dopant may include at least one transition metal as a central metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

For example, the phosphorescent dopant may include an organometallic compound represented by Formula 401:

[Formula 401]

$$M(L_{401})_{xc1}(L_{402})_{xc2}$$

[Formula 402]

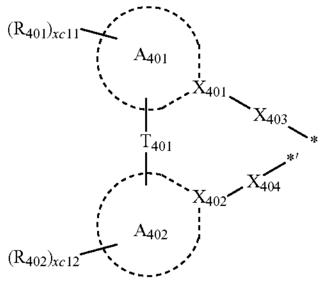

In Formulae 401 and 402,

M may be a transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein, in case that xc1 is 2 or more, two or more of $L_{401}$(s) may be identical to or different from each other, $L_{402}$ may be an organic ligand, and xc2 may be 0, 1, 2, 3, or 4, wherein, in case that xc2 is 2 or more, two or more of $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—S—*', *—C(=O)—*', *—N($Q_{411}$)—*', *—C($Q_{411}$)($Q_{412}$)—*', *—C($Q_{411}$)=C($Q_{412}$)—', *—C($Q_{411}$)=*', or *=C($Q_{411}$)=*', $X_{403}$ and $X_{404}$ may each independently be a chemical bond (for example, a covalent bond or a coordinate bond), O, S, $N(Q_{413})$, $B(Q_{413})$, $P(Q_{413})$, $C(Q_{413})(Q_{414})$, or $Si(Q_{413})(Q_{414})$, $Q_{411}$ to $Q_{414}$ may each independently be the same as described in connection with $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, $—Si(Q_{401})(Q_{402})(Q_{403})$, $—N(Q_{401})(Q_{402})$, $—B(Q_{401})(Q_{402})$, $—C(=O)(Q_{401})$, $—S(=O)_2(Q_{401})$, or $—P(=O)(Q_{401})(Q_{402})$, $Q_{401}$ to $Q_{403}$ may each independently be the same as described in connection with $Q_1$, xc11 and xc12 may each independently be an integer from 0 to 10, and

* and *' in Formula 402 each indicate a binding site to M in Formula 401.

For example, in Formula 402, $X_{401}$ may be nitrogen, and $X_{402}$ may be carbon, or each of $X_{401}$ and $X_{402}$ may be nitrogen.

In embodiments, in case that xc1 in Formula 401 is 2 or more, two ring $A_{401}$(s) in two or more of $L_{401}$(s) may optionally be linked to each other via $T_{402}$, which may be a linking group, and two ring $A_{402}$(s) may be optionally linked to each other via $T_{403}$, which may be a linking group (see Compounds PD1 to PD4 and PD7). $T_{402}$ and $T_{403}$ may each independently be the same as described in connection with $T_{401}$.

$L_{402}$ in Formula 401 may be an organic ligand. For example, $L_{402}$ may include a halogen group, a diketone group (for example, an acetylacetonate group), a carboxylic acid group (for example, a picolinate group), —C(═O), an isonitrile group, a —CN group, a phosphorus group (for example, a phosphine group, a phosphite group, etc.), or any combination thereof.

The phosphorescent dopant may include, for example, one of compounds PD1 to PD39, or any combination thereof:

PD1

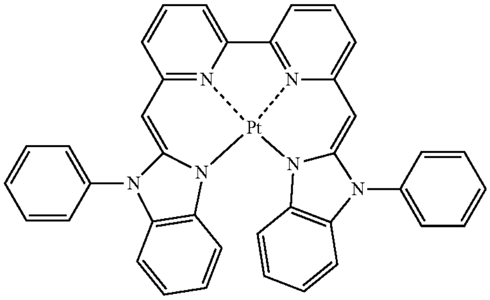

-continued

PD2

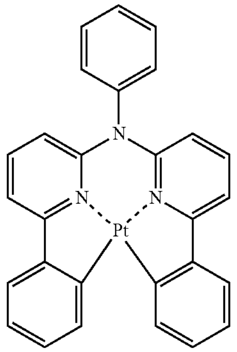

PD3

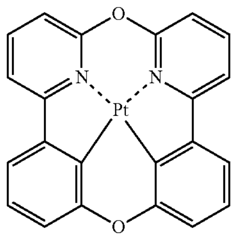

PD4

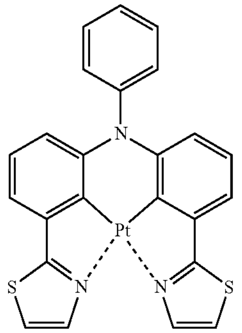

PD5

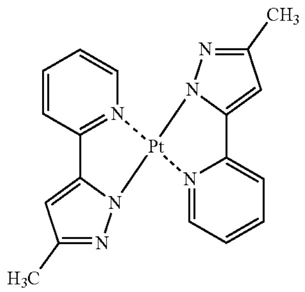

PD6

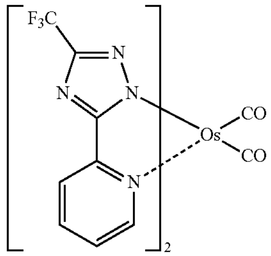

-continued
PD7
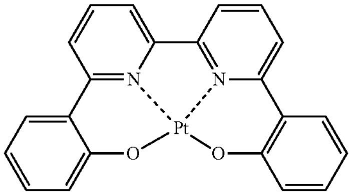
PD8
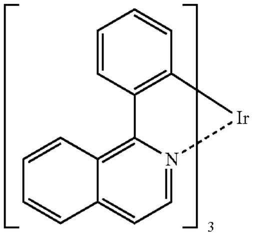
PD9
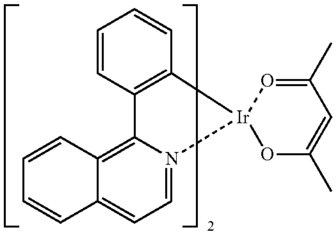
PD10
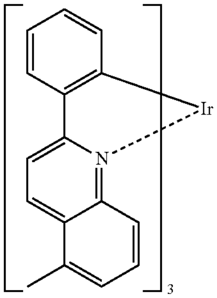
PD11
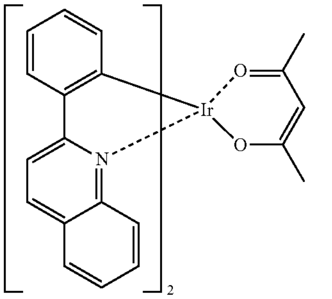
-continued
PD12
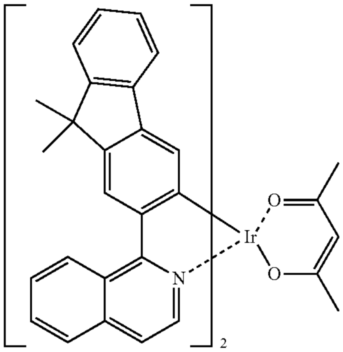
PD13
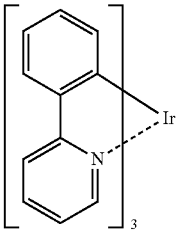
PD14
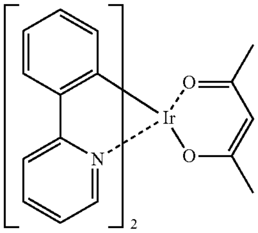
PD15
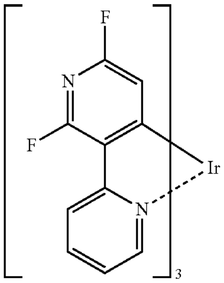
PD16
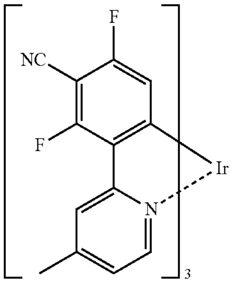

-continued
PD17
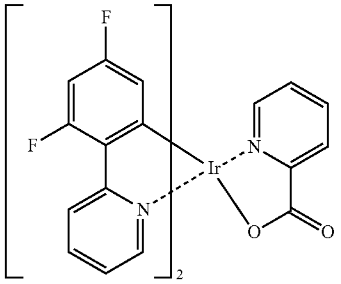
PD18
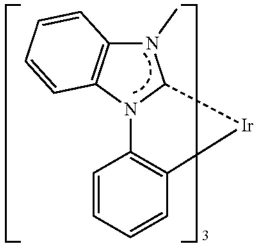
PD19
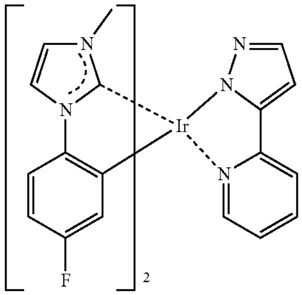
PD20
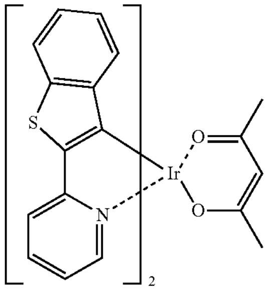
PD21
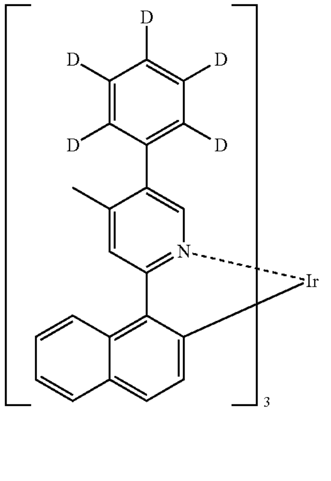
-continued
PD22
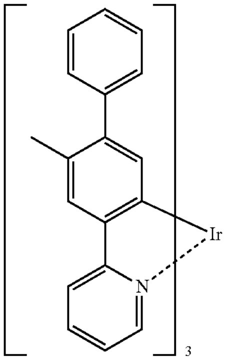
PD23
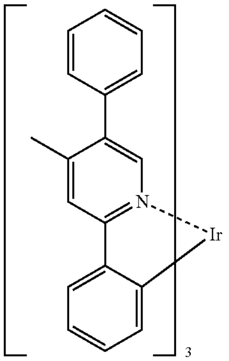
PD24
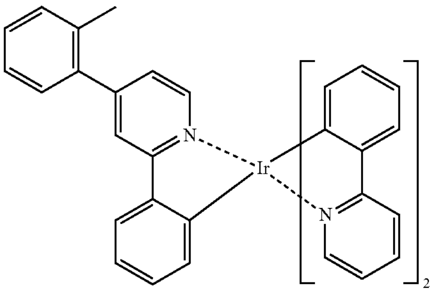
PD25
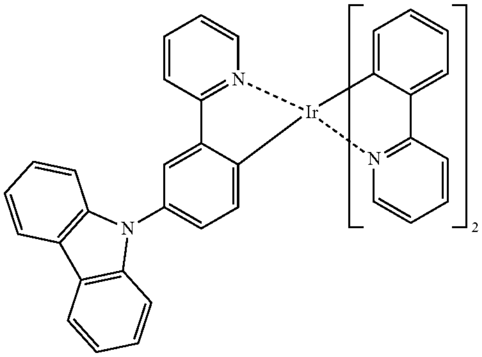

-continued
PD26
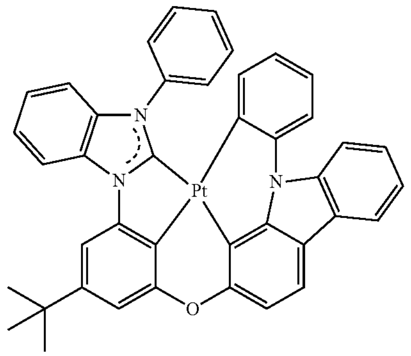
PD27
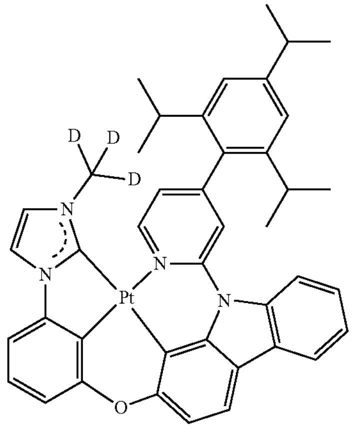
PD28
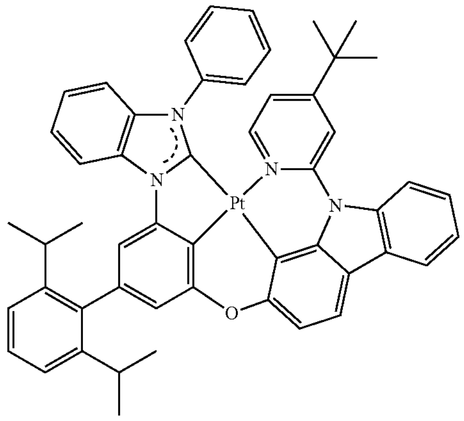
PD29
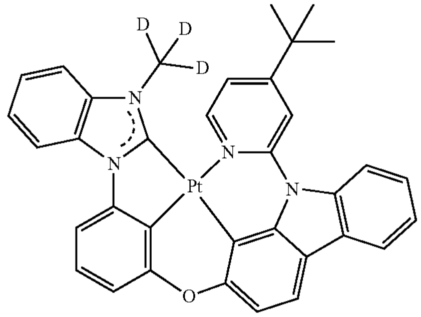
-continued
PD30
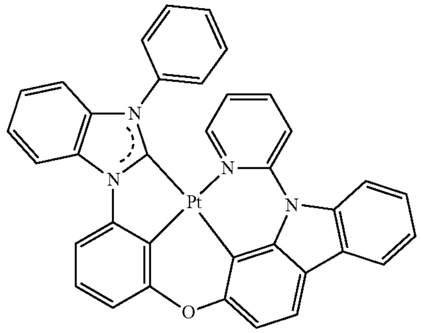
PD31
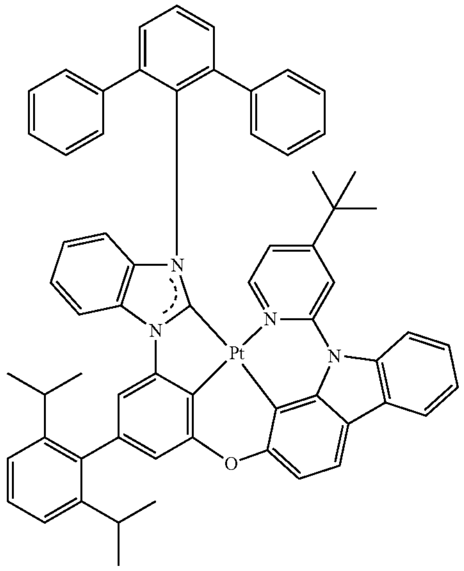
PD32
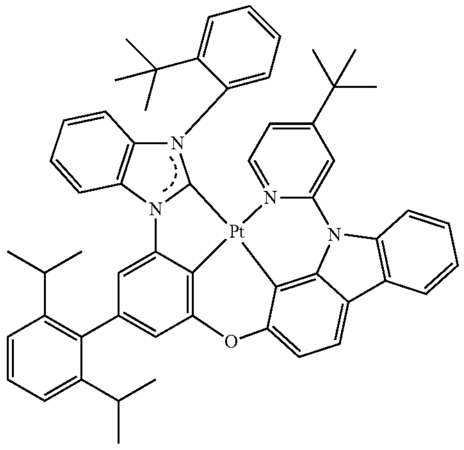

-continued
PD33
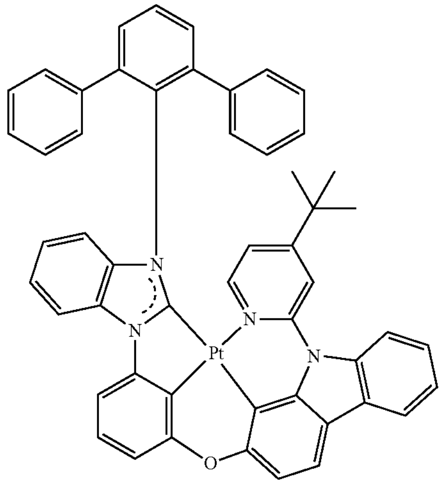
PD34
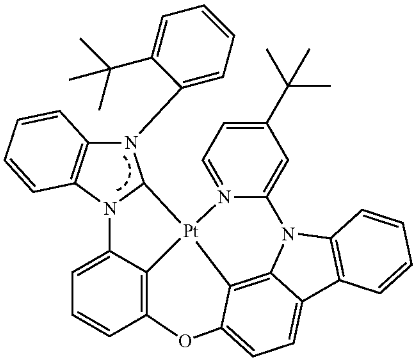
PD35
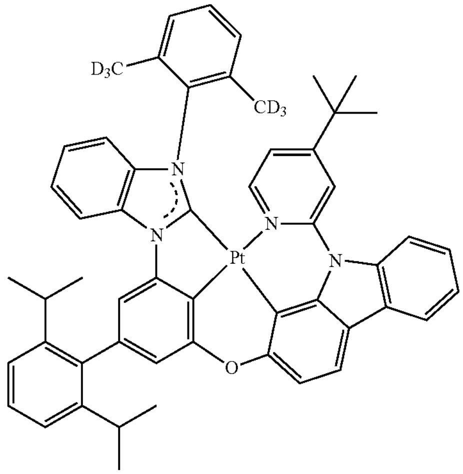
-continued
PD36
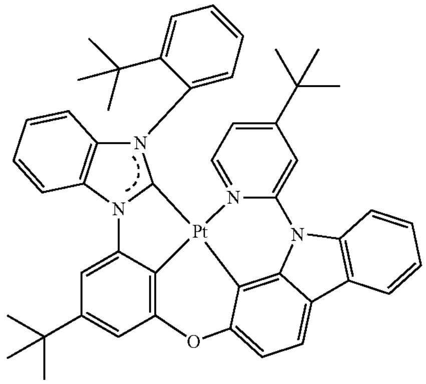
PD37
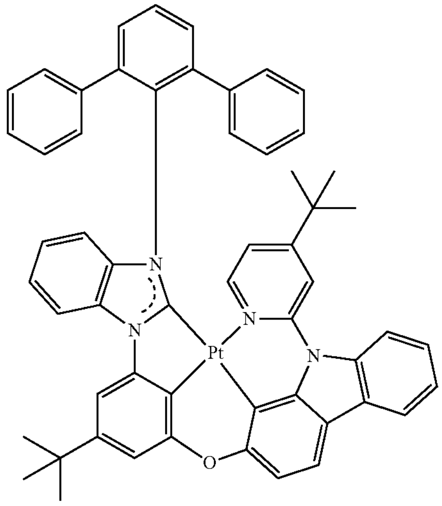
PD38
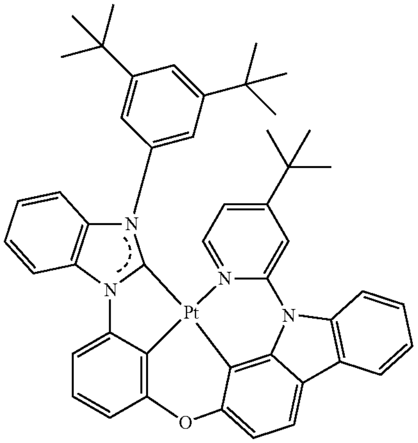

-continued

PD39

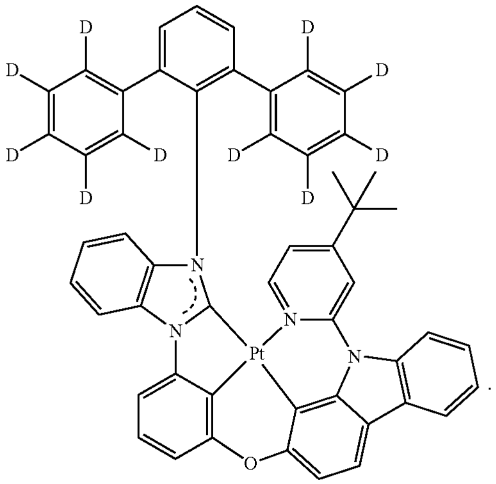

[Fluorescent Dopant]

The fluorescent dopant may include an amine group-containing compound, a styryl group-containing compound, or any combination thereof.

For example, the fluorescent dopant may include a compound represented by Formula 501:

[Formula 501]

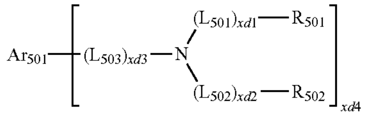

In Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

For example, $Ar_{501}$ in Formula 501 may be a condensed cyclic group (for example, an anthracene group, a chrysene group, a pyrene group, etc.) in which three or more monocyclic groups are condensed together.

In embodiments, xd4 in Formula 501 may be 2.

For example, the fluorescent dopant may include: one of Compounds FD1 to FD36, DPVBi, DPAVBi, or any combination thereof:

FD1

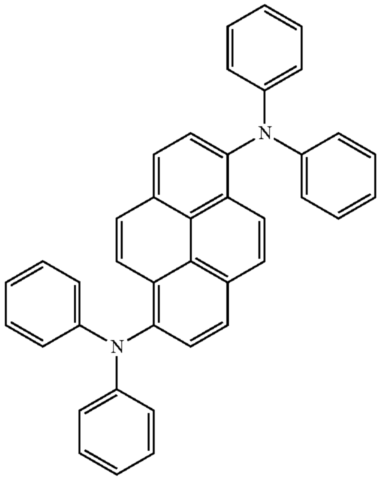

FD2

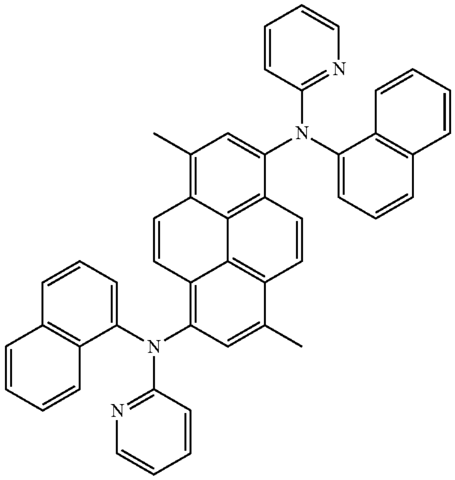

-continued
FD3
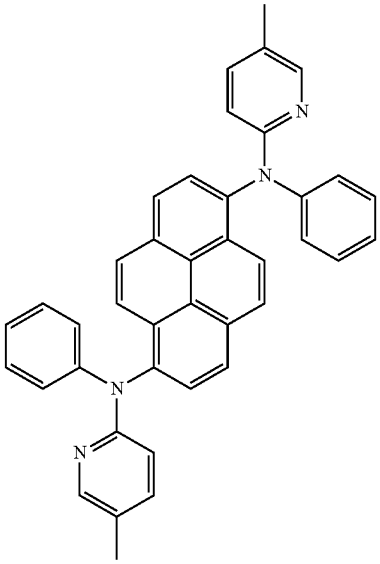
FD4
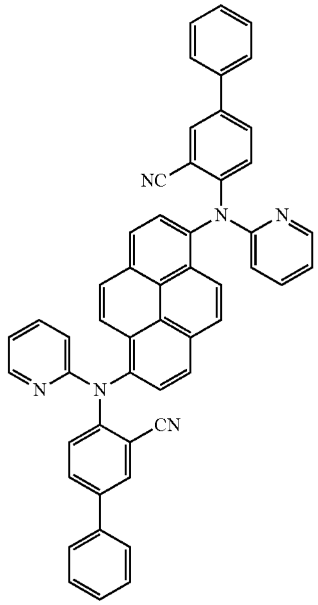
FD5
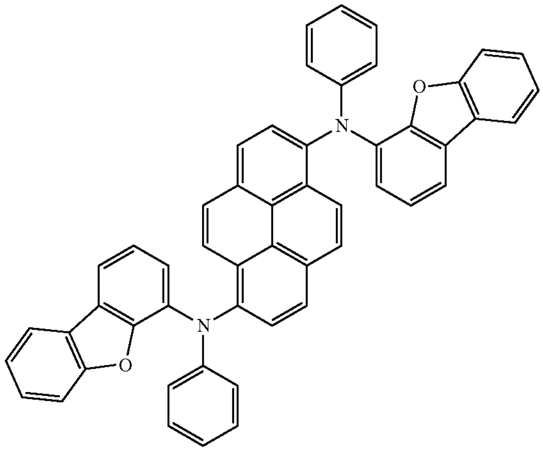
FD6
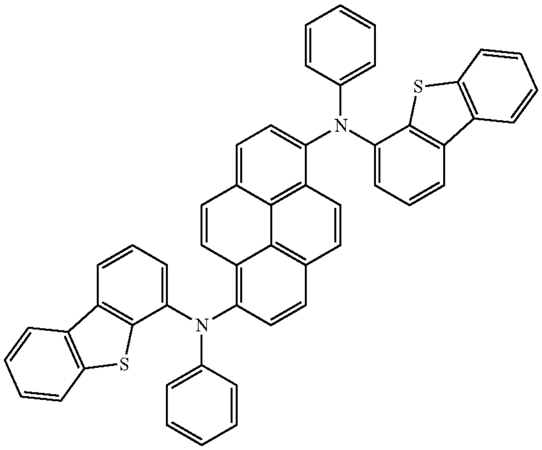
FD7
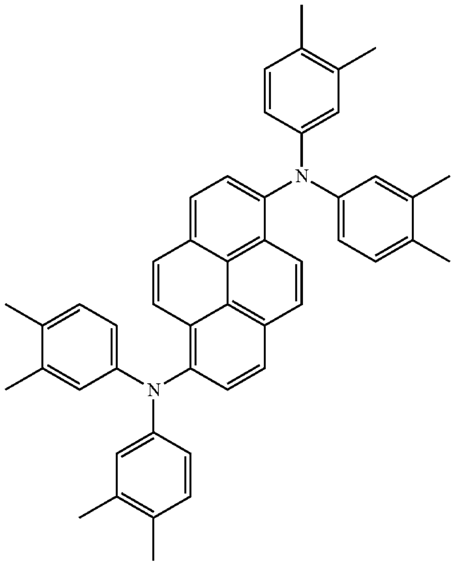
FD8
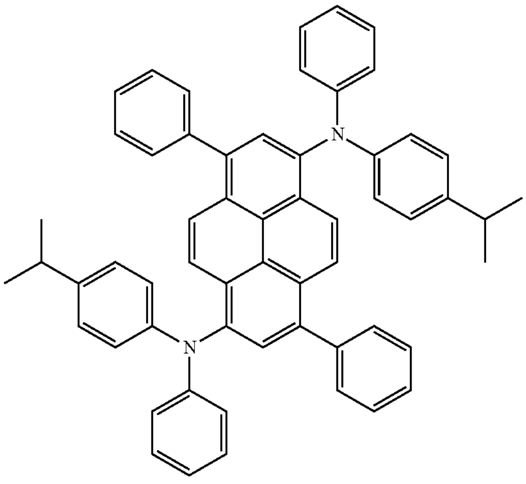

-continued
FD9
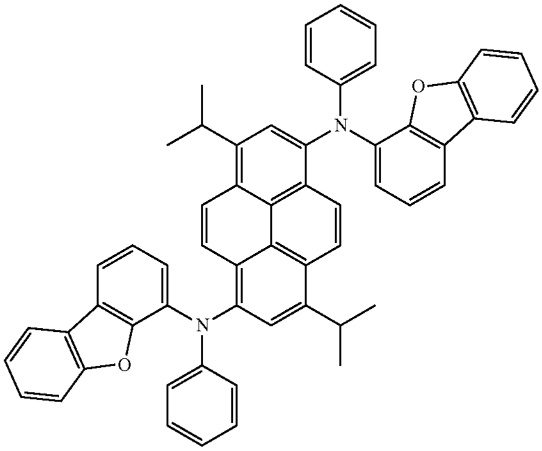
FD10
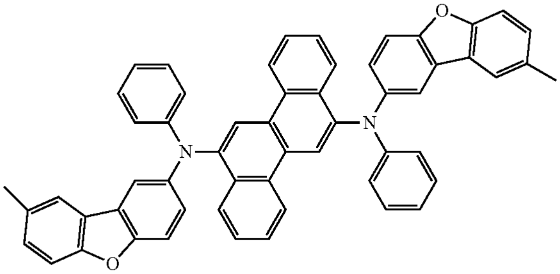
FD11
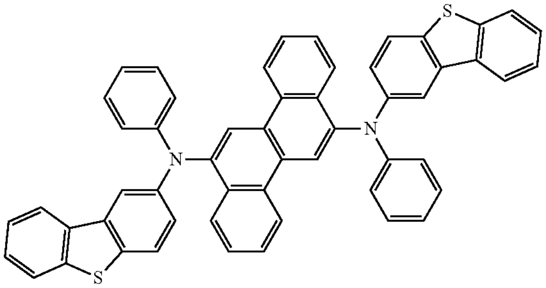
FD12
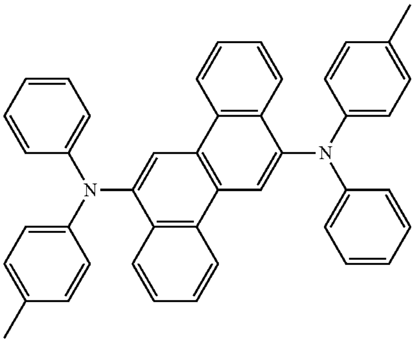
FD13
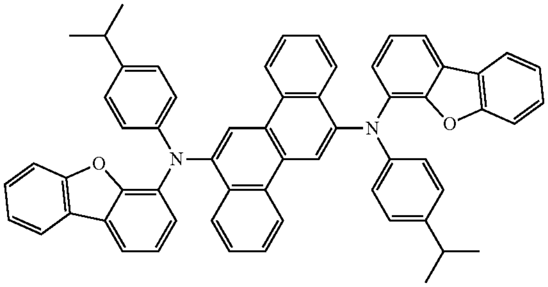
FD14
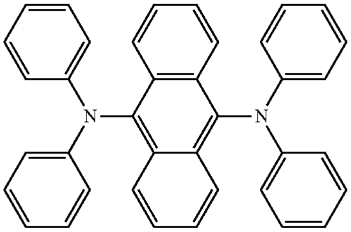
FD15
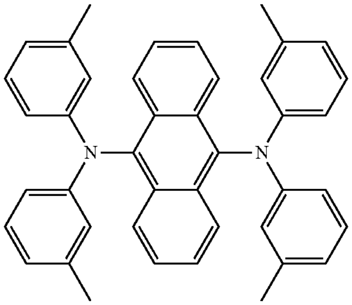
FD16
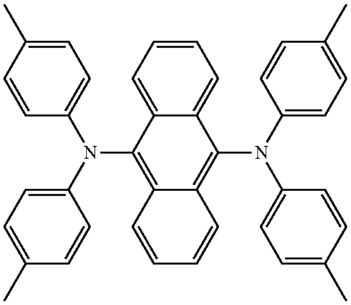

-continued
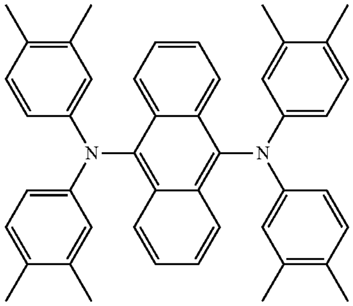
FD17
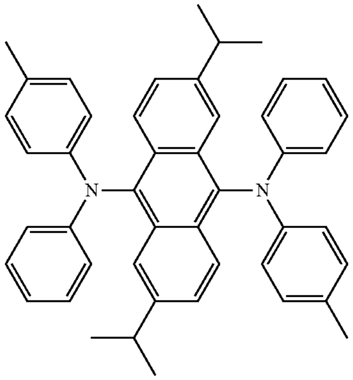
FD18
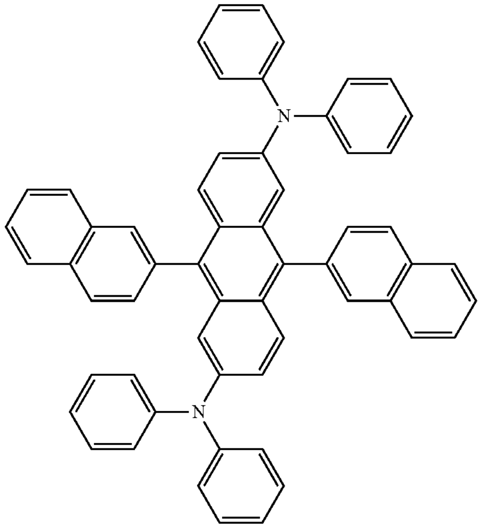
FD19
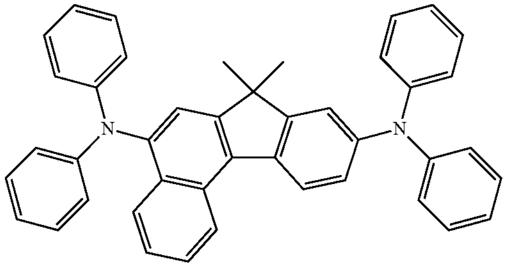
FD20
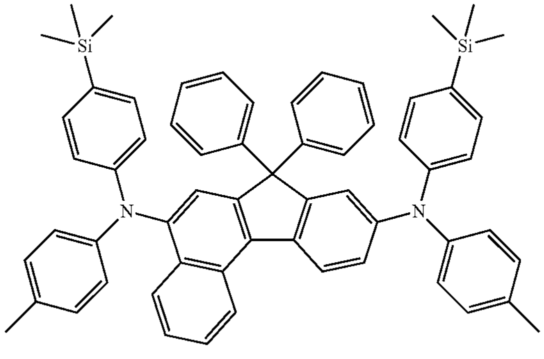
FD21
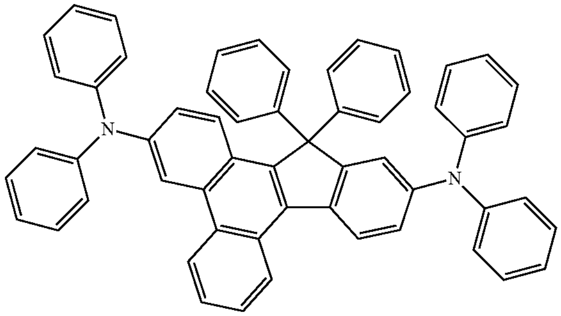
FD22

-continued
FD23
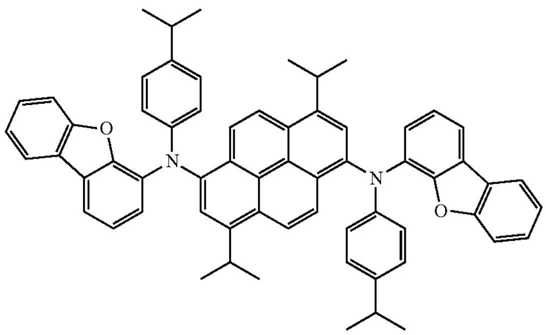
FD24
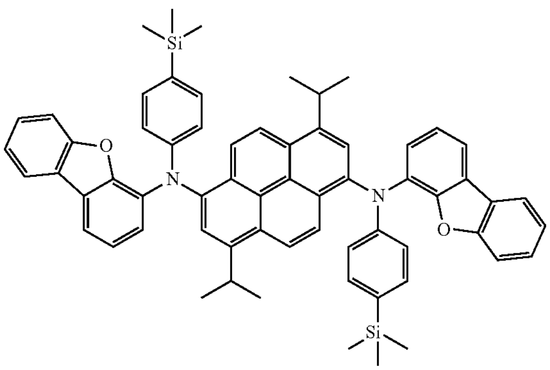
FD25
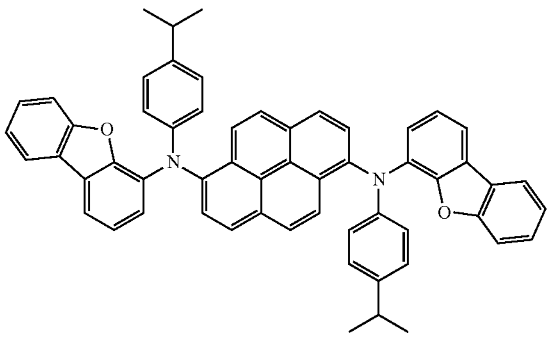
FD26
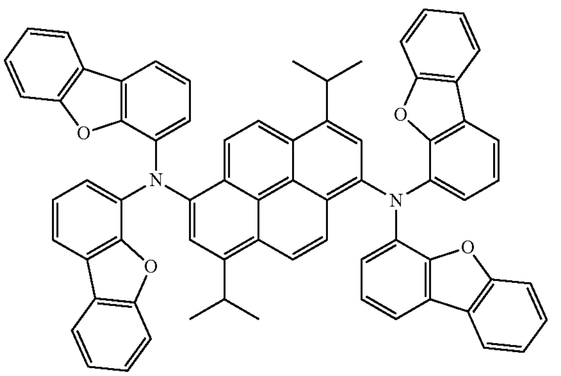
FD27
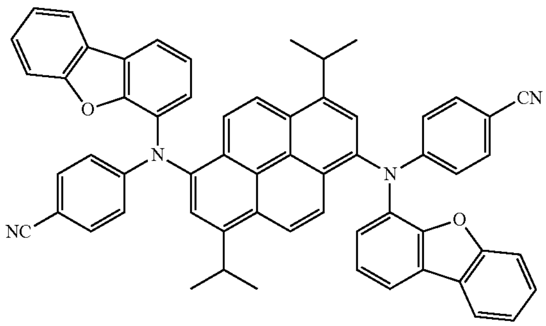
FD28
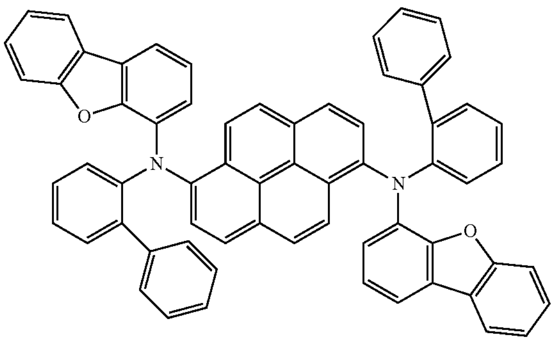
FD29
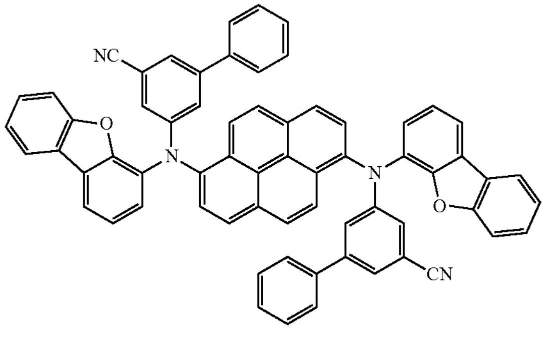
FD30
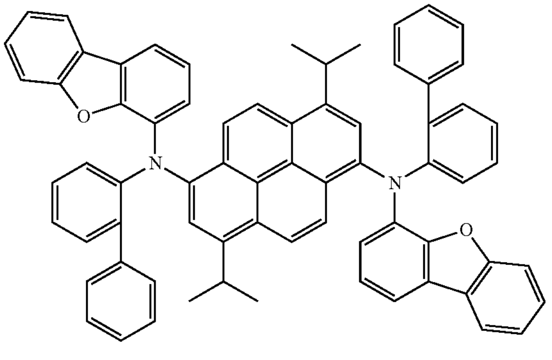

-continued
FD31
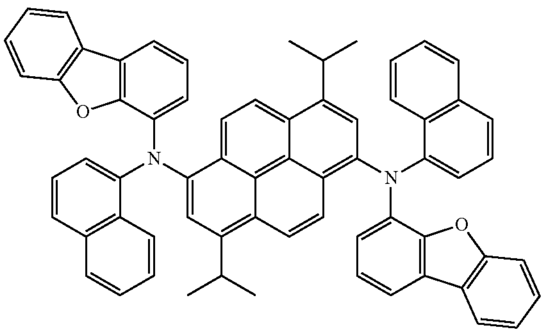
FD32
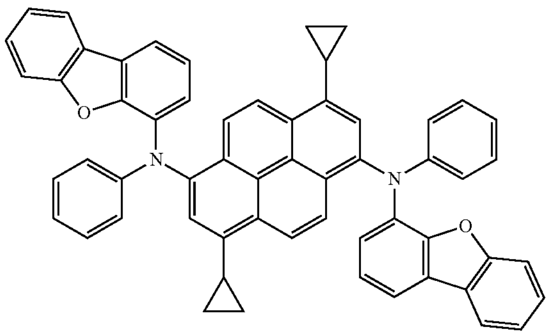
FD33
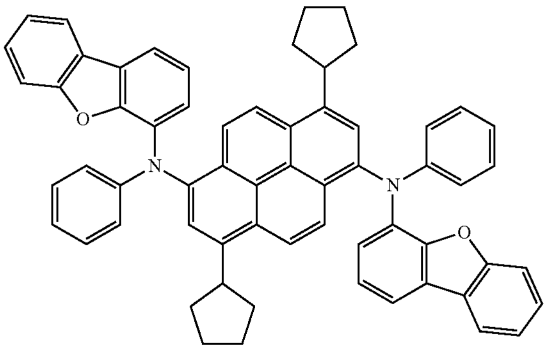
FD34
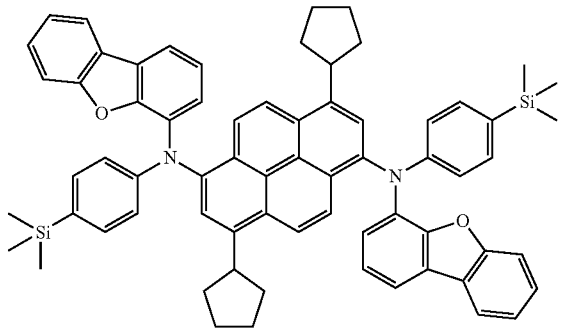
FD35
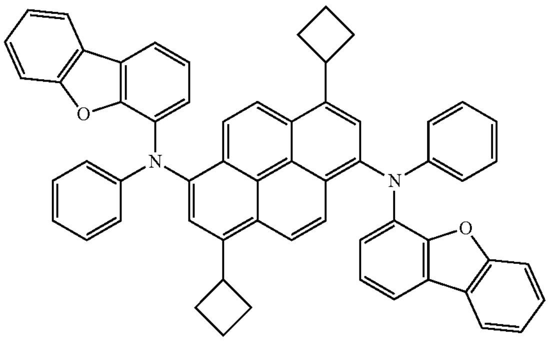
FD36
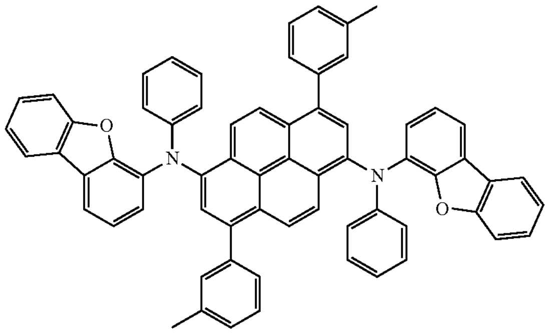
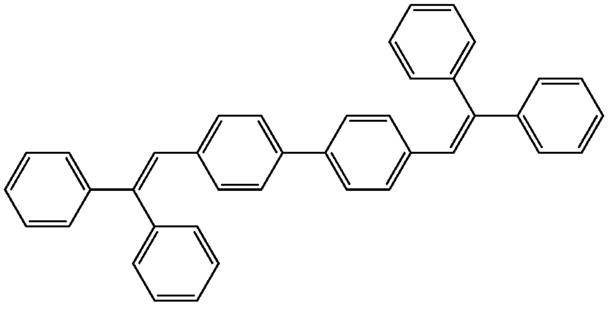
DPVBi -continued

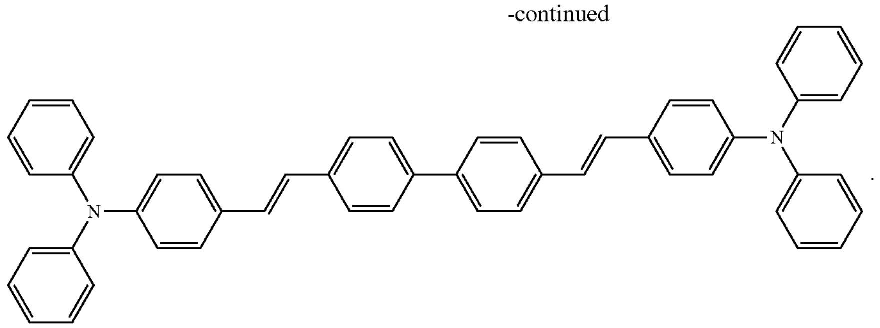

DPAVBi

[Delayed Fluorescence Material]

The emission layer may include a delayed fluorescence material.

In the specification, the delayed fluorescence material may be selected from compounds capable of emitting delayed fluorescent light based on a delayed fluorescence emission mechanism.

The delayed fluorescence material included in the emission layer may serve as a host or as a dopant, depending on the type of other materials included in the emission layer.

In an embodiment, a difference between a triplet energy level (eV) of the delayed fluorescence material and a singlet energy level (eV) of the delayed fluorescence material may be equal to or greater than about 0 eV and equal to or less than about 0.5 eV. In case that the difference between the triplet energy level (eV) of the delayed fluorescence material and the singlet energy level (eV) of the delayed fluorescence material satisfies the above-described range, up-conversion from the triplet state to the singlet state of the delayed fluorescence materials may effectively occur, and thus, the luminescence efficiency of the light-emitting device 10 may be improved.

For example, the delayed fluorescence material may include a material including at least one electron donor (for example, a π electron-rich $C_3$-$C_{60}$ cyclic group, such as a carbazole group) and at least one electron acceptor (for example, a sulfoxide group, a cyano group, or a π electron-deficient nitrogen-containing $C_1$-$C_{60}$ cyclic group), and a material including a $C_8$-$C_{60}$ polycyclic group in which two or more cyclic groups are condensed while sharing boron (B).

In an embodiment, the delayed fluorescence material may be represented by Formula 200:

[Formula 200]

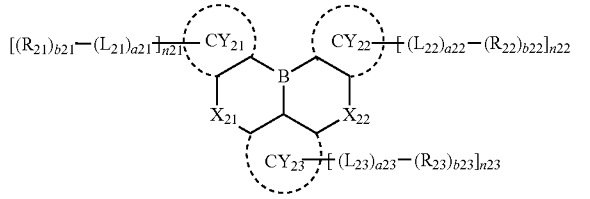

In Formula 200, $X_{21}$ may be $C(R_{24})(R_{25})$, $N(R_{24})$, O, or S, $X_{22}$ may be $C(R_{26})(R_{27})$, $N(R_{26})$, O, or S, $CY_{21}$ to $CY_{23}$ and $L_{21}$ to $L_{23}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, a21 to a23 may each independently be an integer from 0 to 5, $R_{21}$ to $R_{27}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, or $—P(=O)(Q_1)(Q_2)$, b21 to b23 may each independently be an integer from 1 to 10, $R_{10a}$ may be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, $—Si(Q_{11})(Q_{12})(Q_{13})$, $—N(Q_{11})(Q_{12})$, $—B(Q_{11})(Q_{12})$, $—C(=O)(Q_{11})$, $—S(=O)_2(Q_{11})$, $—P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroarylalkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, $—Si(Q_{21})(Q_{22})(Q_{23})$, $—N(Q_{21})(Q_{22})$, $—B(Q_{21})(Q_{22})$, $—C(=O)(Q_{21})$, $—S(=O)_2(Q_{21})$, $—P(=O)(Q_{21})(Q_{22})$, or any combination thereof; or $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, or $—P(=O)(Q_{31})(Q_{32})$, and $Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof; a $C_7$-$C_{60}$ arylalkyl group; or a $C_2$-$C_{60}$ heteroarylalkyl group.

Examples of the delayed fluorescence material may include at least one of Compounds DF1 to DF10:

DF1

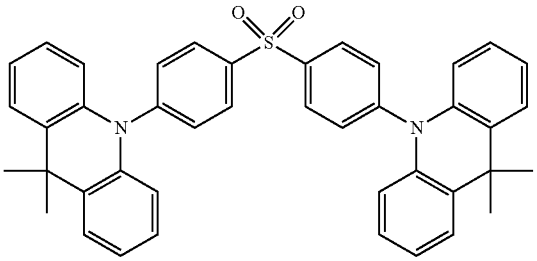

(DMAC-DPS)

DF2

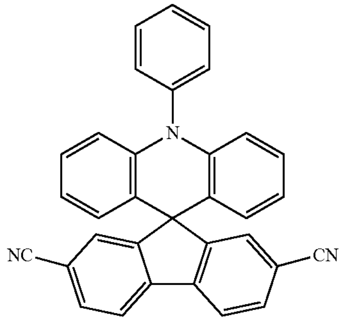

(ACRFLCN)

DF3

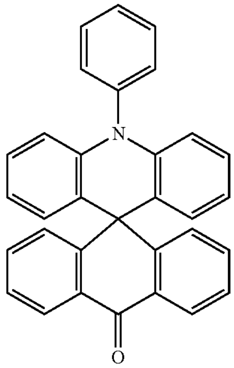

(ACRSA)

-continued

DF4

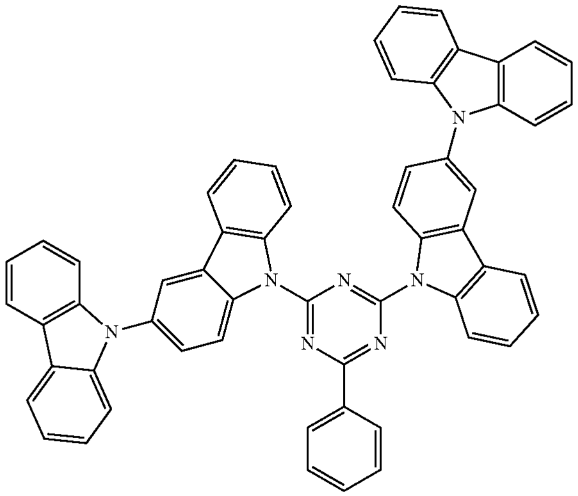

(CC2TA)

DF5

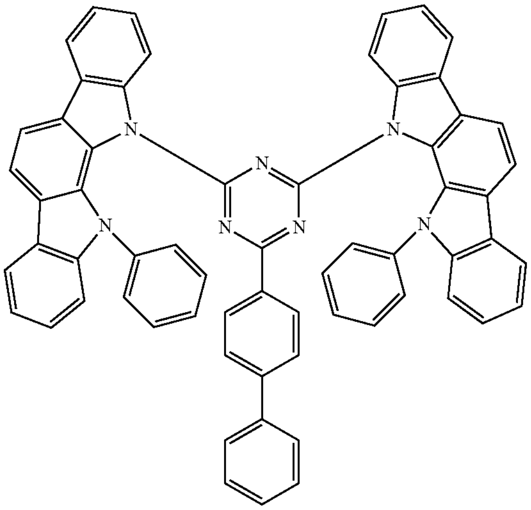

(PIC-TRZ)

DF6

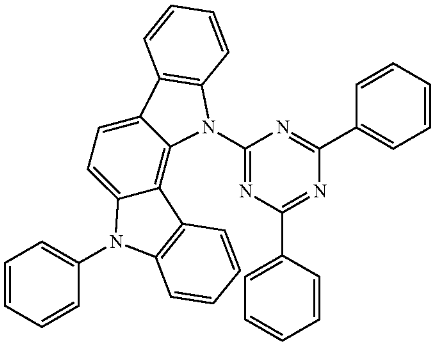

(PIC-TRZ2)

-continued

DF7

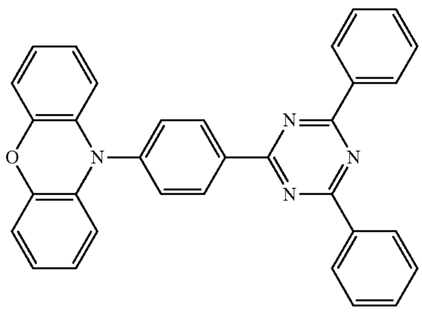

(PXZ-TRZ)

DF8

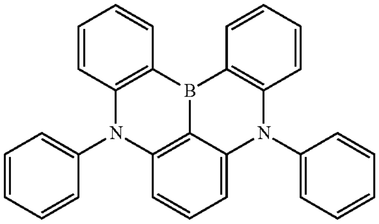

(DABNA-1)

DF9

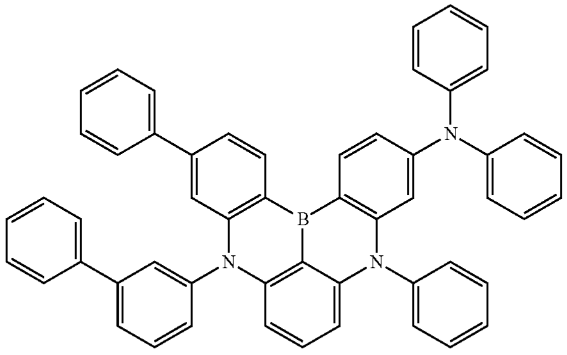

(DABNA-2)

DF10

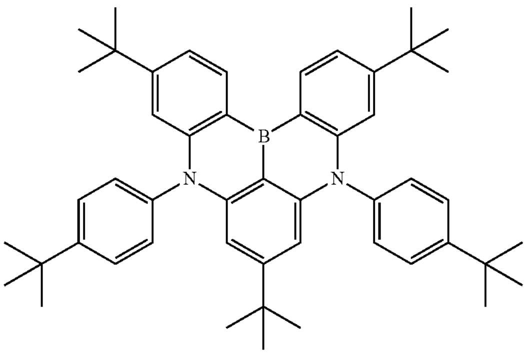

[Quantum Dot]

The emission layer may include a quantum dot.

In the specification, a quantum may be a crystal of a semiconductor compound, and may include any material capable of emitting light of various emission wavelengths according to a size of the crystal.

A diameter of the quantum dot may be, for example, in a range of about 1 nm to about 10 nm.

The quantum dot may be synthesized by a wet chemical process, a metal organic chemical vapor deposition process, a molecular beam epitaxy process, or any process similar thereto.

The wet chemical process is a method which may include mixing a precursor material with an organic solvent and growing a quantum dot particle crystal. In case that the crystal grows, the organic solvent naturally acts as a dispersant coordinated on the surface of the quantum dot crystal and controls the growth of the crystal so that the growth of quantum dot particles can be controlled through a process which costs lower, and may be more readily performed than vapor deposition methods, such as metal organic chemical vapor deposition (MOCVD) or molecular beam epitaxy (MBE), The quantum dot may include: a Group II-VI semiconductor compound; a Group III-V semiconductor compound; a Group III-VI semiconductor compound; a Group semiconductor compound; a Group IV-VI semiconductor compound; a Group IV element or compound; or any combination thereof.

Examples of the Group II-VI semiconductor compound may include: a binary compound, such as CdS, CdSe, CdTe, ZnS, ZnSe, ZnTe, ZnO, HgS, HgSe, HgTe, MgSe, or MgS; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS; a quaternary compound, such as CdZnSeS, CdZnSeTe, CdZnSTe, CdHgSeS, CdHgSeTe, CdHgSTe, HgZnSeS, HgZnSeTe, or HgZnSTe; or any combination thereof.

Examples of the Group III-V semiconductor compound may include: a binary compound, such as GaN, GaP, GaAs, GaSb, AlN, AlP, AlAs, AlSb, InN, InP, InAs, or InSb; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, or InPSb; a quaternary compound, such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, or InAlPSb; or any combination thereof. In an embodiment, the Group III-V semiconductor compound may further include a Group II element. Examples of the Group III-V semiconductor compound further including a Group II element may include InZnP, InGaZnP, and InAlZnP.

Examples of the Group III-VI semiconductor compound may include: a binary compound, such as GaS, GaSe, $Ga_2Se_3$, GaTe, InS, InSe, $In_2S_3$, $In_2Se_3$, or InTe; a ternary compound, such as $InGaS_3$ or $InGaSe_3$; or any combination thereof.

Examples of the Group semiconductor compound may include: a ternary compound, such as AgInS, $AgInS_2$, CuInS, $CuInS_2$, $CuGaO_2$, $AgGaO_2$, or $AgAlO_2$; or any combination thereof.

Examples of the Group IV-VI semiconductor compound may include: a binary compound, such as SnS, SnSe, SnTe, PbS, PbSe, or PbTe; a ternary compound, such as SnSeS, SnSeTe, SnSTe, PbSeS, PbSeTe, PbSTe, SnPbS, SnPbSe, or SnPbTe; a quaternary compound, such as SnPbSSe, SnPbSeTe, or SnPbSTe; or any combination thereof.

Examples of the Group IV element or compound may include: a single element material, such as Si or Ge; a binary compound, such as SiC or SiGe; or any combination thereof.

Each element included in a multi-element compound, such as a binary compound, a ternary compound, or a quaternary compound, may be present in a particle at a uniform concentration or at a non-uniform concentration.

In an embodiment, the quantum dot may have a single structure in which the concentration of each element in the quantum dot may be uniform, or the quantum dot may have a core-shell structure. For example, in case that the quantum dot has a core-shell structure, a material included in the core and a material included in the shell may be different from each other.

The shell of the quantum dot may serve as a protective layer that prevents chemical degeneration of the core to maintain semiconductor characteristics, and/or as a charging layer that imparts electrophoretic characteristics to the quantum dot. The shell may be a single layer or a multi-layer. An interface between the core and the shell may have a concentration gradient in which the concentration of a material that is present in the shell decreases toward the center of the core.

Examples of the shell of the quantum dot may include a metal oxide, a metalloid oxide, or a non-metal oxide, a semiconductor compound, or any combination thereof. Examples of the metal oxide, the metalloid oxide, or the non-metal oxide may include: a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO; a ternary compound, such as $MgAl_2O_4$, $CoFe_2O_4$, $NiFe_2O_4$, or $CoMn_2O_4$; or any combination thereof. Examples of the semiconductor compound may include, as described herein, a Group II-VI semiconductor compound; a Group III-V semiconductor compound; a Group III-VI semiconductor compound; a Group I-III-VI semiconductor compound; a Group IV-VI semiconductor compound; or any combination thereof. For example, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

A full width at half maximum (FWHM) of an emission wavelength spectrum of the quantum dot may be equal to or less than about 45 nm. For example, a FWHM of an emission wavelength spectrum of the quantum dot may be equal to or less than about 40 nm. For example, a FWHM of an emission wavelength spectrum of the quantum dot may be equal to or less than about 30 nm. Within these ranges, color purity or color reproducibility may be improved. Light emitted through the quantum dot may be emitted in all directions, so that a viewing angle of light may be improved.

The quantum dot may be in the form of spherical, pyramidal, multi-arm, or cubic nanoparticles, nanotubes, nanowires, nanofibers, or nanoplate particles.

Since the energy band gap may be adjusted by controlling the size of the quantum dot, light having various wavelength bands may be obtained from the emission layer including the quantum dot. Accordingly, by using quantum dots of different sizes, a light-emitting device that emits light of various wavelengths may be implemented. In an embodiment, the size of the quantum dot may be selected to emit red, green and/or blue light. The size of the quantum dot may be configured to emit white light by combination of light of various colors.

[Electron Transport Region in Interlayer 130]

The electron transport region may have a structure consisting of a layer consisting of a single material, a structure consisting of a layer consisting of different materials, or a structure including multiple layers including different materials.

The electron transport region may include a buffer layer, a hole blocking layer, an electron control layer, an electron transport layer, an electron injection layer, or any combination thereof.

For example, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein the layers of each structure may be stacked from the emission layer in its respective stated order, but the structure of the electron transport region is not limited thereto.

The electron transport region (for example, the buffer layer, the hole blocking layer, the electron control layer, or the electron transport layer in the electron transport region) may include a metal-free compound including at least one π electron-deficient nitrogen-containing $C_1$-$C_{60}$ cyclic group.

For example, the electron transport region may include a compound represented by Formula 601:

$$[Ar_{601}]_{xe11}-[(L_{601})_{xe1}-R_{601}]_{xe21} \quad (601)$$

In Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, $-Si(Q_{601})(Q_{602})(Q_{603})$, $-C(=O)(Q_{601})$, $-S(=O)_2(Q_{601})$, or $-P(=O)(Q_{601})(Q_{602})$, $Q_{601}$ to $Q_{603}$ may each independently be the same as described in connection with $Q_1$, xe21 may be 1, 2, 3, 4, or 5, and at least one of $Ar_{601}$, $L_{601}$, and $R_{601}$ may each independently be a π electron-deficient nitrogen-containing $C_1$-$C_{60}$ cyclic group unsubstituted or substituted with at least one $R_{10a}$.

For example, in case that xe11 in Formula 601 is 2 or more, two or more of $Ar_{601}$(s) may be linked to each other via a single bond.

In embodiments, $Ar_{601}$ in Formula 601 may be a substituted or unsubstituted anthracene group.

In embodiments, the electron transport region may include a compound represented by Formula 601-1:

[Formula 601-1]

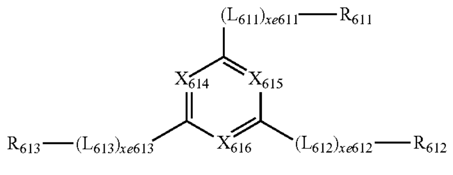

In Formula 601-1, $X_{614}$ may be N or $C(R_{614})$, $X_{615}$ may be N or $C(R_{615})$, $X_{616}$ may be N or $C(R_{616})$, and at least one of $X_{614}$ to $X_{616}$ may be N, $L_{611}$ to $L_{613}$ may each independently be the same as described in connection with $L_{601}$, xe611 to xe613 may each independently be the same as described in connection with xe1, $R_{611}$ to $R_{613}$ may each independently be the same as described in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

For example, xe1 and xe611 to xe613 in Formulae 601 and 601-1 may each independently be 0, 1, or 2.

The electron transport region may include one of Compounds ET1 to ET45, 2,9-dimethyl-4,7-diphenyl-1,10-phenanthroline (BCP), 4,7-diphenyl-1,10-phenanthroline (Bphen), $Alq_3$, BAlq, TAZ, NTAZ, TPM-TAZ, T2T, or any combination thereof:

ET1

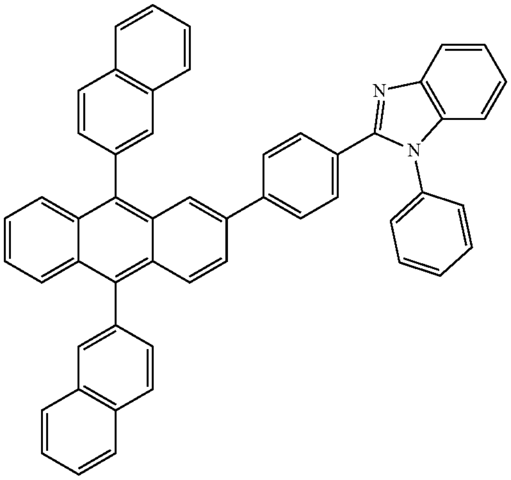

ET2

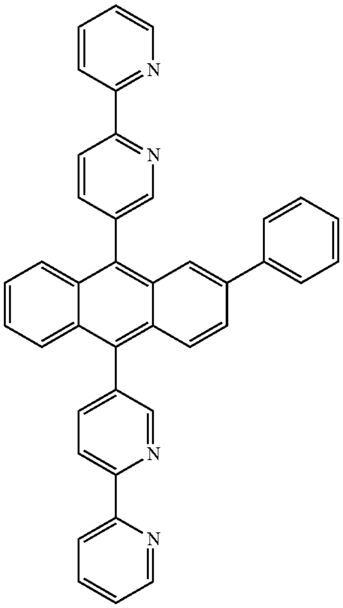

-continued

ET3

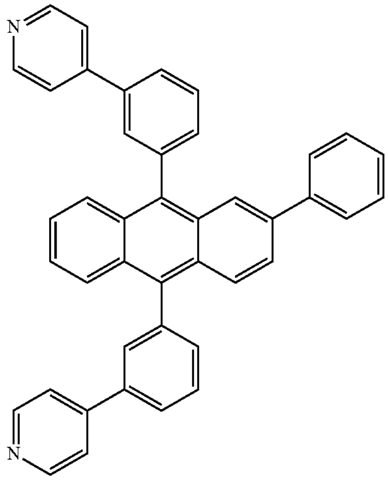

ET4

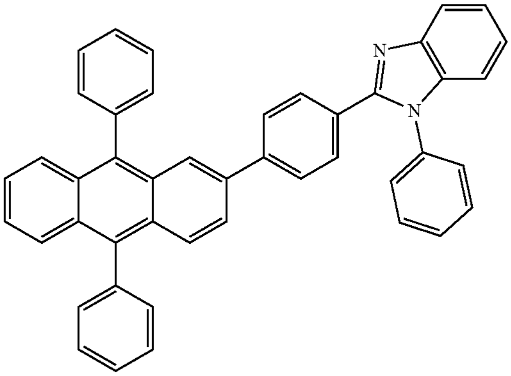

ET5

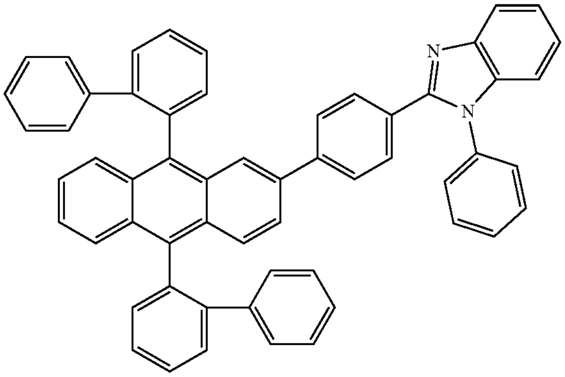

-continued
ET6
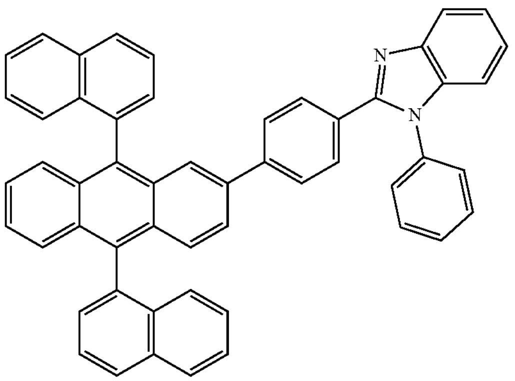
ET7
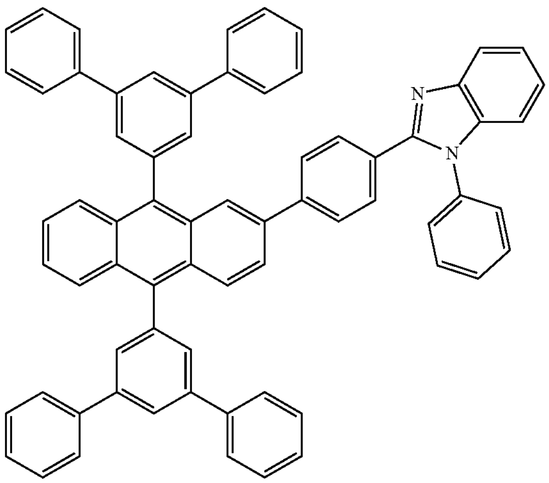
ET8
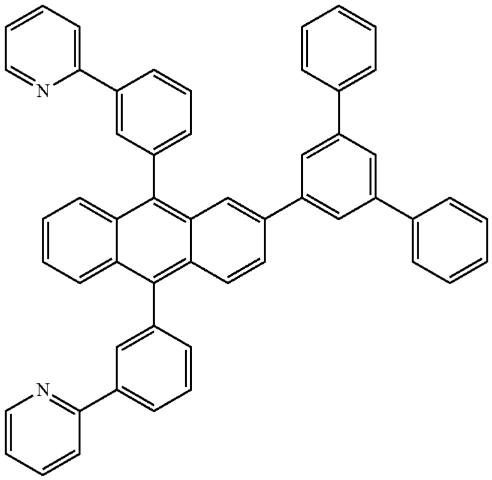
-continued
ET9
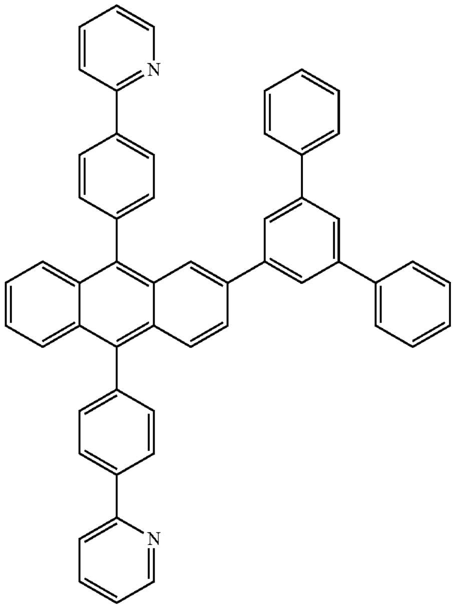
ET10
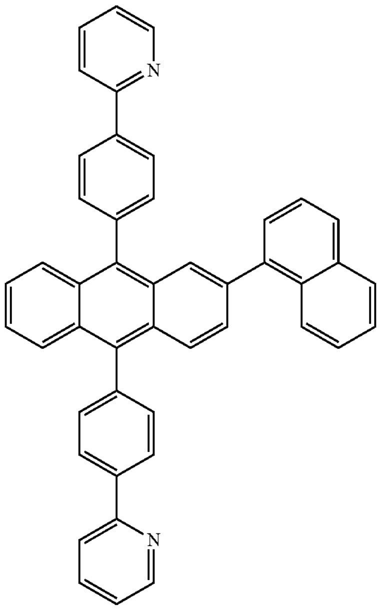

-continued
ET11
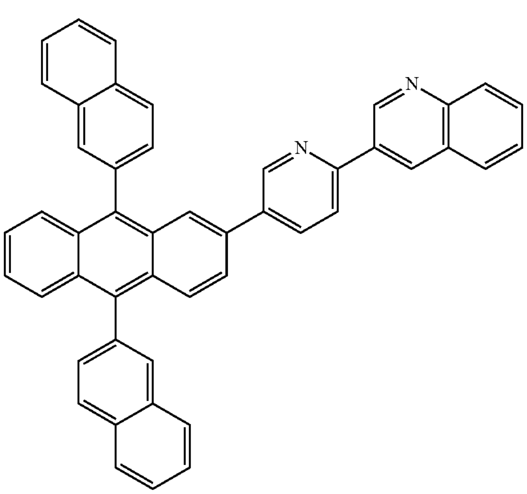
ET12
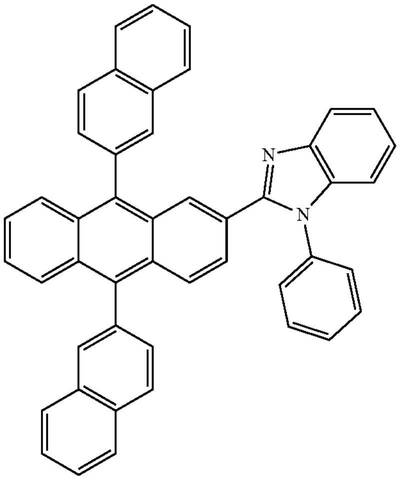
ET13
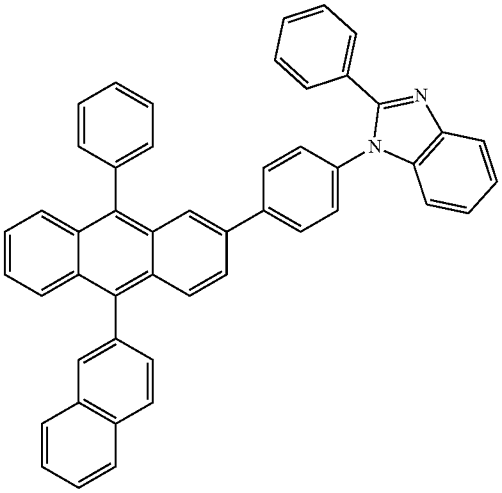
-continued
ET14
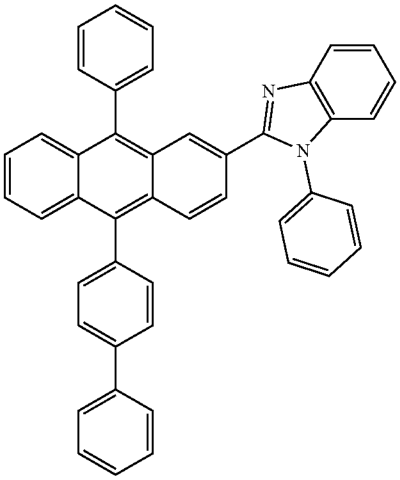
ET15
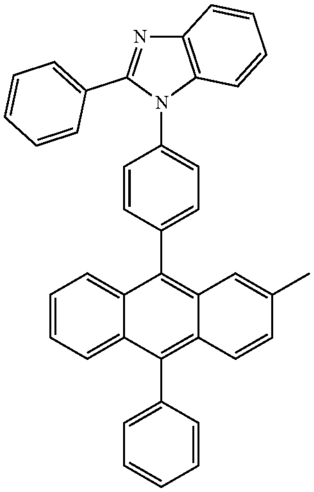
ET16
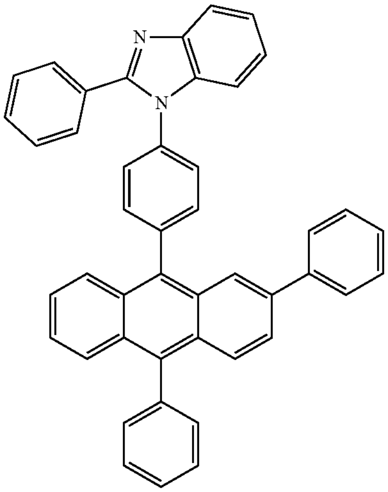

-continued
ET17
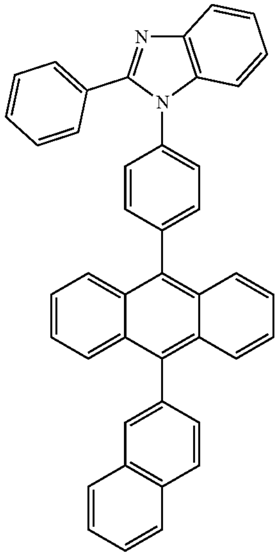
ET18
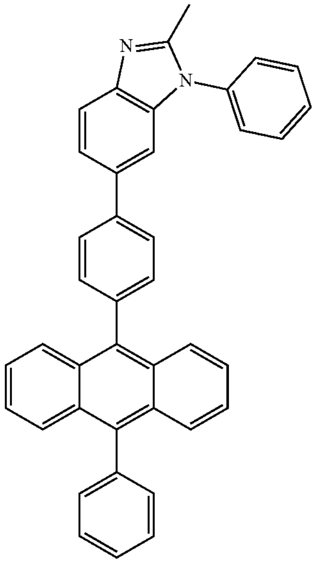
ET19
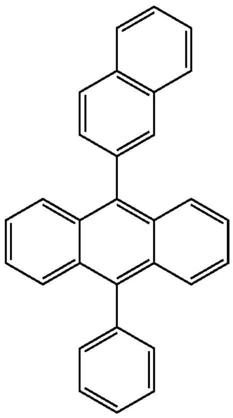
-continued
ET20
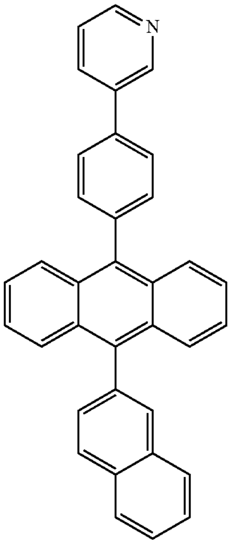
ET21
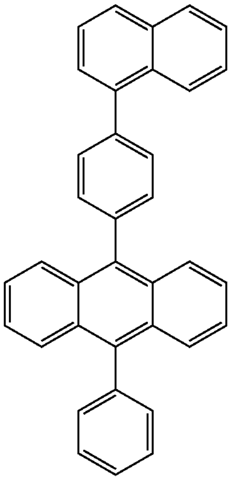
ET22
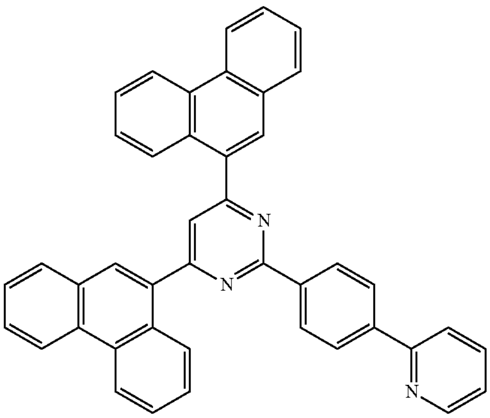

-continued
ET23
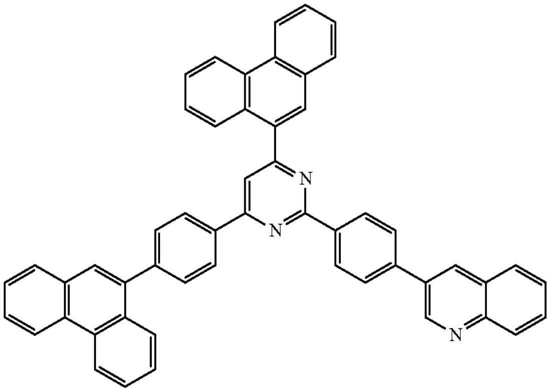
ET24
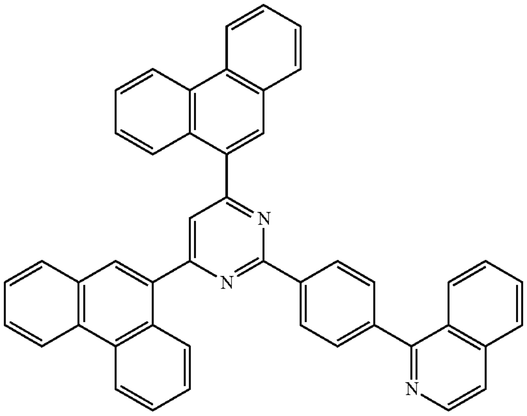
ET25
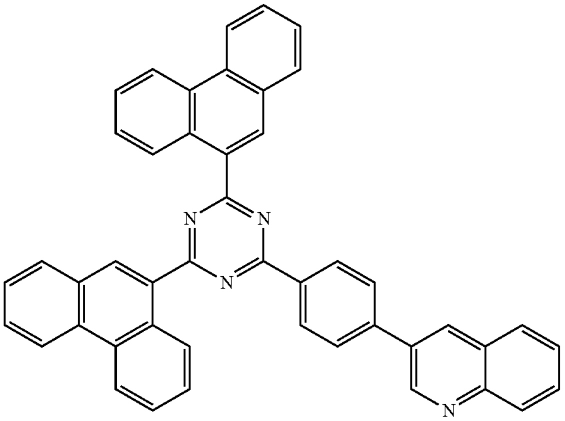
-continued
ET26
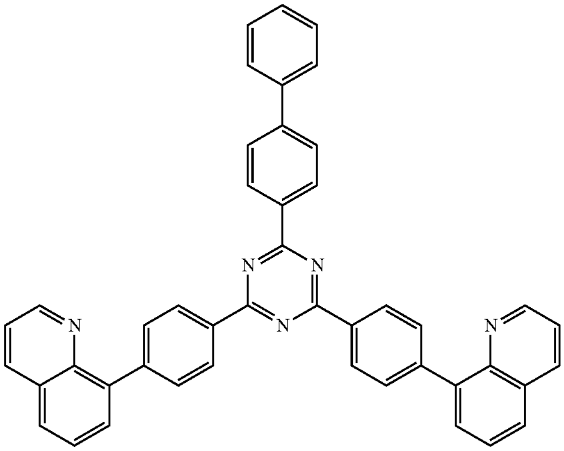
ET27
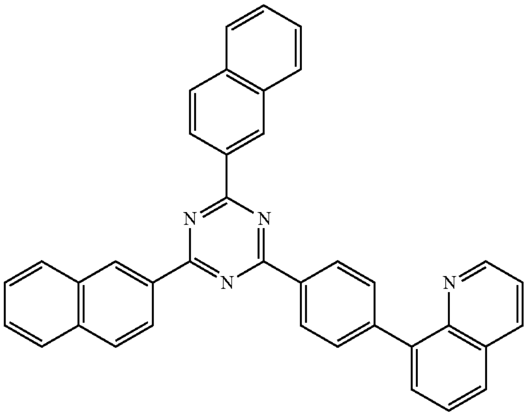
ET28
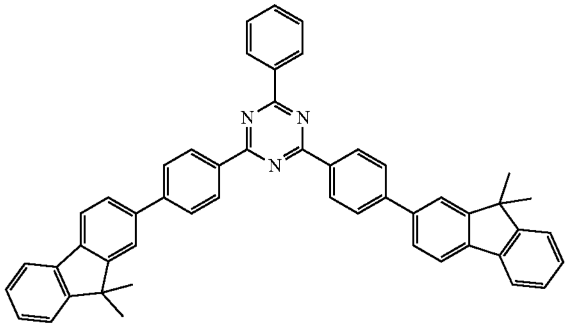

-continued
ET29
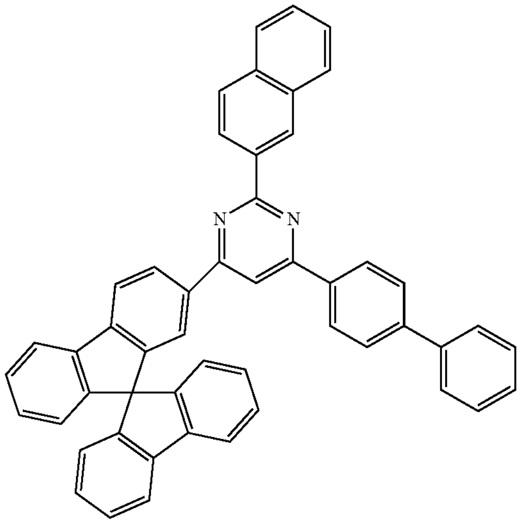
ET30
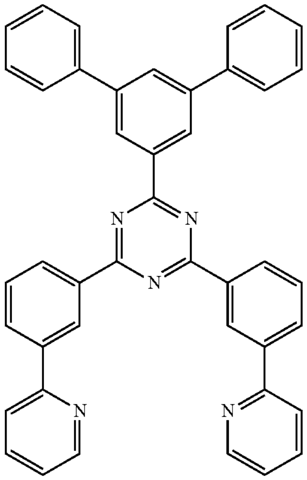
ET31
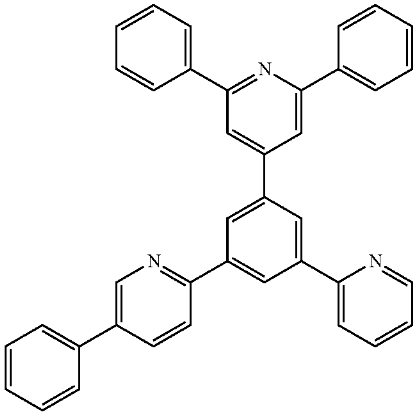
-continued
ET32
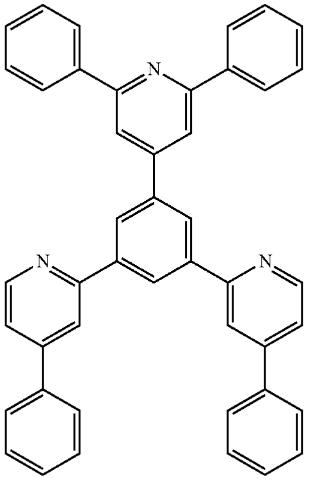
ET33
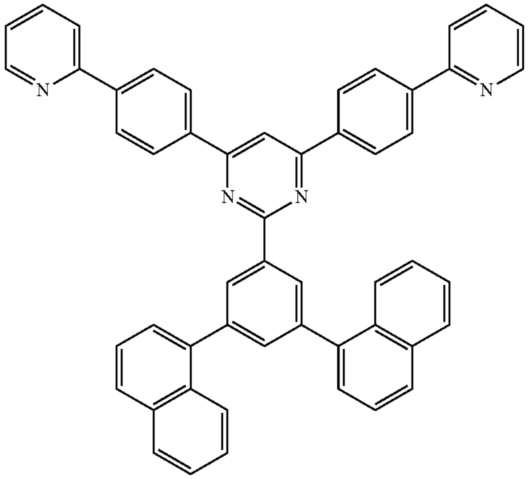
ET34
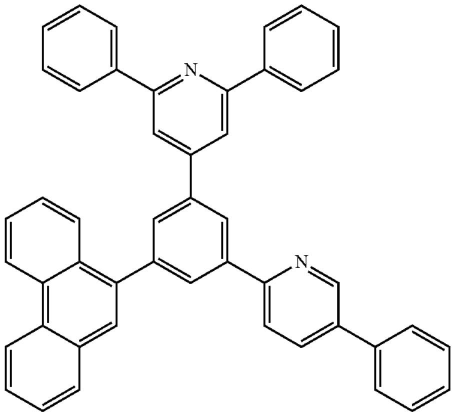

-continued
ET35
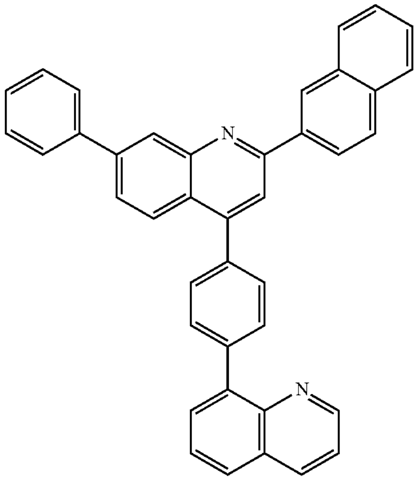
ET36
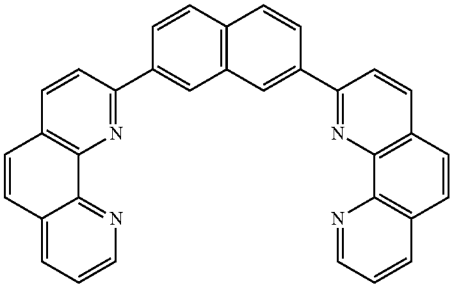
ET37
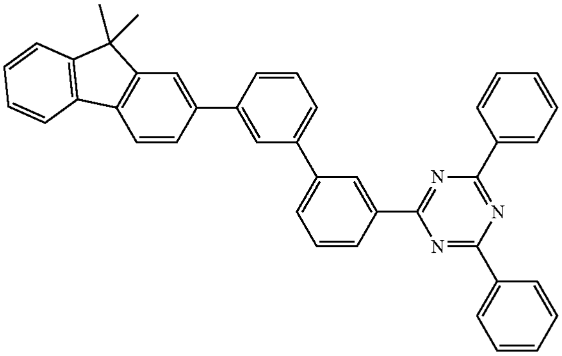
ET38
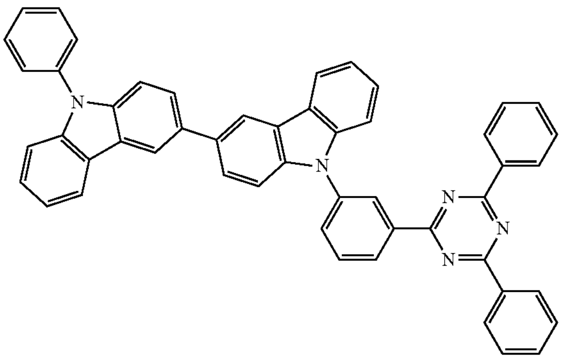
-continued
ET39
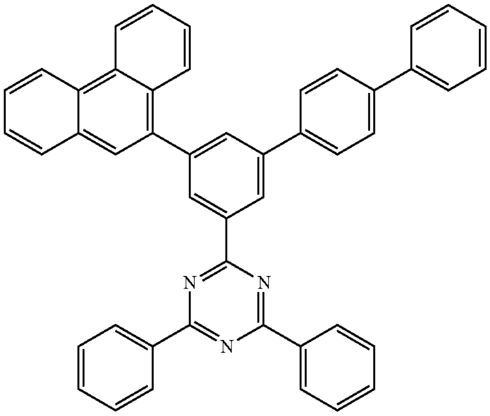
ET40
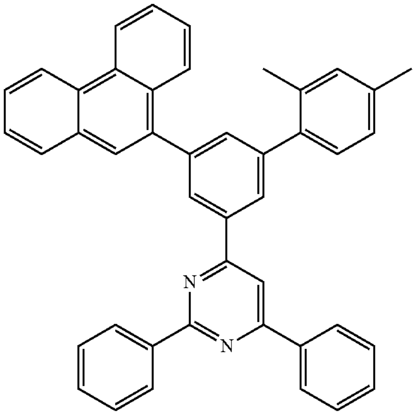
ET41
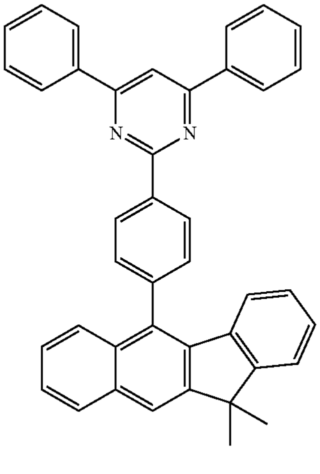

-continued
ET42
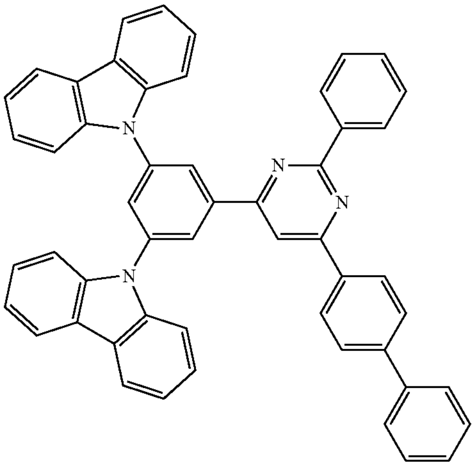
ET43
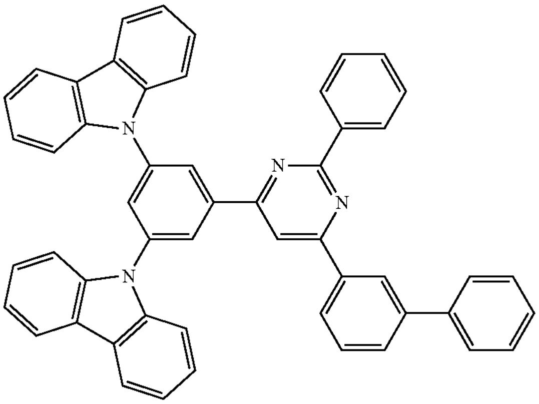
ET44
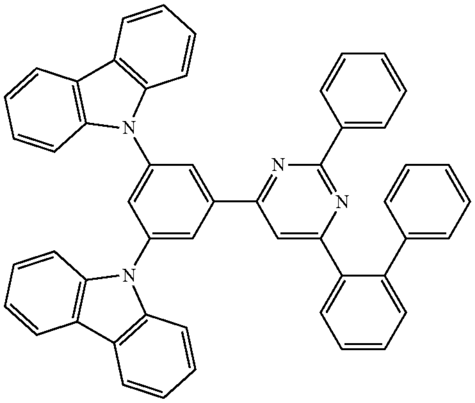
ET45
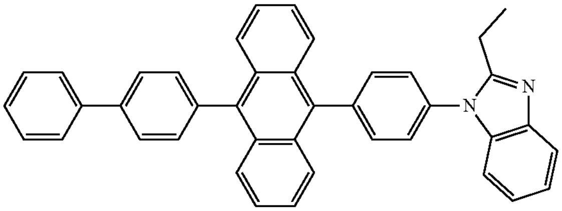
-continued
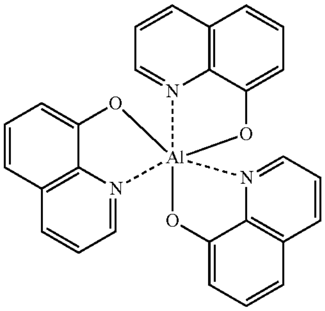
$Alq_3$
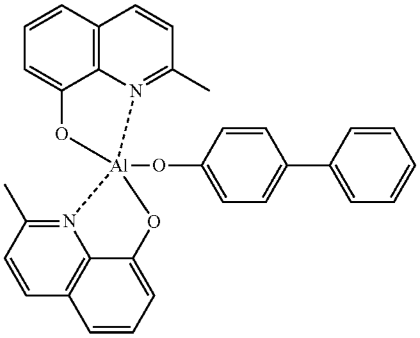
BAlq
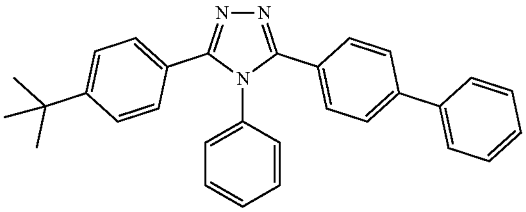
TAZ
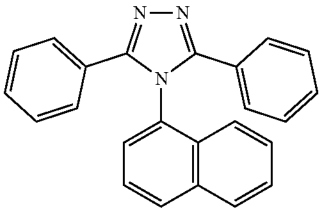
NTAZ -continued

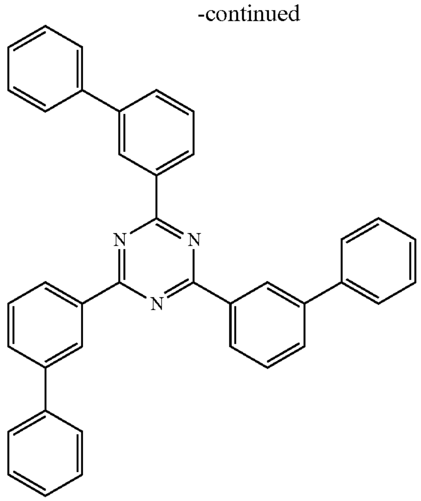

T2T

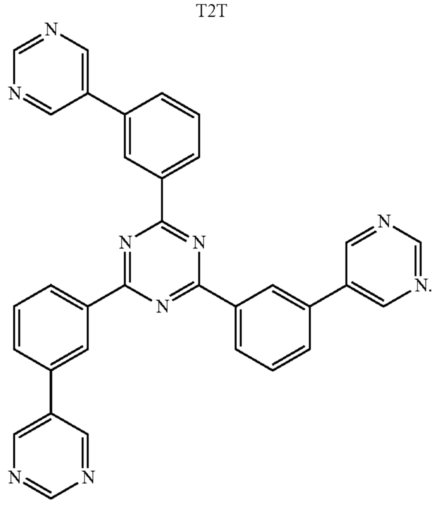

TPM-TAZ

A thickness of the electron transport region may be in a range of about 100 Å to about 5,000 Å. For example, a thickness of the electron transport region may be in a range of about 160 Å to about 4,000 Å. In case that the electron transport region includes a buffer layer, a hole blocking layer, an electron control layer, an electron transport layer, or any combination thereof, a thickness of the buffer layer, the hole blocking layer, or the electron control layer may each independently be in a range of about 20 Å to about 1,000 Å, and a thickness of the electron transport layer may be in a range of about 100 Å to about 1,000 Å. For example, the thickness of the buffer layer, the hole-blocking layer, or the electron control layer may each independently be in a range of about 30 Å to about 300 Å. For example, the thickness of the electron transport layer may be in a range of about 150 Å to about 500 Å. In case that the thicknesses of the buffer layer, the hole blocking layer, the electron control layer, the electron transport layer, and/or the electron transport layer are within the ranges described above, satisfactory electron transporting characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth metal complex, or any combination thereof. A metal ion of the alkali metal complex may be a Li ion, a Na ion, a K ion, a Rb ion, or a Cs ion, and a metal ion of the alkaline earth metal complex may be a Be ion, a Mg ion, a Ca ion, a Sr ion, or a Ba ion. A ligand coordinated with the metal ion of the alkali metal complex or the alkaline earth-metal complex may include hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenylbenzimidazole, hydroxyphenylbenzothiazole, bipyridine, phenanthroline, cyclopentadiene, or any combination thereof.

For example, the metal-containing material may include a Li complex. The Li complex may include, for example, Compound ET-D1 (LiQ) or Compound ET-D2:

ET-D1

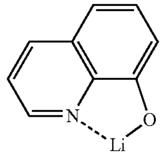

ET-D2

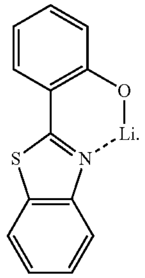

The electron transport region may include an electron injection layer that facilitates the injection of electrons from the second electrode 150. The electron injection layer may be in direct contact with the second electrode 150.

The electron injection layer may have a structure consisting of a layer consisting of a single material, a structure consisting of a layer consisting of different materials, or a structure including multiple layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, PD13, or any combination thereof.

The alkali metal-containing compound, the alkaline earth metal-containing compound, and the rare earth metal-containing compound may be oxides, halides (for example, fluorides, chlorides, bromides, iodides, etc.), or tellurides of the alkali metal, the alkaline earth metal, and the rare earth metal, or any combination thereof.

The alkali metal-containing compound may include: alkali metal oxide, such as $Li_2O$, $Cs_2O$, or $K_2O$; alkali metal halide, such as LiF, NaF, CsF, KF, LiI, NaI, CsI, or KI; or any combination thereof. The alkaline earth metal-containing compound may include an alkaline earth metal compound, such as BaO, SrO, CaO, $Ba_xSr_{1-x}O$ (wherein x is a real number satisfying the condition of 0<x<1), or $Ba_xCa_{1-x}O$ (wherein x is a real number satisfying the condition of 0<x<1). The rare earth metal-containing compound may include $YbF_3$, $ScF_3$, $Sc_2O_3$, $Y_2O_3$, $Ce_2O_3$, $PD13F_3$, $TbF_3$, $YbI_3$, $ScI_3$, $TbI_3$, or any combination thereof. In embodiments, the rare earth metal-containing compound may include lanthanide metal telluride. Examples of the lanthanide metal telluride may include LaTe, CeTe, PrTe, NdTe, PmTe, SmTe, EuTe, PD13Te, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $PD13_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth-metal complex, and the rare earth metal complex may include one of ions of the alkali metal, the alkaline earth metal, and the rare earth metal and, as a ligand bonded to the metal ion, for example, hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenyl benzimidazole, hydroxyphenylbenzothiazole, bipyridine, phenanthroline, cyclopentadiene, or any combination thereof.

The electron injection layer may consist of an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In embodiments, the electron injection layer may further include an organic material (for example, a compound represented by Formula 601).

In an embodiment, the electron injection layer may consist of an alkali metal-containing compound (for example, alkali metal halide), an alkali metal-containing compound (for example, alkali metal halide); and an alkali metal, an alkaline earth metal, a rare earth metal, or any combination thereof. For example, the electron injection layer may be a KI:Yb co-deposited layer, an RbI:Yb co-deposited layer, a LiF:Yb co-deposited layer, or the like.

In case that the electron injection layer further includes an organic material, an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof may be uniformly or non-uniformly dispersed in a matrix including the organic material.

A thickness of the electron injection layer may be in a range of about 1 Å to about 100 Å. For example, a thickness of the electron injection layer may be in a range of about 3 Å to about 90 Å. In case that the thickness of the electron injection layer is within the range described above, satisfactory electron injection characteristics may be obtained without a substantial increase in driving voltage.

[Second Electrode 150]

The second electrode 150 may be disposed on the interlayer 130 as described above. The second electrode 150 may be a cathode, which is an electron injection electrode, and as a material for forming the second electrode 150, a metal, an alloy, an electrically conductive compound, or any combination thereof, each having a low work function, may be used.

The second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 150 may be a transmissive electrode, a semi-transmissive electrode, or a reflective electrode.

The second electrode 150 may have a single-layered structure or a multi-layered structure.

[Capping Layer]

A first capping layer may be arranged outside the first electrode 110, and/or a second capping layer may be arranged outside the second electrode 150. For example, the light-emitting device 10 may have a structure in which the first electrode 110, a light-emitting unit 153-3, a charge generation layer 155-1, the light-emitting unit 153-4, the charge generation layer 155-2, the light-emitting unit 153-1, the charge generation layer 155-3, the light-emitting unit 153-3, the charge generation layer 155-4, the light-emitting unit 153-2, the second electrode 150, and the second capping layer (not shown) may be sequentially stacked.

Light generated in the interlayer 130 of the light-emitting device 10 may be extracted toward the outside through the first electrode 110, which may be a semi-transmissive electrode or a transmissive electrode, and through the first capping layer. In embodiments, light generated in the interlayer 130 of the light-emitting device 10 may be extracted toward the outside through the second electrode 150, which may be a semi-transmissive electrode or a transmissive electrode, and through the second capping layer.

The first capping layer and the second capping layer may increase external luminescence efficiency according to the principle of constructive interference. Accordingly, the light extraction efficiency of the light-emitting device 10 may be increased, so that the luminescence efficiency of the light-emitting device 10 may be improved.

Each of the first capping layer and the second capping layer may include a material having a refractive index equal to or greater than about 1.6 or more (with respect to a wavelength of about 589 nm).

The first capping layer and the second capping layer may each independently be an organic capping layer including an organic material, an inorganic capping layer including an inorganic material, or an organic-inorganic composite capping layer including an organic material and an inorganic material.

At least one of the first capping layer and the second capping layer may each independently include a carbocyclic compound, a heterocyclic compound, an amine group-containing compound, a porphine derivative, a phthalocyanine derivative, a naphthalocyanine derivative, an alkali metal complex, an alkaline earth metal complex, or any combination thereof. The carbocyclic compound, the heterocyclic compound, and the amine group-containing compound may optionally be substituted with a substituent including O, N, S, Se, Si, F, Cl, Br, I, or any combination thereof. In an embodiment, at least one of the first capping layer and the second capping layer may each independently include an amine group-containing compound.

For example, at least one of the first capping layer and the second capping layer may each independently include a compound represented by Formula 201, a compound represented by Formula 202, or any combination thereof.

In embodiments, at least one of the first capping layer and the second capping layer may each independently include one of Compounds HT28 to HT33, one of Compounds CP1 to CP7, β-NPB, or any combination thereof:

CP1

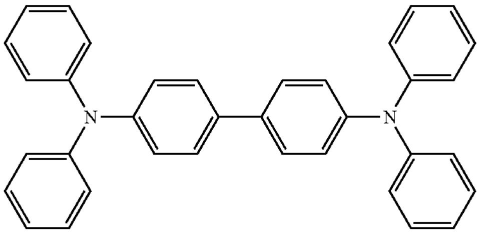

CP2

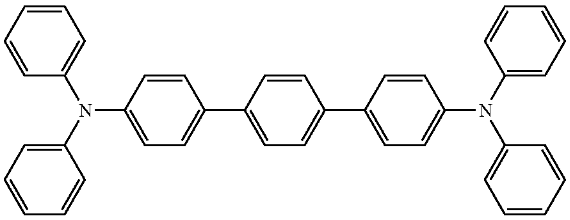

CP3

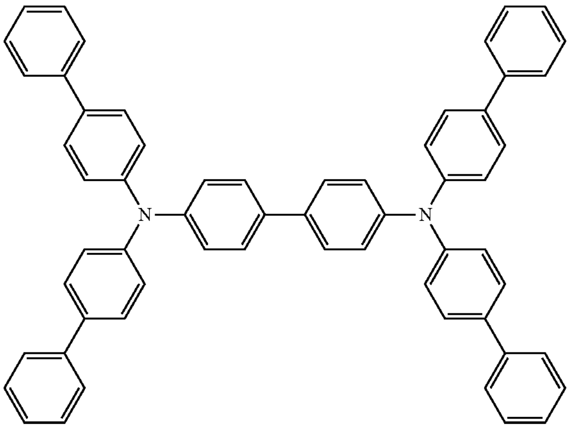

CP4

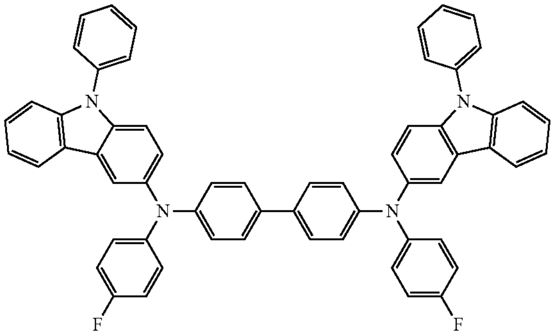

-continued

CP5

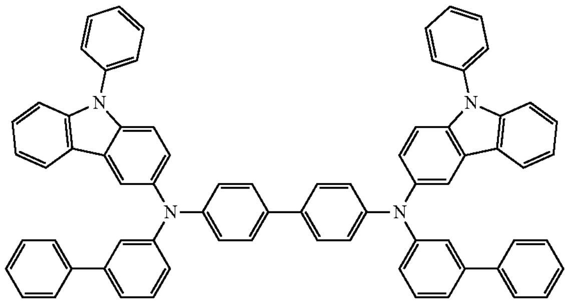

CP6

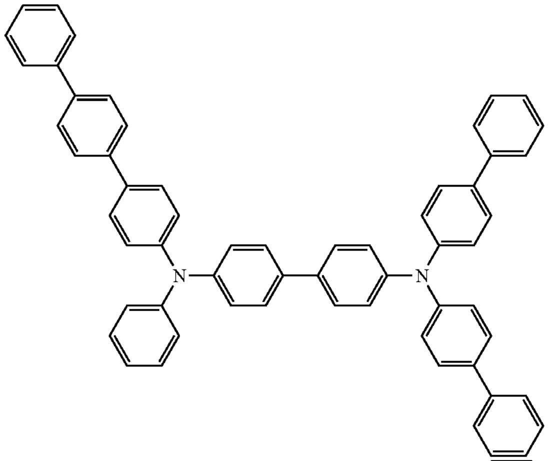

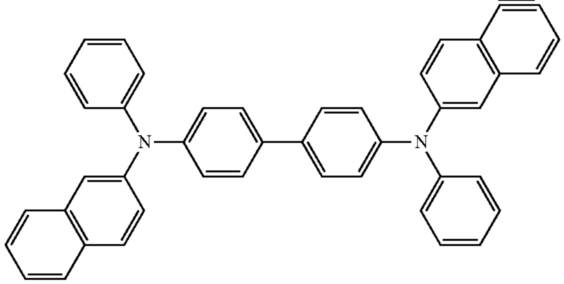

β-NPB

CPL 7

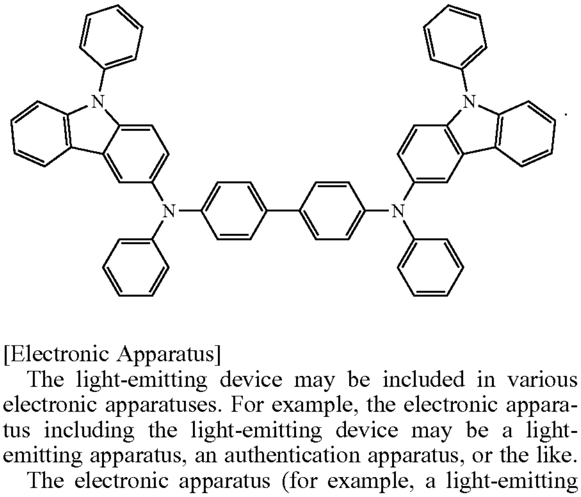

[Electronic Apparatus]

The light-emitting device may be included in various electronic apparatuses. For example, the electronic apparatus including the light-emitting device may be a light-emitting apparatus, an authentication apparatus, or the like.

The electronic apparatus (for example, a light-emitting apparatus) may further include, in addition to the light-emitting device, a color filter, a color conversion layer, or a color filter and a color conversion layer. The color filter and/or the color conversion layer may be arranged in at least one traveling direction of light emitted from the light-emitting device. For example, the light emitted from the light-emitting device may be blue light or white light. Details for the light-emitting device may be the same as described herein. In an embodiment, the color conversion layer may include a quantum dot. The quantum dot may be, for example, a quantum dot as described herein.

The electronic apparatus may include a first substrate. The first substrate may include subpixels, the color filter may include color filter areas respectively corresponding to the subpixels, and the color conversion layer may include color conversion areas respectively corresponding to the subpixels.

A pixel-defining film may be arranged between the subpixels to define each.

The color filter may further include color filter areas and light-shielding patterns arranged among the color filter areas, and the color conversion layer may include color conversion areas and light-shielding patterns arranged among the color conversion areas.

The color filter areas (or the color conversion areas) may include a first area emitting first color light, a second area emitting second color light, and/or a third area emitting third color light, and the first color light, the second color light, and/or the third color light may have different maximum emission wavelengths. For example, the first color light may be red light, the second color light may be green light, and the third color light may be blue light. In embodiments, the color filter areas (or the color conversion areas) may include quantum dots. In an embodiment, the first area may include a red quantum dot, the second area may include a green quantum dot, and the third area may not include a quantum dot. The quantum dot may be the same as described herein. The first area, the second area, and/or the third area may each further include a scatterer.

For example, the light-emitting device may emit first light, the first area may absorb the first light to emit a first-first color light, the second area may absorb the first light to emit a second-first color light, and the third area may absorb the first light to emit a third-first color light. In this regard, the first-first color light, the second-first color light, and the third-first color light may have different maximum emission wavelengths. In an embodiment, the first light may be blue light, the first-first color light may be red light, the second-first color light may be green light, and the third-first color light may be blue light.

The electronic apparatus may further include a thin-film transistor, in addition to the light-emitting device as described above. The thin-film transistor may include a source electrode, a drain electrode, and an activation layer, and one of the source electrode and the drain electrode may be electrically connected to one of the first electrode and the second electrode of the light-emitting device.

The thin-film transistor may further include a gate electrode, a gate insulating film, and the like.

The activation layer may include crystalline silicon, amorphous silicon, an organic semiconductor, an oxide semiconductor, and the like.

The electronic apparatus may further include a sealing portion for sealing the light-emitting device. The sealing portion may be arranged between the color filter and/or the color conversion layer and the light-emitting device. The sealing portion may allow light from the light-emitting device to be extracted to the outside, and may simultaneously prevent ambient air and moisture from penetrating into the light-emitting device. The sealing portion may be a sealing substrate including a transparent glass substrate or a plastic substrate. The sealing portion may be a thin-film encapsulation layer including at least one layer of an organic layer and/or an inorganic layer. In case that the sealing portion is a thin-film encapsulating layer, the electronic apparatus may be flexible.

Various functional layers may be additionally disposed on the sealing portion, in addition to the color filter and/or the color conversion layer, according to the use of the electronic apparatus. Examples of the functional layers may include a touch screen layer, a polarizing layer, and the like. The touch screen layer may be a pressure-sensitive touch screen layer, a capacitive touch screen layer, or an infrared touch screen layer. The authentication apparatus may be, for example, a biometric authentication apparatus that authenticates an individual by using biometric information of a living body (for example, fingertips, pupils, etc.).

The authentication apparatus may further include, in addition to the light-emitting device as described above, a biometric information collector.

The electronic apparatus may be applied to various displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, or endoscope displays), fish finders, various measuring instruments, meters (for example, meters for a vehicle, an aircraft, and a vessel), projectors, and the like.

Figure 5:
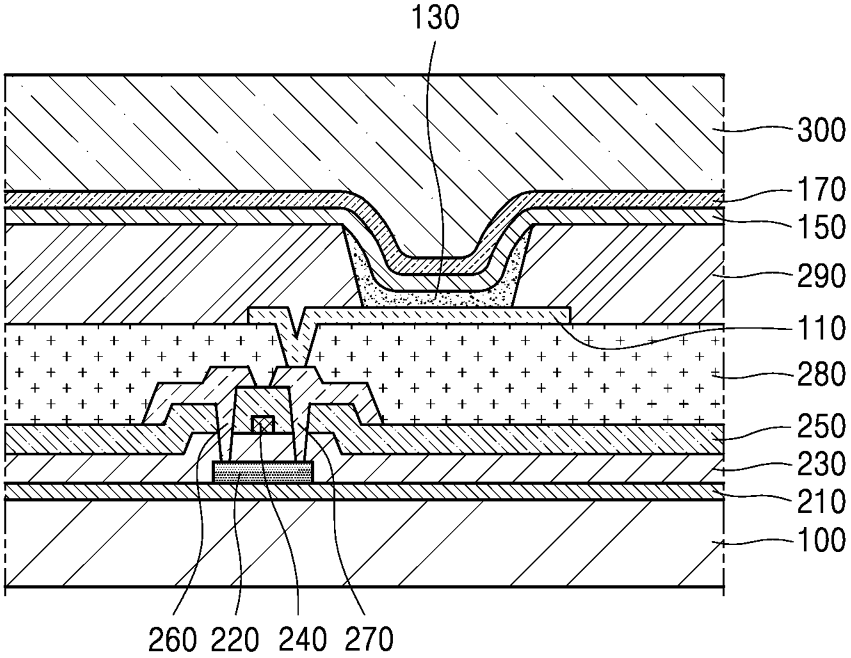
FIG. 5 is a schematic cross-sectional view of an electronic apparatus according to an embodiment.
Figure 6:
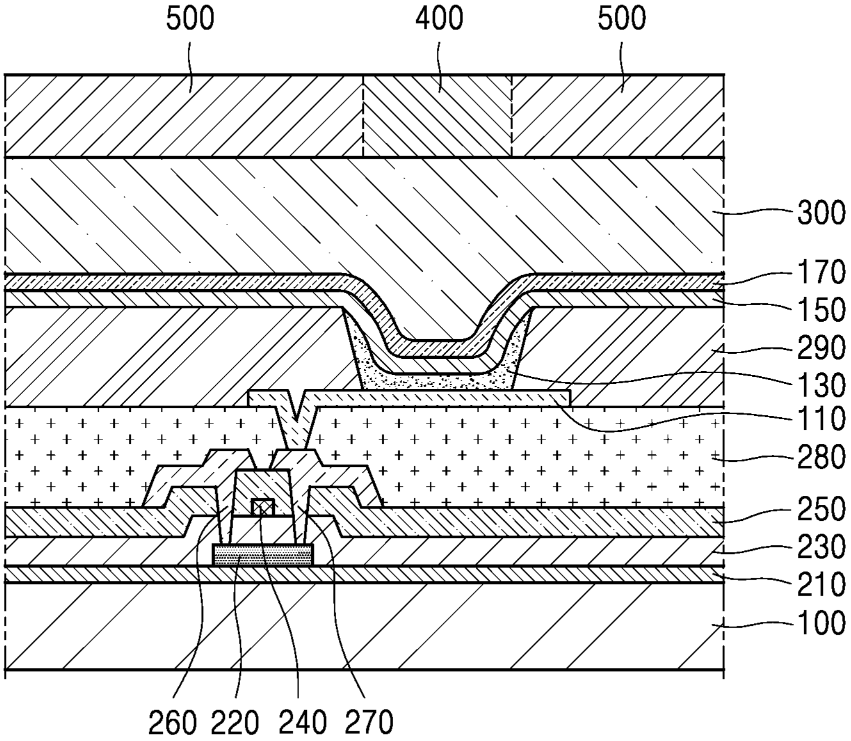
FIG. 6 is a schematic cross-sectional view of an electronic apparatus according to another embodiment.

[Description of FIGS. 5 and 6]

FIG. 5 shows a schematic cross-sectional view of an electronic apparatus according to an embodiment of the disclosure.

The apparatus of FIG. 5 includes a substrate 100, a thin-film transistor (TFT), a light-emitting device, and an encapsulation portion 300 that seals the light-emitting device.

The substrate 100 may be a flexible substrate, a glass substrate, or a metal substrate. A buffer layer 210 may be disposed on the substrate 100. The buffer layer 210 may prevent penetration of impurities through the substrate 100 and may provide a flat surface on the substrate 100.

The TFT may be disposed on the buffer layer 210. The TFT may include an activation layer 220, a gate electrode 240, a source electrode 260, and a drain electrode 270.

The activation layer 220 may include an inorganic semiconductor, such as silicon or polysilicon, an organic semiconductor, or an oxide semiconductor, and may include a source region, a drain region, and a channel region.

A gate insulating film 230 for insulating the activation layer 220 from the gate electrode 240 may be disposed on the activation layer 220, and the gate electrode 240 may be disposed on the gate insulating film 230.

An interlayer insulating film 250 may be disposed on the gate electrode 240. The interlayer insulating film 250 may be arranged between the gate electrode 240 and the source electrode 260 and between the gate electrode 240 and the drain electrode 270 to provide insulation therebetween.

The source electrode 260 and the drain electrode 270 may be disposed on the interlayer insulating film 250. The interlayer insulating film 250 and the gate insulating film 230 may expose the source region and the drain region of the activation layer 220, and the source electrode 260 and the drain electrode 270 may respectively contact the exposed portions of the source region and the drain region of the activation layer 220.

The TFT may be electrically connected to a light-emitting device to drive the light-emitting device, and may be covered and protected by a passivation layer 280. The passivation layer 280 may include an inorganic insulating film, an organic insulating film, or a combination thereof. A light-emitting device may be provided on the passivation layer 280. The light-emitting device may include a first electrode 110, an interlayer 130, and a second electrode 150.

The first electrode 110 may be disposed on the passivation layer 280. The passivation layer 280 may be arranged to expose a portion of the drain electrode 270 without fully covering the drain electrode 270, and the first electrode 110 may be connected to the exposed portion of the drain electrode 270.

A pixel-defining layer 290 including an insulating material may be disposed on the first electrode 110. The pixel-defining layer 290 may expose a certain region of the first electrode 110, and the interlayer 130 may be formed in the exposed region of the first electrode 110. The pixel-defining layer 290 may be a polyimide or polyacrylic organic film. Although not shown in FIG. 5, at least some layers of the interlayer 130 may extend beyond the upper portion of the pixel-defining layer 290 to be arranged in the form of a common layer.

The second electrode 150 may be disposed on the interlayer 130, and a capping layer 170 may be additionally formed on the second electrode 150. The capping layer 170 may be formed to cover the second electrode 150.

The encapsulation portion 300 may be disposed on the capping layer 170. The encapsulation portion 300 may be disposed on a light-emitting device to protect the light-emitting device from moisture or oxygen. The encapsulation portion 300 may include: an inorganic film including silicon nitride (SiNx), silicon oxide (SiOx), indium tin oxide, indium zinc oxide, or any combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate, polyacrylic acid, etc.), an epoxy-based resin (for example, aliphatic glycidyl ether (AGE), etc.), or any combination thereof; or a combination of the inorganic film and the organic film.

FIG. 6 shows a schematic cross-sectional view of an electronic apparatus according to another embodiment of the disclosure.

The electronic apparatus of FIG. 6 may differ from the electronic apparatus of FIG. 5, at least in that a light-shielding pattern 500 and a functional region 400 are further disposed on the encapsulation portion 300. The functional region 400 may be a color filter area, a color conversion area, or a combination of the color filter area and the color conversion area. In an embodiment, the light-emitting device included in the electronic apparatus of FIG. 6 may be a tandem light-emitting device.

[Manufacturing Method]

Respective layers included in the hole transport region, the emission layer, and respective layers included in the electron transport region may be formed in a certain region by using various methods such as vacuum deposition, spin coating, casting, Langmuir-Blodgett (LB) deposition, ink-jet printing, laser-printing, laser-induced thermal imaging, and the like.

In case that respective layers included in the hole transport region, the emission layer, and respective layers included in the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec, depending on a material to be included in a layer to be formed and the structure of a layer to be formed.

Definitions of Terms

The term "$C_3$-$C_{60}$ carbocyclic group" as used herein may be a cyclic group consisting of carbon only as a ring-forming atom and having 3 to 60 carbon atoms, and the term "$C_1$-$C_{60}$ heterocyclic group" as used herein may be a cyclic group that has 1 to 60 carbon atoms and further has, in addition to carbon, a heteroatom as a ring-forming atom. The $C_3$-$C_{60}$ carbocyclic group and the $C_1$-$C_{60}$ heterocyclic group may each be a monocyclic group consisting of one ring or a polycyclic group in which two or more rings are condensed with each other. For example, the $C_1$-$C_{60}$ heterocyclic group may have 3 to 61 ring-forming atoms.

The term "cyclic group" as used herein may include both the $C_3$-$C_{60}$ carbocyclic group and the $C_1$-$C_{60}$ heterocyclic group.

The term "π electron-rich $C_3$-$C_{60}$ cyclic group" as used herein may be a cyclic group that has 3 to 60 carbon atoms and may not include *—N═*' as a ring-forming moiety. The term "π electron-deficient nitrogen-containing $C_1$-$C_{60}$ cyclic group" as used herein may be a heterocyclic group that has 1 to 60 carbon atoms and may include *—N═*' as a ring-forming moiety.

In embodiments, the $C_3$-$C_{60}$ carbocyclic group may be a T1 group or a condensed cyclic group in which at least two T1 groups are condensed with each other (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be a T2 group, a condensed cyclic group in which at least two T2 groups are condensed with each other, or a condensed cyclic group in which at least one T2 group and at least one T1 group are condensed with each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), the π electron-rich $C_3$-$C_{60}$ cyclic group may be a T1 group, a condensed cyclic group in which at least two T1 groups are condensed with each other, a T3 group, a condensed cyclic group in which at least two T3 groups are condensed with each other, or a condensed cyclic group in which at least one T3 group and at least one T1 group are condensed with each other (for example, the $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, etc.), the π electron-deficient nitrogen-containing $C_1$-$C_{60}$ cyclic group may be a T4 group, a condensed cyclic group in which at least two T4 groups are condensed with each other, a condensed cyclic group in which at least one T4 group and at least one T1 group are condensed with each other, a condensed cyclic group in which at least one T4 group and at least one T3 group are condensed with each other, or a condensed cyclic group in which at least one T4 group, at least one T1 group, and at least one T3 group are condensed with one another (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), the T1 group may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or bicyclo[2.2.1]heptane) group, a norbornene group, a bicyclo[1.1.1]pentane group, a bicyclo[2.1.1]hexane group, a bicyclo[2.2.2]octane group, or a benzene group, the T2 group may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, the T3 group may be a furan group, a thiophene group, a 1H-pyrrole group, a silole group, or a borole group, and the T4 group may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "cyclic group", "$C_3$-$C_{60}$ carbocyclic group", "$C_1$-$C_{60}$ heterocyclic group", "π electron-rich $C_3$-$C_{60}$ cyclic group", or "π electron-deficient nitrogen-containing $C_1$-$C_{60}$ cyclic group" as used herein may be a group condensed to any cyclic group, a monovalent group, or a polyvalent group (for example, a divalent group, a trivalent group, a tetravalent group, etc.) according to the structure of a formula for which the corresponding term may be used. For example, the "benzene group" may be a benzo group, a phenyl group, a phenylene group, or the like, which may be more readily understood by one of ordinary skill in the art according to the structure of a formula including the "benzene group."

Examples of the monovalent $C_3$-$C_{60}$ carbocyclic group and the monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, and examples of the divalent $C_3$-$C_{60}$ carbocyclic group and the divalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_{60}$ alkyl group" as used herein may be a linear or branched aliphatic hydrocarbon monovalent group that has 1 to 60 carbon atoms, and examples thereof may include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein may be a divalent group having the same structure as the $C_1$-$C_{60}$ alkyl group.

The term "$C_2$-$C_{60}$ alkenyl group" as used herein may be a monovalent hydrocarbon group having at least one carbon-carbon double bond in the middle or at the terminus of the $C_2$-$C_{60}$ alkyl group, and examples thereof may include an ethenyl group, a propenyl group, and a butenyl group. The term "$C_2$-$C_{60}$ alkenylene group" as used herein may be a divalent group having the same structure as the $C_2$-$C_{60}$ alkenyl group.

The term "$C_2$-$C_{60}$ alkynyl group" as used herein may be a monovalent hydrocarbon group having at least one carbon-carbon triple bond in the middle or at the terminus of the $C_2$-$C_{60}$ alkyl group, and examples thereof may include an ethynyl group and a propynyl group. The term "$C_2$-$C_{60}$ alkynylene group" as used herein may be a divalent group having the same structure as the $C_2$-$C_{60}$ alkynyl group.

The term "$C_1$-$C_{60}$ alkoxy group" as used herein may be a monovalent group represented by $—O(A_{101})$ (wherein $A_{101}$ may be a $C_1$-$C_{60}$ alkyl group), and examples thereof may include a methoxy group, an ethoxy group, and an isopropyloxy group.

The term "$C_3$-$C_{10}$ cycloalkyl group" as used herein may be a monovalent saturated hydrocarbon cyclic group having 3 to 10 carbon atoms, and examples thereof may include a cyclopropyl group, a cyclobutyl group, a cyclopentyl group, a cyclohexyl group, a cycloheptyl group, a cyclooctyl group, an adamantanyl group, a norbornanyl group (or bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group" as used herein may be a divalent group having the same structure as the $C_3$-$C_{10}$ cycloalkyl group.

The term "$C_1$-$C_{10}$ heterocycloalkyl group" as used herein may be a monovalent cyclic group that further includes, in addition to a carbon atom, at least one heteroatom as a ring-forming atom and has 1 to 10 carbon atoms, and examples thereof may include a 1,2,3,4-oxatriazolidinyl group, a tetrahydrofuranyl group, and a tetrahydrothiophenyl group. The term "$C_1$-$C_{10}$ heterocycloalkylene group" as used herein may be a divalent group having the same structure as the $C_1$-$C_{10}$ heterocycloalkyl group.

The term "$C_3$-$C_{10}$ cycloalkenyl group" as used herein may be a monovalent cyclic group that has 3 to 10 carbon atoms and at least one carbon-carbon double bond in the ring thereof and no aromaticity, and examples thereof may include a cyclopentenyl group, a cyclohexenyl group, and a cycloheptenyl group. The term "$C_3$-$C_{10}$ cycloalkenylene group" as used herein may be a divalent group having the same structure as the $C_3$-$C_{10}$ cycloalkenyl group.

The term "$C_1$-$C_{10}$ heterocycloalkenyl group" as used herein may be a monovalent cyclic group that has, in addition to a carbon atom, at least one heteroatom as a ring-forming atom, 1 to 10 carbon atoms, and at least one double bond in the cyclic structure thereof. Examples of the $C_1$-$C_{10}$ heterocycloalkenyl group may include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein may be a divalent group having the same structure as the $C_1$-$C_{10}$ heterocycloalkenyl group.

The term "$C_6$-$C_{60}$ aryl group" as used herein may be a monovalent group having a carbocyclic aromatic system of 6 to 60 carbon atoms, and the term "$C_6$-$C_{60}$ arylene group" as used herein may be a divalent group having a carbocyclic aromatic system of 6 to 60 carbon atoms. Examples of the $C_6$-$C_{60}$ aryl group may include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. In case that the $C_6$-$C_{60}$ aryl group and the $C_6$-$C_{60}$ arylene group each include two or more rings, the rings may be condensed with each other.

The term "$C_1$-$C_{60}$ heteroaryl group" as used herein may be a monovalent group having a heterocyclic aromatic system of 1 to 60 carbon atoms, and may further include, in addition to carbon atoms, at least one heteroatom, as ring-forming atoms. The term "$C_1$-$C_{60}$ heteroarylene group" as used herein may be a divalent group having a heterocyclic aromatic system of 1 to 60 carbon atoms, and may further include, in addition to carbon atoms, at least one heteroatom, as ring-forming atoms. Examples of the $C_1$-$C_{60}$ heteroaryl group may include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. In case that the $C_1$-$C_{60}$ heteroaryl group and the $C_1$-$C_{60}$ heteroarylene group each include two or more rings, the rings may be condensed with each other.

The term "monovalent non-aromatic condensed polycyclic group" as used herein may be a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group may include an indenyl group, a fluorenyl group, a spiro-bifluorenyl group, a benzofluorenyl group, an indenophenanthrenyl group, and an indenoanthracenyl group. The term "divalent non-aromatic condensed polycyclic group" as used herein may be a divalent group having the same structure as the monovalent non-aromatic condensed polycyclic group described above.

The term "monovalent non-aromatic condensed heteropolycyclic group" as used herein may be a monovalent group (for example, having 1 to 60 carbon atoms) having two or more rings condensed to each other, and may further include, in addition to carbon atoms, at least one heteroatom, as ring-forming atoms, and having non-aromaticity in its entire molecular structure. Examples of the monovalent non-aromatic condensed heteropolycyclic group may include a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indeno carbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphtho silolyl group, a benzofurodibenzofuranyl group, a benzofurodibenzothiophenyl group, and a benzothienodibenzothiophenyl group. The term "divalent non-aromatic condensed heteropolycyclic group" as used herein may be a divalent group having the same structure as the monovalent non-aromatic condensed heteropolycyclic group.

The term "$C_6$-$C_{60}$ aryloxy group" as used herein may be a group represented by —O($A_{102}$) (wherein $A_{102}$ may be a $C_6$-$C_{60}$ aryl group), and the term "$C_6$-$C_{60}$ arylthio group" as used herein may be a group represented by —S($A_{103}$) (wherein $A_{103}$ may be a $C_6$-$C_{60}$ aryl group).

The term "$C_7$-$C_{60}$ arylalkyl group" as used herein may be a group represented by -($A_{104}$)($A_{105}$) (wherein $A_{104}$ may be a $C_1$-$C_{54}$ alkylene group, and $A_{105}$ may be a $C_6$-$C_{59}$ aryl group), and the term "$C_2$-$C_{60}$ heteroarylalkyl group" as used herein may be a group represented by -($A_{106}$)($A_{107}$) (wherein $A_{106}$ may be a $C_1$-$C_{59}$ alkylene group, and $A_{107}$ may be a $C_1$-$C_{59}$ heteroaryl group).

The group "$R_{10a}$" as used herein may be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$).

$Q_1$ to $Q_3$, $Q_{11}$ to $Q_{13}$, $Q_{21}$ to $Q_{23}$ and $Q_{31}$ to $Q_{33}$ as used herein may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof; a $C_7$-$C_{60}$ arylalkyl group; or a $C_2$-$C_{60}$ heteroarylalkyl group.

The term "heteroatom" as used herein may be any atom other than a carbon atom or a hydrogen atom. Examples of the heteroatom may include O, S, N, P, Si, B, Ge, Se, or any combination thereof.

The term "third-row transition metal" as used herein may include hafnium (Hf), tantalum (Ta), tungsten (W), rhenium (Re), osmium (Os), iridium (Ir), platinum (Pt), and gold (Au).

The term "Ph" as used herein refers to a phenyl group, the term "Me" as used herein refers to a methyl group, the term "Et" as used herein refers to an ethyl group, the terms "ter-Bu" or "But" as used herein each refers to a tert-butyl group, and the term "OMe" as used herein refers to a methoxy group.

The term "biphenyl group" as used herein may be "a phenyl group substituted with a phenyl group." For example, the "biphenyl group" may be a substituted phenyl group having a $C_6$-$C_{60}$ aryl group as a substituent.

The term "terphenyl group" as used herein may be "a phenyl group substituted with a biphenyl group". For example, the "terphenyl group" may be a substituted phenyl group having, as a substituent, a $C_6$-$C_{60}$ aryl group substituted with a $C_6$-$C_{60}$ aryl group.

The symbols * and *' as used herein, unless defined otherwise, each refer to a binding site to a neighboring atom in a corresponding formula or moiety.

Hereinafter, compounds according to embodiments and light-emitting devices according to embodiments will be described in detail with reference to Comparative Examples and Examples. The wording "B was used instead of A" used in describing Comparative Examples means that an identical molar equivalent of B was used in place of A.

EXAMPLES

Example 1 (BBGBG)

Formation of Anode

As a substrate and an anode, a glass substrate with 15 Ω/cm$^2$ (50 Å) ITO thereon, which was manufactured by Corning Inc., was cut to a size of 50 mm×50 mm×0.5 mm, sonicated with acetone, isopropyl alcohol, and pure water for 15 minutes each, and cleaned by exposure to ultraviolet rays and ozone for 30 minutes. The glass substrate was loaded onto a vacuum deposition apparatus, Ag was patterned thereon to a thickness of 1,000 Å, and ITO was patterned thereon to a thickness of 70 Å, thereby forming an anode.

Formation of Light-Emitting Unit 1

HATCN was deposited on the ITO/Ag/ITO anode to form a hole injection layer having a thickness of 50 Å, NPB was deposited on the hole injection layer to form a hole transport layer having a thickness of 250 Å, and TCTA was deposited on the hole transport layer to form an electron blocking layer having a thickness of 75 Å, thereby forming a hole transport region.

H8 and DF10 (1 wt %) were co-deposited on the hole transport region to form a first-first emission layer having a thickness of 85 Å, and H125 and DF10 (1 wt %) were co-deposited on the first-first emission layer to form a first-second emission layer having a thickness of 85 Å.

T2T was deposited on the first-second emission layer to form a hole blocking layer having a thickness of 50 Å, and TPM-TAZ and Liq were co-deposited at a weight ratio of 50:50 on the hole blocking layer to form an electron transport layer having a thickness of 100 Å, thereby forming a light-emitting unit 1.

Formation of First Charge Generation Layer

BCP and Li (10 wt %) were co-deposited on the light-emitting unit 1 to form an n-type charge generation layer having a thickness of 65 Å, and HAT-CN was deposited on the n-type charge generation layer to form a p-type charge generation layer having a thickness of 50 Å, thereby forming a first charge generation layer.

Formation of Light-Emitting Unit 2

HATCN was deposited on the first charge generation layer to form a hole injection layer having a thickness of 50 Å, NPB was deposited on the hole injection layer to form a hole transport layer having a thickness of 250 Å, and TCTA was deposited on the hole transport layer to form an electron blocking layer having a thickness of 75 Å, thereby forming a hole transport region.

H8 and DF10 (1 wt %) were co-deposited on the hole transport region to form a second-first emission layer having a thickness of 85 Å, and H125 and DF10 (1 wt %) were co-deposited on the second-first emission layer to form a second-second emission layer having a thickness of 85 Å.

T2T was deposited on the second-second emission layer to form a hole blocking layer having a thickness of 50 Å, and TPM-TAZ and Liq were co-deposited at a weight ratio of 50:50 on the hole blocking layer to form an electron transport layer having a thickness of 100 Å, thereby forming a light-emitting unit 2.

Formation of Second Charge Generation Layer

BCP and Li (1 wt %) were co-deposited on the light-emitting unit 2 to form an n-type charge generation layer having a thickness of 65 Å, and HAT-CN was deposited on the n-type charge generation layer to form a p-type charge generation layer having a thickness of 50 Å, thereby forming a second charge generation layer.

Formation of Light-Emitting Unit 3

HATCN was deposited on the second charge generation layer to form a hole injection layer having a thickness of 50 Å, NPB was deposited on the hole injection layer to form a hole transport layer having a thickness of 250 Å, and TCTA was deposited on the hole transport layer to form an electron blocking layer having a thickness of 75 Å, thereby forming a hole transport region.

H39 and H126 (weight ratio of 1:1) as hosts and PD13 (9 wt %) as a dopant were co-deposited on the hole transport region to form a third emission layer having a thickness of 200 Å.

TPM-TAZ and Liq were co-deposited at a weight ratio of 50:50 on the third emission layer to form an electron transport layer having a thickness of 100 Å, thereby forming a light-emitting unit 3.

Formation of Third Charge Generation Layer

BCP and Li (10 wt %) were co-deposited on the light-emitting unit 3 to form an n-type charge generation layer having a thickness of 65 Å, and HAT-CN was deposited on the n-type charge generation layer to form a p-type charge generation layer having a thickness of 50 Å, thereby forming a third charge generation layer.

Formation of Light-Emitting Unit 4

HATCN was deposited on the third charge generation layer to form a hole injection layer having a thickness of 50 Å, NPB was deposited on the hole injection layer to form a hole transport layer having a thickness of 250 Å, and TCTA was deposited on the hole transport layer to form an electron blocking layer having a thickness of 75 Å, thereby forming a hole transport region.

H8 and DF10 (1 wt %) were co-deposited on the hole transport region to form a fourth-first emission layer having a thickness of 85 Å, and H125 and DF10 (1 wt %) were co-deposited on the fourth-first emission layer to form a fourth-second emission layer having a thickness of 85 Å.

T2T was deposited on the fourth-second emission layer to form a hole blocking layer having a thickness of 50 Å, and TPM-TAZ and Liq were co-deposited at a weight ratio of 50:50 on the hole blocking layer to form an electron transport layer having a thickness of 100 Å, thereby forming a light-emitting unit 4.

Formation of Fourth Charge Generation Layer

BCP and Li (10 wt %) were co-deposited on the light-emitting unit 4 to form an n-type charge generation layer having a thickness of 65 Å, and HAT-CN was deposited on the n-type charge generation layer to form a p-type charge generation layer having a thickness of 50 Å, thereby forming a fourth charge generation layer.

Formation of Light-Emitting Unit 5

HATCN was deposited on the fourth charge generation layer to form a hole injection layer having a thickness of 50 Å, NPB was deposited on the hole injection layer to form a hole transport layer having a thickness of 250 Å, and TCTA was deposited on the hole transport layer to form an electron blocking layer having a thickness of 75 Å, thereby forming a hole transport region.

H39 and H126 (weight ratio of 1:1) as hosts and PD13 (9 wt %) as a dopant were co-deposited on the hole transport region to form a fifth emission layer having a thickness of 200 Å.

TPM-TAZ and Liq were co-deposited at a weight ratio of 50:50 on the fifth emission layer to form an electron transport layer having a thickness of 100 Å, thereby forming a light-emitting unit 5.

Formation of Second Electrode

Yb was deposited on the light-emitting unit 5 to form an electron injection layer having a thickness of 10 Å, Ag and Mg (10 wt %) were co-deposited on the electron injection layer to form a second electrode (cathode) having a thickness of 100 Å, and CPL 7 was deposited on the second electrode to form a capping layer having a thickness of 500 Å, thereby completing the manufacture of a light-emitting device.

Example 2 (GBGBB) and Example 3 (GBBGB)
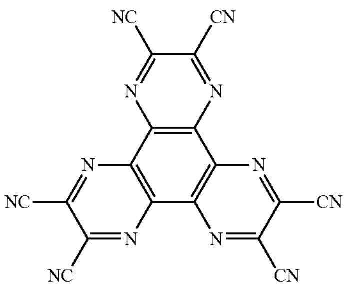
HATCN
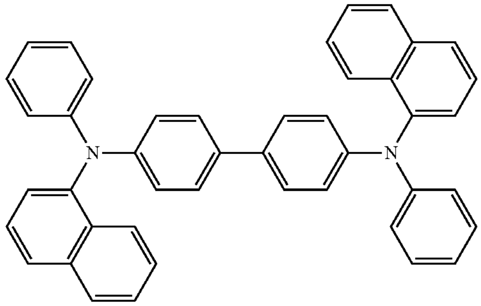
NPB
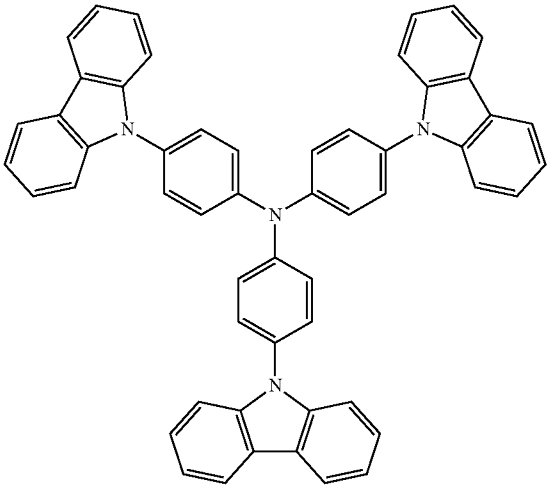
TCTA
H8
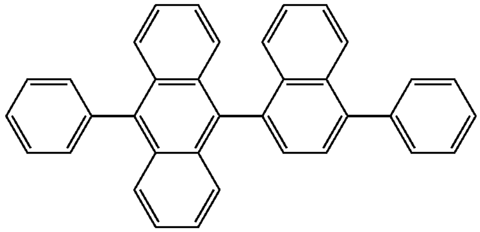
-continued
H125
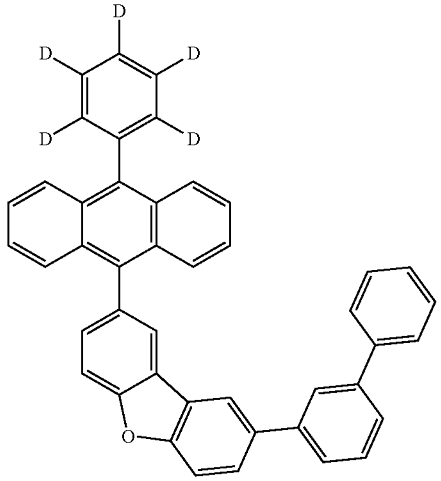
DF10
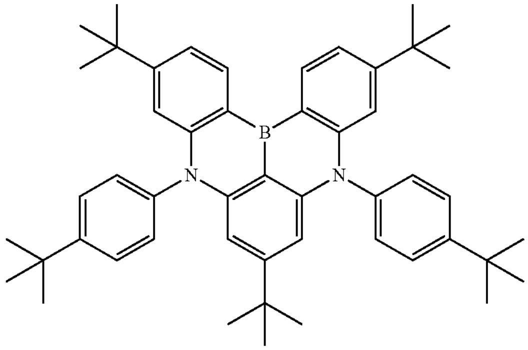
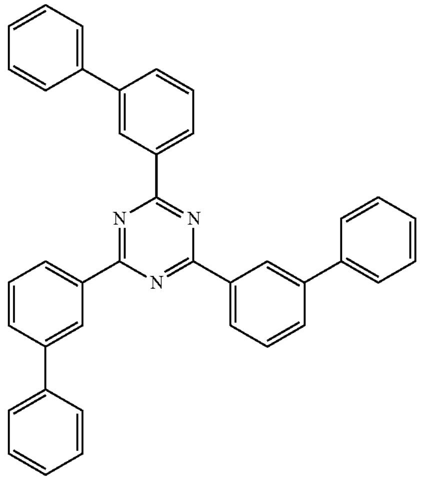
T2T -continued

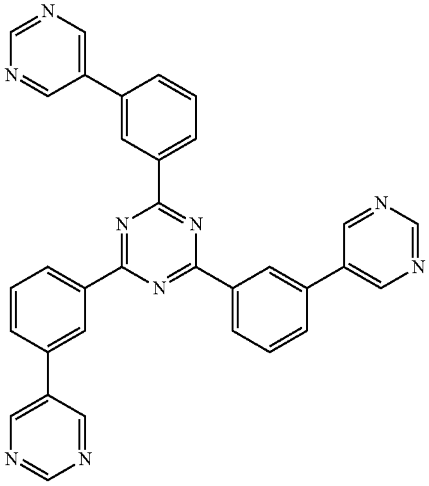

TPM-TAZ

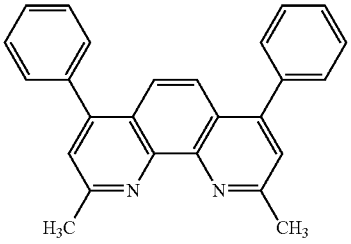

BCP

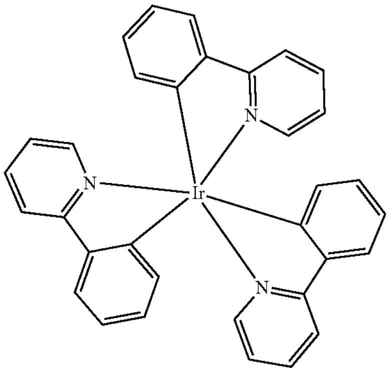

PD13(Ir(ppy)$_3$)

H39

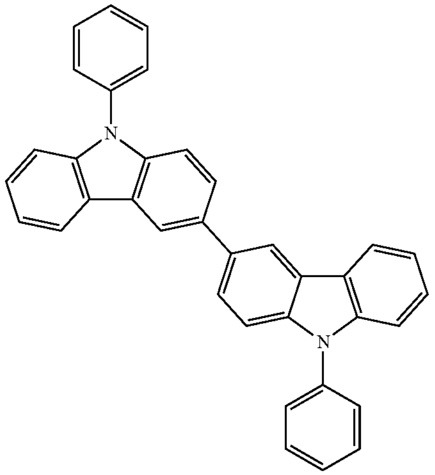

-continued

H126

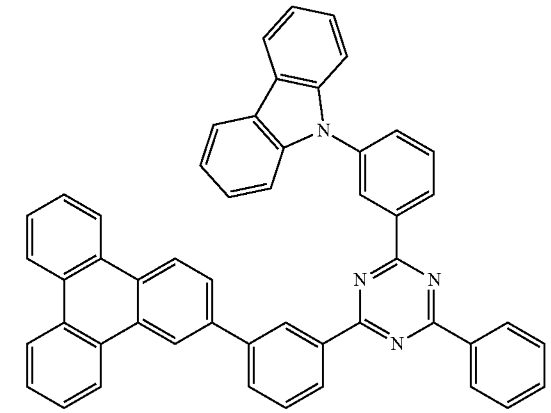

CPL7

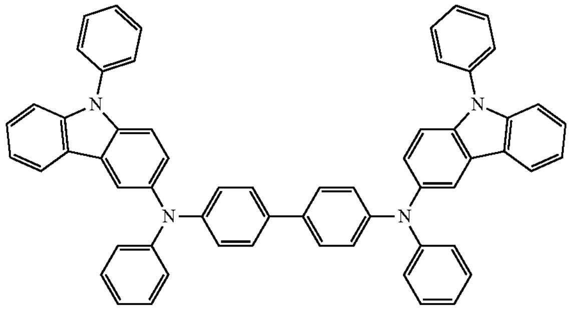

Comparative Example 1 (BBBG)

Formation of Anode

As a substrate and an anode, a glass substrate with 15 Ω/cm$^2$ (50 Å) ITO thereon, which was manufactured by Corning Inc., was cut to a size of 50 mm×50 mm×0.5 mm, sonicated with acetone, isopropyl alcohol, and pure water for 15 minutes each, and cleaned by exposure to ultraviolet rays and ozone for 30 minutes. The glass substrate was loaded onto a vacuum deposition apparatus, Ag was patterned thereon to a thickness of 1,000 Å, and ITO was patterned thereon to a thickness of 70 Å, thereby forming an ITO/Ag/ITO anode.

Formation of Light-Emitting Unit 1

HATCN was deposited on the ITO/Ag/ITO anode to form a hole injection layer having a thickness of 50 Å, NPB was deposited on the hole injection layer to form a hole transport layer having a thickness of 250 Å, and TCTA was deposited on the hole transport layer to form an electron blocking layer having a thickness of 75 Å, thereby forming hole transport region.

H8 and DF10 (1 wt %) were co-deposited on the hole transport region to form a first-first emission layer having a thickness of 85 Å, and H125 and DF10 (1 wt %) were co-deposited on the first-first emission layer to form a first-second emission layer having a thickness of 85 Å.

T2T was deposited on the first-second emission layer to form a hole blocking layer having a thickness of 50 Å, and TPM-TAZ and Liq were co-deposited at a weight ratio of 50:50 on the hole blocking layer to form an electron transport layer having a thickness of 100 Å, thereby forming a light-emitting unit 1.

Formation of First Charge Generation Layer

BCP and Li (10 wt %) were co-deposited on the light-emitting unit 1 to form an n-type charge generation layer having a thickness of 65 Å, and HAT-CN was deposited on the n-type charge generation layer to form a p-type charge generation layer having a thickness of 50 Å, thereby forming a first charge generation layer.

Formation of Light-Emitting Unit 2

HATCN was deposited on the first charge generation layer to form a hole injection layer having a thickness of 50 Å, NPB was deposited on the hole injection layer to form a hole transport layer having a thickness of 250 Å, and TCTA was deposited on the hole transport layer to form an electron blocking layer having a thickness of 75 Å, thereby forming a hole transport region.

H8 and DF10 (1 wt %) were co-deposited on the hole transport region to form a second-first emission layer having a thickness of 85 Å, and H125 and DF10 (1 wt %) were co-deposited on the second-first emission layer to form a second-second emission layer having a thickness of 85 Å.

T2T was deposited on the second-second emission layer to form a hole blocking layer having a thickness of 50 Å, and TPM-TAZ and Liq were co-deposited at a weight ratio of 50:50 on the hole blocking layer to form an electron transport layer having a thickness of 100 Å, thereby forming a light-emitting unit 2.

Formation of Second Charge Generation Layer

BCP and Li (10 wt %) were co-deposited on the light-emitting unit 2 to form an n-type charge generation layer having a thickness of 65 Å, and HAT-CN was deposited on the n-type charge generation layer to form a p-type charge generation layer having a thickness of 50 Å, thereby forming a second charge generation layer.

Formation of Light-Emitting Unit 3

HATCN was deposited on the second charge generation layer to form a hole injection layer having a thickness of 50 Å, NPB was deposited on the hole injection layer to form a hole transport layer having a thickness of 250 Å, and TCTA was deposited on the hole transport layer to form an electron blocking layer having a thickness of 75 Å, thereby forming a hole transport region.

H8 and DF10 (1 wt %) were co-deposited on the hole transport region to form a third-first emission layer having a thickness of 85 Å, and H125 and DF10 (1 wt %) were co-deposited on the third-first emission layer to form a third-second emission layer having a thickness of 85 Å.

T2T was deposited on the third-second emission layer to form a hole blocking layer having a thickness of 50 Å, and TPM-TAZ and Liq were co-deposited at a weight ratio of 50:50 on the hole blocking layer to form an electron transport layer having a thickness of 100 Å thereby forming a light-emitting unit 3.

Formation of Third Charge Generation Layer

BCP and Li (1 wt %) were co-deposited on the light-emitting unit 3 to form an n-type charge generation layer having a thickness of 65 Å, and HAT-CN was deposited on the n-type charge generation layer to form a p-type charge generation layer having a thickness of 50 Å, thereby forming a third charge generation layer.

Formation of Light-Emitting Unit 4

HATCN was deposited on the third charge generation layer to form a hole injection layer having a thickness of 50 Å, NPB was deposited on the hole injection layer to form a hole transport layer having a thickness of 250 Å, and TCTA was deposited on the hole transport layer to form an electron blocking layer having a thickness of 75 Å, thereby forming a hole transport region.

H39 and H126 (weight ratio of 1:1) as hosts and PD13 (9 wt %) as a dopant were co-deposited on the hole transport region to form a fourth emission layer having a thickness of 250 Å.

TPM-TAZ and Liq were co-deposited at a weight ratio of 50:50 on the fourth emission layer to form an electron transport layer having a thickness of 570 Å, thereby forming a light-emitting unit 4.

Formation of Second Electrode

Yb was deposited on the light-emitting unit 4 to form an electron injection layer having a thickness of 10 Å, Ag and Mg (10 wt %) were co-deposited on the electron injection layer to form a second electrode (cathode) having a thickness of 100 Å, and CPL 7 was deposited on the second electrode to form a capping layer having a thickness of 500 Å, thereby completing the manufacture of a light-emitting device.

TABLE 1

| | Device structure |
|---|---|
| Example 1 (BBGBG) | Glass/ITO(50 Å)/Ag(1000 Å)/ITO (70 Å)/HATCN (50 Å)/NPB (250 Å)/TCTA (75 Å)/B-EML (H8:DF10 (1%), 85 Å/H125:DF10 (1%), 85 Å)/T2T (50 Å)/TPM-TAZ + Liq (100 Å, 5:5)/BCP:Li (65 Å, 10%)/HATCN (50 Å)/NPB (570 Å)/TCTA (75 Å)/B-EML (H8:DF10 (1%), 85 Å/H125:DF10 (1%), 85 Å)/T2T (50 Å)/TPM-TAZ + Liq (100 Å, 5:5)/BCP:Li (65 Å, 10%)/HATCN (50 Å)/NPB (85 Å)/G-EML (H39:H126:PD13 (9%), 1:1_200 Å)/TPM-TAZ + Liq (100 Å, 5:5)/BCP:Li (65 Å, 10%)/HATCN (50 Å)/NPB (20 Å)/TCTA (75 Å)/B-EML (H8:DF10 (1%), 85 Å/H125:DF10 (1%), 85 Å)/T2T (50 Å)/TPM-TAZ + Liq (100 Å, 5:5)/BCP:Li (65 Å, 10%)/HATCN (50 Å)/NPB (300 Å)/G-EML (H39:H126:PD13 (9%), 1:1_250 Å)/TPM-TAZ + Liq (570 Å, 5:5)/Yb (10 Å)/AgMg (100 Å, 10%)/CPL 7 500 Å |
| Example 2 (GBGBB) | Glass/ITO(50 Å)/Ag(1000 Å)/ITO (70 Å)/HATCN (50 Å)/NPB (445 Å)/G-EML (H39:H126:PD13 (9%), 1:1_250 Å)/T2T (50 Å)/TPM-TAZ + Liq (100 Å, 5:5)/BCP:Li (65 Å, 10%)/HATCN (50 Å)/NPB (370 Å)/TCTA (75 Å)/B-EML (H8:DF10 (1%), 85 Å/H125:DF10 (1%), 85 Å)/T2T (50 Å)/TPM-TAZ + Liq (100 Å, 5:5)/BCP:Li (65 Å, 10%)/HATCN (50 Å)/NPB (85 Å)/G-EML (H39:H126:PD13 (9%), 1:1_200 Å)/TPM-TAZ + Liq (100 Å, 5:5)/BCP:Li (65 Å, 10%)/HATCN (50 Å)/NPB (20 Å)/TCTA (75 Å)/B-EML (H8:DF10 (1%), 85 Å/H125:DF10 (1%), 85 Å)/T2T (50 Å)/TPM-TAZ + Liq (100 Å, 5:5)/BCP:Li (65 Å, 10%)/HATCN (50 Å)/NPB (435 Å)/TCTA (75 Å)/B-EML (H8:DF10 (1%), 85 Å/H125:DF10 (1%), 85 Å)/T2T (50 Å)/TPM-TAZ + Liq (380 Å, 5:5)/Yb (10 Å)/AgMg (100 Å, 10%)/CPL 7 500 Å |

TABLE 1-continued

| | Device structure |
|---|---|
| Example 3 (GBBGB) | Glass/ITO(50 Å)/Ag(1000 Å)/ITO (70 Å)/HATCN (50 Å)/NPB (445 Å)/G-EML (H39:H126:PD13 (9%), 1:1_250 Å)/T2T (50 Å)/TPM-TAZ + Liq (100 Å, 5:5)/BCP:Li (65 Å, 10%)/HATCN (50 Å)/NPB (370 Å)/TCTA (75 Å)/B-EML (H8:DF10 (1%), 85 Å/H125:DF10 (1%), 85 Å)/T2T (50 Å)/TPM-TAZ + Liq (100 Å, 5:5)/BCP:Li (65 Å, 10%)/HATCN (50 Å)/NPB (515 Å)/TCTA (75 Å)/B-EML (H8:DF10 (1%), 85 Å/H125:DF10 (1%), 85 Å)/T2T (50 Å)/TPM-TAZ + Liq (100 Å, 5:5)/BCP:Li (65 Å, 10%)/HATCN (50 Å)/NPB (90 Å)/G-EML (H39:H126:PD13 (9%), 1:1_125 Å)/TPM-TAZ + Liq (100 Å, 5:5)/BCP:Li (65 Å, 10%)/HATCN (50 Å)/NPB (20 Å)/TCTA (75 Å)/B-EML (H8:DF10 (1%), 85 Å/H125:DF10 (1%), 85 Å)/T2T (50 Å)/TPM-TAZ + Liq (380 Å, 5:5)/Yb (10 Å)/AgMg (100 Å, 10%)/CPL 7 500 Å |
| Comparative Example 1 (BBBG) | Glass/ITO(50 Å)/Ag(1000 Å)/ITO (70 Å)/HATCN (50 Å)/NPB (250 Å)/TCTA (75 Å)/B-EML (H8:DF10 (1%), 85 Å/H125:DF10 (1%), 85 Å)/T2T (50 Å)/TPM-TAZ + Liq (100 Å, 5:5)/BCP:Li (65 Å, 10%)/HATCN (50 Å)/NPB (570 Å)/TCTA (75 Å)/B-EML (H8:DF10 (1%), 85 Å/H125:DF10 (1%), 85 Å)/T2T (50 Å)/TPM-TAZ + Liq (100 Å, 5:5)/BCP:Li (65 Å, 10%)/HATCN (50 Å)/NPB (515 Å)/TCTA (75 Å)/B-EML (H8:DF10 (1%), 85 Å/H125:DF10 (1%), 85 Å)/T2T (50 Å)/TPM-TAZ + Liq (100 Å, 5:5)/BCP:Li (65 Å, 10%)/HATCN (50 Å)/NPB (305 Å)/G-EML (H39:H126:PD13 (9%), 1:1_250 Å)/TPM-TAZ + Liq (570 Å, 5:5)/Yb (10 Å)/AgMg (100 Å, 10%)/CPL 7 500 Å |

Evaluation Example 1

The efficiency (Cd/A), power efficiency (Cd/W), and lifespan ($T_{95}$) of the light-emitting devices manufactured according to Examples 1 to 3 and Comparative Example 1 were measured using Keithley MU 236 and luminance meter PR650, and the results are shown in Table 2. (measurements for Examples 1 to 3 were performed at a current density of 0.2 mA/cm$^2$, and measurements for Comparative Example 1 were performed at a current density of 0.25 mA/cm$^2$).

The term "OL" below refers to the thickness of a device, and is a value of the thickness from the interface between the anode (ITO/Ag/ITO) and the hole injection layer (HATCH) to the interface between the electron injection layer (Yb) and the electron transport layer (TPM-TAZ+Liq, 570 Å, 5:5).

Lifespan (T95) refers to the time taken for the luminance to become 95% of the initial luminance of 100%.

The efficiency, power efficiency, and lifespan values below are converted values based on 100% of the measured values of Comparative Example 1.

TABLE 2

| Examples | Device structure | Efficiency (Cd/A) | Power efficiency (Cd/W) | OL (Å) | Lifespan | Luminance |
|---|---|---|---|---|---|---|
| Example 1 | BBGBG | 125% | 112% | 4040 | 122% | 1500 nit |
| Example 2 | GBGBB | 122% | 115% | 4040 | 125% | 1500 nit |
| Example 3 | GBBGB | 120% | 113% | 4040 | 123% | 1500 nit |
| Comparative Example 1 | BBBG | 100% | 100% | 4040 | 100% | 1500 nit |

Referring to Table 2, it was confirmed that the light-emitting devices of Examples 1 to 3 had significantly superior efficiency, power efficiency, and lifespan compared to the light-emitting device of Comparative Example 1.

The light-emitting device according to an embodiment of the disclosure may include two light-emitting units that emit green light and three light-emitting units that emit blue light, thereby realizing a light-emitting device having high efficiency and a long lifespan.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the claims.

What is claimed is:

1. A light-emitting device comprising:

a first electrode;

a second electrode facing the first electrode;

m light-emitting units stacked between the first electrode and the second electrode; and m−1 charge generation layers between adjacent ones of the m light-emitting units, wherein m is an integer of 5 or more, each light-emitting unit comprises an emission layer, the m light-emitting units comprise a first light-emitting unit, a second light-emitting unit, a third light-emitting unit, a fourth light-emitting unit, and a fifth light-emitting unit, the m−1 charge generation layers comprise a first charge generation layer, a second charge generation layer, a third charge generation layer, and a fourth charge generation layer, the first light-emitting unit and the second light-emitting unit each emit green light, the third light-emitting unit, the fourth light-emitting unit, and the fifth light-emitting unit each emit blue light, and wherein the first light-emitting unit and the second light-emitting unit are not adjacent to each other.

2. The light-emitting device of claim 1, wherein m is 5.

3. The light-emitting device of claim 1, wherein the emission layers of the first light-emitting unit and the second light-emitting unit each emit light having a maximum emission wavelength in a range of about 500 nm to about 600 nm.

4. The light-emitting device of claim 1, wherein the emission layers of the third light-emitting unit, the fourth light-emitting unit, and the fifth light-emitting unit each emit light having a maximum emission wavelength in a range of about 400 nm to about 500 nm.

5. The light-emitting device of claim 1, wherein the first light-emitting unit is a light-emitting unit that is most toward the first electrode; or the second light-emitting unit is a light-emitting unit that is most toward the second electrode.

6. The light-emitting device of claim 1, wherein the first light-emitting unit or the second light-emitting unit is between the third light-emitting unit and the fifth light-emitting unit.

7. The light-emitting device of claim 2, wherein the first charge generation layer is between the third light-emitting unit and the fourth light-emitting unit, the second charge generation layer is between the fourth light-emitting unit and the first light-emitting unit, the third charge generation layer is between the first light-emitting unit and the fifth light-emitting unit, and the fourth charge generation layer is between the fifth light-emitting unit and the second light-emitting unit.

8. The light-emitting device of claim 2, wherein the first charge generation layer is between the first light-emitting unit and the third light-emitting unit, the second charge generation layer is between the third light-emitting unit and the fourth light-emitting unit, the third charge generation layer is between the fourth light-emitting unit and the second light-emitting unit, and the fourth charge generation layer is between the second light-emitting unit and the fifth light-emitting unit.

9. The light-emitting device of claim 2, wherein the first charge generation layer is between the first light-emitting unit and the third light-emitting unit, the second charge generation layer is between the third light-emitting unit and the second light-emitting unit, the third charge generation layer is between the second light-emitting unit and the fourth light-emitting unit, and the fourth charge generation layer is between the fourth light-emitting unit and the fifth light-emitting unit.

10. The light-emitting device of claim 1, wherein Formula 1 is satisfied:

$$3800\ \text{Å} \leq D_1 \leq 4500\ \text{Å} \quad (1)$$

wherein in Formula 1, $D_1$ represents a distance between an interface between the first electrode and a light-emitting unit that is most toward the first electrode, and an interface between the second electrode and a light-emitting unit that is most toward the second electrode.

11. The light-emitting device of claim 1, wherein Formula 2-1 is satisfied:

$$3 \leq D_1/(2*\lambda_1) \leq 4 \quad (2\text{-}1)$$

wherein in Formula 2-1, $D_1$ represents a distance between an interface between the first electrode and a light-emitting unit that is most toward the first electrode, and an interface between the second electrode and a light-emitting unit that is most toward the second electrode, and $\lambda_1$ represents a maximum emission wavelength of the first light-emitting unit.

12. The light-emitting device of claim 1, wherein Formula 2-2 is satisfied:

$$4 \leq D_1/(2*\lambda_3) \leq 5 \quad (2\text{-}2)$$

wherein in Formula 2-2, $D_1$ represents a distance between an interface between the first electrode and a light-emitting unit that is most toward the first electrode, and an interface between the second electrode and a light-emitting unit that is most toward the second electrode, and $\lambda_3$ represents a maximum emission wavelength of the third light-emitting unit.

13. The light-emitting device of claim 1, wherein at least one of the m−1 charge generation layers comprises an n-type charge generation layer and a p-type charge generation layer.

14. The light-emitting device of claim 1, wherein at least one emission layer comprises a first host and a second host, and the first host and the second host are different from each other.

15. The light-emitting device of claim 1, wherein at least one emission layer comprises a first emission layer and a second emission layer.

16. The light-emitting device of claim 1, further comprising a capping layer arranged outside the second electrode.

17. An electronic apparatus comprising the light-emitting device of claim 1.

18. The electronic apparatus of claim 17, further comprising a thin-film transistor, wherein the thin-film transistor comprises a source electrode and a drain electrode, and the first electrode of the light-emitting device is electrically connected to at least one of the source electrode and the drain electrode.

19. The electronic apparatus of claim 17, further comprising a color filter, a color conversion layer, a quantum dot color conversion layer, a touch screen layer, a polarizing layer, or a combination thereof.

* * * * *